US012776268B2

(12) United States Patent
Kim et al.

(10) Patent No.: US 12,776,268 B2
(45) Date of Patent: Oct. 27, 2026

(54) DISPLAY DEVICE

(71) Applicant: Samsung Display Co., Ltd., Yongin-si (KR)

(72) Inventors: Sunho Kim, Yongin-si (KR); Minwoo Byun, Yongin-si (KR); Chaehan Hyun, Yongin-si (KR); Ji-Hyun Ka, Yongin-si (KR); Wonkyu Kwak, Yongin-si (KR); Yoomin Ko, Yongin-si (KR); Hyewon Kim, Yongin-si (KR); Juchan Park, Yongin-si (KR); Pilsuk Lee, Yongin-si (KR); Chung Sock Choi, Yongin-si (KR); Sungjin Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/967,406

(22) Filed: Dec. 3, 2024

(65) Prior Publication Data

US 2025/0191536 A1 Jun. 12, 2025

(30) Foreign Application Priority Data

Dec. 12, 2023 (KR) ........................ 10-2023-0179771

(51) Int. Cl.
*G09G 3/3233* (2016.01)
*H10K 59/131* (2023.01)
(Continued)

(52) U.S. Cl.
CPC ......... *G09G 3/3233* (2013.01); *H10K 59/131* (2023.02); *G09G 2300/0426* (2013.01);
(Continued)

(58) Field of Classification Search
CPC .. G09G 3/3208; G09G 3/3225; G09G 3/3233; G09G 2300/0426;
(Continued)

(56) References Cited

U.S. PATENT DOCUMENTS

| | | | |
|---|---|---|---|
| 8,455,896 | B2 | 6/2013 | Kang et al. |
| 11,011,105 | B2 | 5/2021 | Wang et al. |

(Continued)

FOREIGN PATENT DOCUMENTS

| | | | |
|---|---|---|---|
| CN | 111402788 | A | 7/2020 |
| CN | 111754924 | A | 10/2020 |

(Continued)

*Primary Examiner* — Julie Anne Watko
(74) *Attorney, Agent, or Firm* — Womble Bond Dickinson (US) LLP

(57) ABSTRACT

A display device includes: a display panel comprising a pixel, wherein the pixel includes: a light emitting element comprising an anode connected with a first power line and a cathode; a first transistor connected between the cathode and a second power line and configured to operate based on a potential of a first node; a second transistor connected between the first node and a data line and configured to receive a first scan signal; a third transistor connected between the first node and a reference voltage line and configured to receive a second scan signal; and a fourth transistor connected between the first transistor and the first power line.

39 Claims, 34 Drawing Sheets

(51) Int. Cl.

| | |
|---|---|
| ***H10K 59/82*** | (2023.01) |
| ***H10K 102/00*** | (2023.01) |
| *H10K 59/80* | (2023.01) |

(52) U.S. Cl.

CPC ............... *G09G 2300/0819* (2013.01); *G09G 2300/0852* (2013.01); *G09G 2300/0861* (2013.01); *G09G 2310/08* (2013.01); *G09G 2320/0242* (2013.01); *G09G 2320/0247* (2013.01); *G09G 2320/0257* (2013.01); *G09G 2330/021* (2013.01); *H10K 59/80518* (2023.02); *H10K 59/80524* (2023.02); *H10K 2102/321* (2023.02)

(58) Field of Classification Search

CPC ... G09G 2300/0819; G09G 2300/0852; G09G 2300/0861; G09G 2310/0251; G09G 2310/0262; G09G 2310/06; G09G 2310/061; G09G 2310/08; G09G 2320/02; G09G 2320/0242; G09G 2320/0247; G09G 2320/0257; G09G 2330/021; H10K 50/11; H10K 59/1213; H10K 59/122; H10K 59/131; H10K 59/805; H10K 59/80518; H10K 59/80524; H10K 2102/321

See application file for complete search history.

(56) References Cited

U.S. PATENT DOCUMENTS

| | | | | |
|---|---|---|---|---|
| 11,324,292 | B2 | 5/2022 | Min et al. | |
| 11,915,643 | B2 | 2/2024 | Lu et al. | |
| 11,922,866 | B1 * | 3/2024 | Sohn | G09G 3/32 |
| 2019/0363156 | A1 | 11/2019 | Ohara et al. | |
| 2020/0035759 | A1 | 1/2020 | Park et al. | |
| 2021/0074212 | A1 * | 3/2021 | Kim | G09G 3/3233 |
| 2022/0319430 | A1 | 10/2022 | Wang et al. | |
| 2022/0320236 | A1 | 10/2022 | Dai et al. | |
| 2022/0352291 | A1 * | 11/2022 | Park | H10K 59/131 |
| 2023/0094280 | A1 | 3/2023 | Lee et al. | |
| 2023/0141774 | A1 * | 5/2023 | Park | H10K 59/131 257/40 |
| 2023/0162679 | A1 | 5/2023 | Yu et al. | |
| 2023/0230535 | A1 | 7/2023 | Hu et al. | |
| 2023/0230543 | A1 * | 7/2023 | Kim | G09G 3/3233 345/691 |
| 2023/0252935 | A1 * | 8/2023 | Park | G09G 3/3233 345/55 |
| 2023/0360590 | A1 | 11/2023 | Jeong et al. | |
| 2024/0096284 | A1 * | 3/2024 | Kim | H10K 59/131 |
| 2024/0112633 | A1 * | 4/2024 | Hong | G09G 3/2007 |
| 2024/0161685 | A1 * | 5/2024 | Park | H10K 59/131 |
| 2024/0290265 | A1 * | 8/2024 | Chung | G09G 3/3233 |
| 2025/0268034 | A1 * | 8/2025 | Park | H10K 59/1216 |

FOREIGN PATENT DOCUMENTS

| | | | |
|---|---|---|---|
| CN | 111833819 | A | 10/2020 |
| CN | 112802429 | A | 5/2021 |
| JP | 2023-533092 | A | 8/2023 |
| KR | 10-0745417 | B1 | 8/2007 |
| KR | 10-1115154 | B1 | 2/2012 |
| KR | 10-1666586 | B1 | 10/2016 |
| KR | 10-2464916 | B1 | 11/2022 |
| WO | WO 2023/043579 | A1 | 3/2023 |

* cited by examiner

DISPLAY DEVICE

CROSS-REFERENCE TO RELATED APPLICATION

The present application claims priority to and the benefit of Korean Patent Application No. 10-2023-0179771, filed on Dec. 12, 2023, in the Korean Intellectual Property Office, the entire disclosure of which is incorporated by reference herein.

BACKGROUND

1. Field

Embodiments of the present disclosure described herein relate to a display device, and more particularly, relate to a display device with improved display quality.

2. Description of the Related Art

Among display devices, an emissive display device displays an image using a light emitting element that generates light by recombination of electrons and holes. The emissive display device has a high response speed and is driven with low power consumption.

The emissive display device includes pixels connected to data lines and scan lines. In general, each of the pixels includes a light emitting element and a pixel circuit for controlling the amount of current flowing through the light emitting element. The pixel circuit controls the amount of current flowing through the light emitting element in response to a data signal. At this time, light having a certain luminance is generated depending on the amount of current flowing through the light emitting element.

SUMMARY

Embodiments of the present disclosure provide a display device with improved display quality.

Embodiments of the present disclosure provide a display device with reduced power consumption.

According to one or more embodiments, a display device includes: a display panel including a pixel, wherein the pixel includes: a light emitting element including an anode connected with a first power line and a cathode; a first transistor connected between the cathode and a second power line and configured to operate based on a potential of a first node; a second transistor connected between the first node and a data line and configured to receive a first scan signal; a third transistor connected between the first node and a reference voltage line and configured to receive a second scan signal; and a fourth transistor connected between the first transistor and the first power line.

The second scan signal has an activation level during a first initialization period, and the first scan signal has an inactivation level during the first initialization period, and wherein the second scan signal has an activation level during a compensation period, and the first scan signal has an inactivation level during the compensation period.

The fourth transistor is configured to receive a third scan signal, and wherein the third scan signal has an inactivation level during the first initialization period and has an activation level during the compensation period.

The fourth transistor is configured to receive the second scan signal.

The first transistor includes a first electrode connected with the cathode, a second electrode connected with the second power line, and a gate connected with the first node, and wherein the fourth transistor includes a first electrode connected to the first power line, a second electrode connected to the first electrode of the first transistor, and a gate configured to receive a third scan signal.

The pixel further includes: a first initialization transistor connected between the second electrode of the first transistor and a first initialization voltage line and configured to receive a fourth scan signal; and a first capacitor connected between a second node connected with the first transistor and the first initialization transistor and the first node.

The fourth scan signal is activated during a first initialization period and deactivated during a data write period during which the first scan signal is activated, and wherein the first initialization period is located before the data write period.

The fourth scan signal is further activated during a second initialization period located after the data write period.

The second to fourth transistors are turned off during the second initialization period.

The pixel includes a plurality of pixels, and the plurality of pixels includes a first light emitting element configured to emit light of a first color and a second light emitting element configured to emit light of a second color different from the first color, and wherein the first initialization voltage line includes a first-first initialization voltage line connected with the first light emitting element and configured to receive a first-first initialization voltage and a first-second initialization voltage line connected with the second light emitting element and configured to receive a first-second initialization voltage different from the first-first initialization voltage.

The pixel further includes a second initialization transistor connected between the cathode of the light emitting element and a second initialization voltage line, and wherein the first initialization voltage line and the second initialization voltage line are configured to receive different initialization voltages.

The fourth transistor is configured to receive the third scan signal, wherein the second initialization transistor is configured to receive the fourth scan signal, and wherein a period during which the third scan signal is activated and a period during which the fourth scan signal is activated do not overlap each other.

The display panel is configured to display an image during a plurality of frames, and at least one frame from among the plurality of frames includes a write frame and a holding frame, wherein the first to third scan signals have an activation level in the write frame and remain in an inactive state during the holding frame, and wherein the fourth scan signal has an activation level in the write frame and the holding frame.

The pixel includes a plurality of pixels, and the plurality of pixels includes a first light emitting element configured to emit light of a first color and a second light emitting element configured to emit light of a second color different from the first color, and wherein the second initialization voltage line includes a second-first initialization voltage line connected with the first light emitting element and configured to receive a second-first initialization voltage and a second-second initialization voltage line connected with the second light emitting element and configured to receive a second-second initialization voltage different from the second-first initialization voltage.

The second initialization transistor is configured to receive a fifth scan signal, wherein the fourth scan signal is activated during a first initialization period, and the fifth scan signal is activated during a first initialization period and a second initialization period, wherein the fourth scan signal and the fifth scan signal are deactivated during a data write period during which the first scan signal is activated, and wherein the first initialization period is located before the data write period, and the second initialization period is located after the data write period.

The fourth scan signal is further activated during the second initialization period.

The display panel is configured to display an image during a plurality of frames, and at least one frame from among the plurality of frames includes a write frame and a holding frame, wherein the fourth scan signal has an activation level in the write frame and remains in an inactive state during the holding frame, and wherein the fifth scan signal has an activation level in the holding frame.

The pixel further includes: a first emission control transistor connected between the first electrode of the first transistor and the cathode and configured to receive an emission control signal; and a second emission control transistor connected between the second electrode of the first transistor and the second power line and configured to receive the emission control signal.

The pixel further includes a second capacitor connected between the second electrode of the first transistor and one of the first and second power lines, and wherein the first transistor further includes a back gate connected with the second electrode of the first transistor.

Each of the first to fourth transistors is an N-type transistor.

A first drive voltage received by the first power line is higher than a second drive voltage received by the second power line, and wherein a reference voltage received by the reference voltage line is between the first drive voltage and the second drive voltage.

The light emitting element further includes: an electron control layer on the cathode; an emissive layer on the electron control layer; and a hole control layer on the emissive layer, wherein the anode is on the hole control layer.

The second power line has a structure of Ti/Al/Ti.

The anode includes a MgAg alloy, and wherein the cathode has a structure of ITO/Ag/ITO.

The second power line and the data line are at a same layer and includes a same material.

The second power line and the first power line are at a same layer and include a same material.

The anode is directly connected to the first power line.

The display device further includes: a connection conductive pattern configured to connect the anode and the first power line.

The display panel includes a display region in which the pixel is located and a non-display region around at least a portion of the display region, and wherein the pixel includes a plurality of pixels, the anode includes a plurality of anodes, and the plurality of anodes are separately located in respective ones of the pixels and connected to the second power line in the display region.

The display panel comprises a display region in which the pixel is located and a non-display region around at least a portion of the display region, and wherein the pixel comprises a plurality of pixels, and the anode is commonly disposed in the pixels and connected to the second power line in the non-display region.

The light emitting element further includes an intermediate layer comprising at least an emissive layer, the intermediate layer being on the anode, and wherein the cathode is on the intermediate layer.

The display panel further includes a separator having an obtuse taper angle, wherein the pixel comprises a plurality of pixels, and the plurality of pixels comprises a first light emitting element configured to emit light of a first color and a second light emitting element configured to emit light of a second color different from the first color, and wherein the separator separates the cathode of the first light emitting element and the cathode of the second light emitting element from each other.

The display panel further comprises a connecting line configured to electrically connect the first transistor and the cathode.

The connecting line comprises a first layer, a second layer on the first layer, and a third layer on the second layer, and wherein a side surface of the third layer protrudes outward from a side surface of the second layer, and the cathode is in contact with the side surface of the second layer.

The display panel further includes: a pixel defining layer having an opening defined therein that exposes at least a portion of the anode; a connecting electrode on the pixel defining layer and electrically connected with the first transistor and the cathode; and a separator on the pixel defining layer, wherein in a contact region adjacent to the separator, a lower surface of the cathode contacts an upper surface of the connecting electrode.

The connecting electrode has a ring shape surrounding the opening.

The separator comprises a first side surface and a second side surface having different taper angles with respect to an upper surface of the pixel defining layer.

The pixel comprises a plurality of pixels, and the connecting electrode comprises a plurality of connecting electrodes, wherein each of the plurality of connecting electrodes electrically connects a first transistor and a cathode in a corresponding pixel from among the plurality of pixels, and wherein a gap between the plurality of connecting electrodes adjacent to each other from among the plurality of connecting electrodes overlaps the separator.

A display device includes: a display panel comprising a pixel, wherein the pixel includes: a light emitting element comprising an anode connected with a first power line and a cathode; a drive transistor comprising a first electrode connected with the cathode, a second electrode connected with a second power line, and a gate connected with a first node; a switching transistor connected between the first node and a data line; an emission control transistor connected between the first electrode of the drive transistor and the cathode; a compensation transistor connected between the first electrode of the drive transistor and the first power line; and an initialization transistor connected between the cathode and an initialization voltage line, wherein the compensation transistor and the initialization transistor are configured to receive different scan signals.

BRIEF DESCRIPTION OF THE DRAWINGS

The above and other aspects and features of the present disclosure will become apparent by describing in detail embodiments thereof with reference to the accompanying drawings.

DETAILED DESCRIPTION

Figure 1:
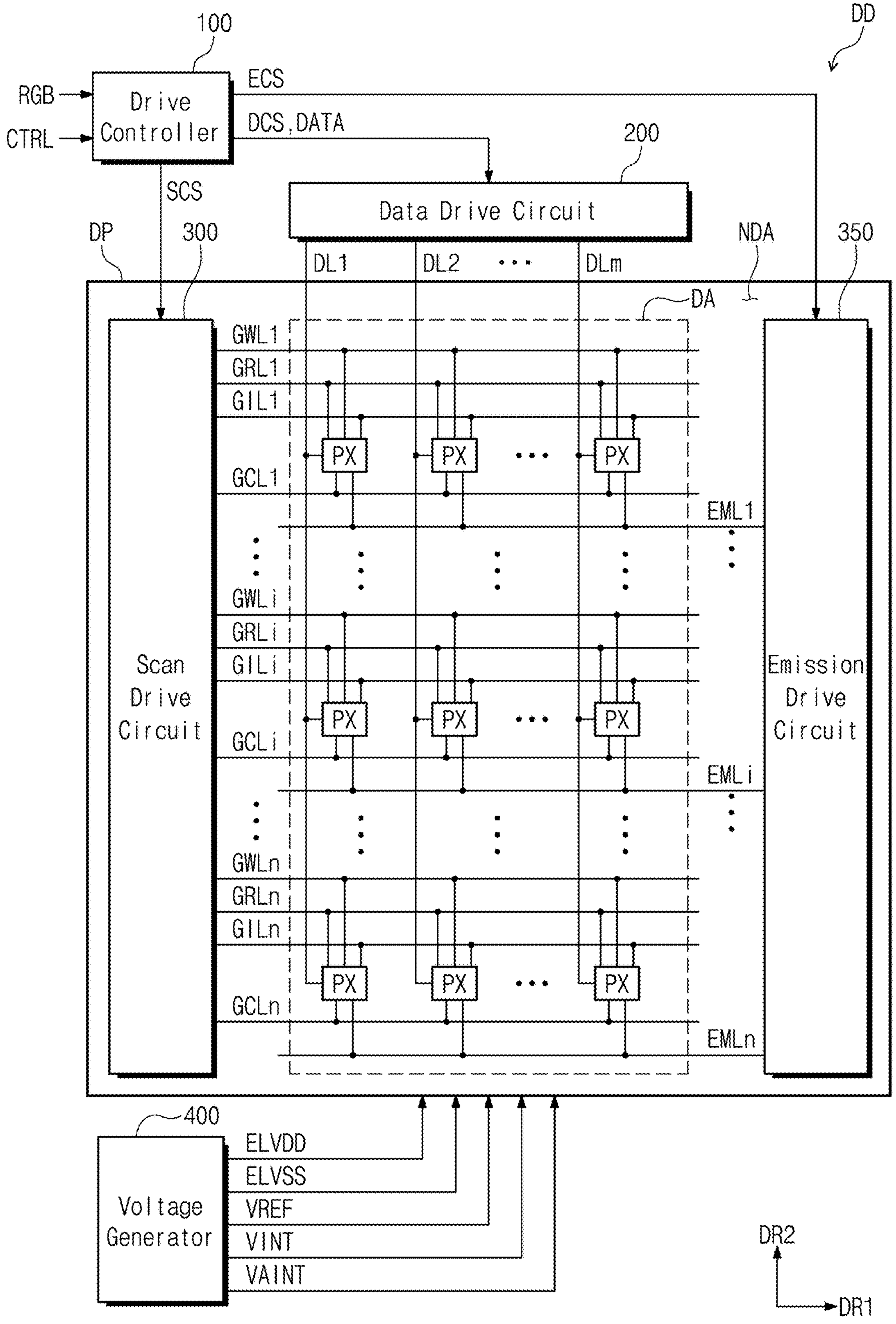
FIG. 1 is a block diagram of a display device according to one or more embodiments of the present disclosure.

In the present disclosure, when it is mentioned that a component (or, a region, a layer, a part, etc.) is referred to as being "on", "connected to" or "coupled to" another component, this means that the component may be directly on, connected to, or coupled to the other component or a third component may be present therebetween.

Identical (or same) reference numerals refer to identical (or same) components. Additionally, in the drawings, the thicknesses, proportions, and dimensions of components are exaggerated for effective description. As used herein, the term "and/or" includes all of one or more combinations defined by related components.

Terms such as first, second, and the like may be used to describe various components, but the components should not be limited by the terms. The terms may be used only for distinguishing one component from other components. For example, without departing the spirit or scope of the present disclosure, a first component may be referred to as a second component, and similarly, the second component may also be referred to as the first component. The terms of a singular form may include plural forms unless otherwise specified.

In addition, terms such as "below", "under", "above", and "over" are used to describe a relationship of components illustrated in the drawings. The terms are relative concepts and are described based on directions illustrated in the drawing.

It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

Unless otherwise defined, all terms used herein, including technical or scientific terms, have the same meanings as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

Expressions, such as "at least one of" and "any one of," when preceding a list of elements, modify the entire list of elements and do not modify the individual elements of the list. When phrases such as "at least one of A, B, and C," "at least one of A, B, or C," "at least one selected from a group of A, B, and C," or "at least one selected from among A, B, and C" are used to designate a list of elements A, B, and C, the phrase may refer to any and all suitable combinations or a subset of A, B, and C, such as A, B, C, A and B, A and C, B and C, or A and B and C.

A person of ordinary skill in the art would appreciate, in view of the present disclosure in its entirety, that each suitable feature of the various embodiments of the present disclosure may be combined or combined with each other, partially or entirely, and may be technically interlocked and operated in various suitable ways, and each embodiment may be implemented independently of each other or in conjunction with each other in any suitable manner unless otherwise stated or implied.

Hereinafter, embodiments of the present disclosure will be described with reference to the accompanying drawings.

FIG. 1 is a block diagram of a display device DD according to one or more embodiments of the present disclosure.

Referring to FIG. 1, the display device DD may include a display panel DP, a drive controller 100, and a panel driver. In one or more embodiments of the present disclosure, the panel driver may include a data drive circuit 200 (or, a data driver), a scan drive circuit 300, an emission drive circuit 350, and a voltage generator 400.

The display panel DP may include a display region DA and a non-display region NDA around (e.g., surrounding) at least a portion of the display region DA. The display panel DP may include a plurality of pixels PX disposed in the display region DA. The display panel DP may include first scan lines GWL1 to GWLn, second scan lines GRL1 to GRLn, third scan lines GCL1 to GCLn, fourth scan lines GIL1 to GILn, and emission control lines EML1 to EMLn. The first scan lines GWL1 to GWLn may be referred to as write scan lines, the second scan lines GRL1 to GRLn may be referred to as reference scan lines, the third scan lines GCL1 to GCLn may be referred to as compensation scan lines, and the fourth scan lines GIL1 to GILn may be referred to as initialization scan lines.

The display panel DP may be driven at a certain drive frequency, for example, 60 Hz, 120 Hz, and/or 240 Hz. Alternatively, the display panel DP may be driven at the fixed drive frequency in a first mode and/or may be driven at a variable drive frequency in a second mode. For example, the drive frequency in the second mode may be diversely varied in the range of 1 Hz to 240 Hz, but is not particularly limited thereto.

The drive controller 100 receives an image signal RGB and a control signal CTRL. The drive controller 100 generates an image data signal DATA by converting the data format of the image signal RGB according to the specification of an interface with the data drive circuit 200. The drive controller 100 outputs a scan control signal SCS, a data control signal DCS, and an emission drive control signal ECS.

The data drive circuit 200 (or, the data driver) receives the data control signal DCS and the image data signal DATA from the drive controller 100. The data drive circuit 200 converts the image data signal DATA into data signals and outputs the data signals to data lines DL1 to DLm. The data signals are analog voltages corresponding to gray level values of the image data signal DATA. The data lines DL1 to DLm may be arranged along a first direction DR1. Each of the data lines DL1 to DLm may extend in a second direction DR2.

The scan drive circuit 300 (or, the scan driver) and the emission drive circuit 350 (or, the emission driver) may be disposed in the non-display region NDA of the display panel DP. In one or more embodiments of the present disclosure, the scan drive circuit 300 may be disposed adjacent to one side of the display region DA, and the emission drive circuit 350 may be disposed adjacent to an opposite side of the display region DA that faces away from the one side of the display region DA. Although the scan drive circuit 300 and the emission drive circuit 350 are disposed on the opposite sides of the display region DA in the embodiment illustrated in FIG. 1, the present disclosure is not limited thereto. For example, the scan drive circuit 300 and the emission drive circuit 350 may be disposed adjacent to one of the opposite sides of the display panel DP. In one or more embodiments, the scan drive circuit 300 and the emission drive circuit 350 may be integrated into one circuit.

Figure 3:
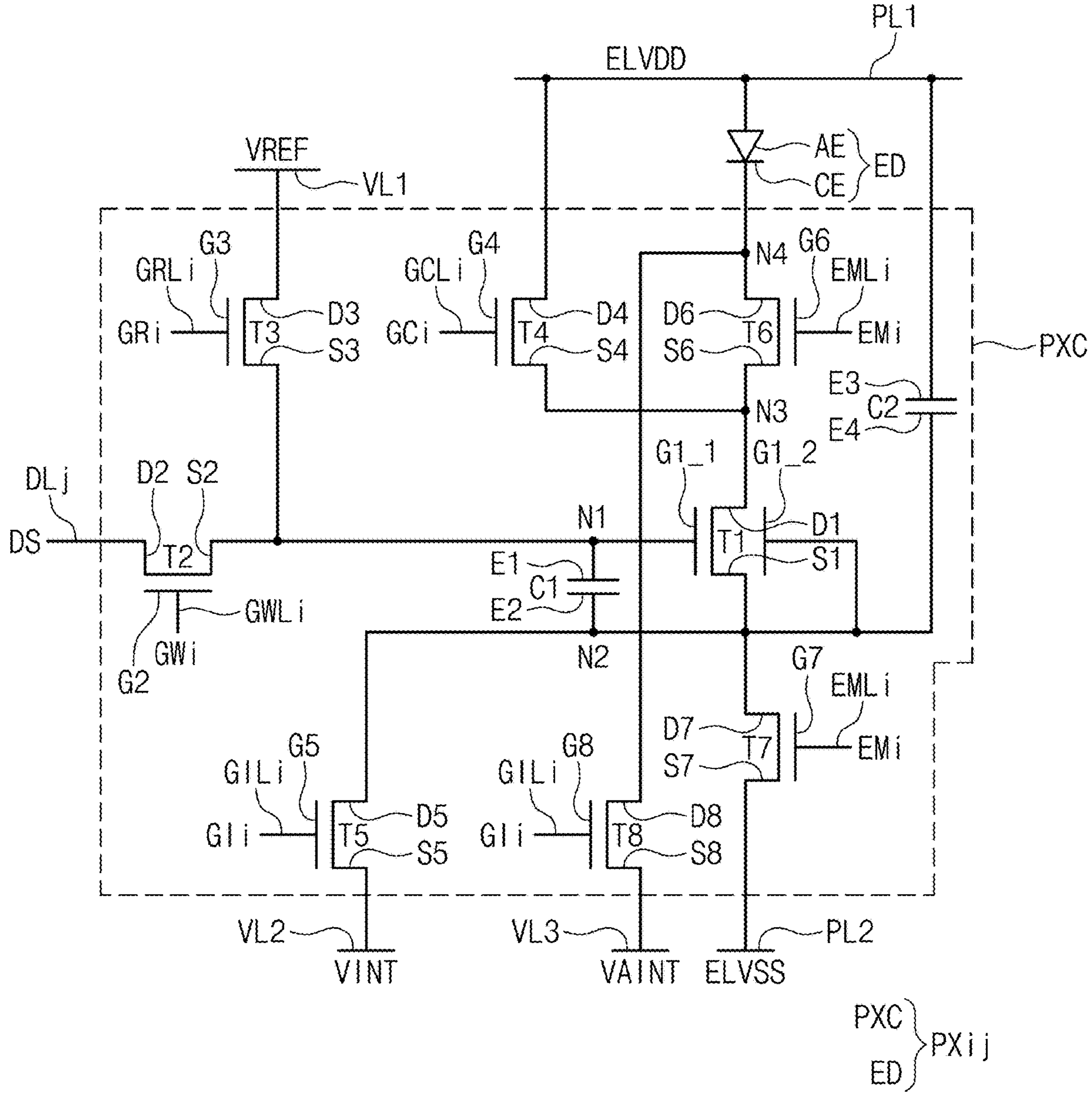
FIG. 3 is a circuit diagram of a pixel according to one or more embodiments of the present disclosure.

Each of the plurality of pixels PX according to one or more embodiments of the present disclosure includes a light emitting element ED (refer to FIG. 3) and a pixel circuit PXC (refer to FIG. 3) that controls light emission of the light emitting element ED (refer to FIG. 3).

The pixel circuit PXC (refer to FIG. 3) may include at least one transistor and at least one capacitor. The scan drive circuit 300 and the emission drive circuit 350 may include transistors formed through the same process as that of the pixel circuit PXC (refer to FIG. 3). The pixel circuit PXC (refer to FIG. 3) may be referred to as a pixel driver.

The scan drive circuit 300 receives the scan control signal SCS from the drive controller 100. The scan drive circuit 300 may output first scan signals, second scan signals, third scan signals, and fourth scan signals to the first scan lines GWL1 to GWLn, the second scan lines GRL1 to GRLn, the third scan lines GCL1 to GCLn, and the fourth scan lines GIL1 to GILn in response to the scan control signal SCS. The emission drive circuit 350 may output emission control signals to the emission control lines EML1 to EMLn in response to the emission drive control signal ECS from the drive controller 100.

The first scan lines GWL1 to GWLn, the second scan lines GRL1 to GRLn, the third scan lines GCL1 to GCLn, the fourth scan lines GIL1 to GILn, and the emission control lines EML1 to EMLn may each extend in the first direction DR1. The first scan lines GWL1 to GWLn, the second scan lines GRL1 to GRLn, the third scan lines GCL1 to GCLn, the fourth scan lines GIL1 to GILn, and the emission control lines EML1 to EMLn may be spaced (e.g., spaced apart) from one another in the second direction DR2.

Each of the plurality of pixels PX may be electrically connected to four scan lines, one emission control line, and one data line. For example, as illustrated in FIG. 1, the pixels PX in the first row may be connected to the scan lines GWL1, GRL1, GCL1, and GIL1 and the emission control line EML1. The pixels in the first column may be connected to the data line DL1. In addition, the pixels in the i-th row may be connected to the scan lines GWLi, GRLi, GCLi, and GILi and the emission control line EMLi. However, the present disclosure is not limited thereto, and each of the pixels PX may be connected to fewer than four scan lines, or may be connected to more than four scan lines.

The voltage generator 400 (or, the power supply unit) generates voltages required for operation of the display panel DP. In this embodiment, the voltage generator 400 may generate a first drive voltage ELVDD, a second drive voltage ELVSS, a reference voltage VREF, a first initialization voltage VINT, and a second initialization voltage VAINT.

Figure 2A:
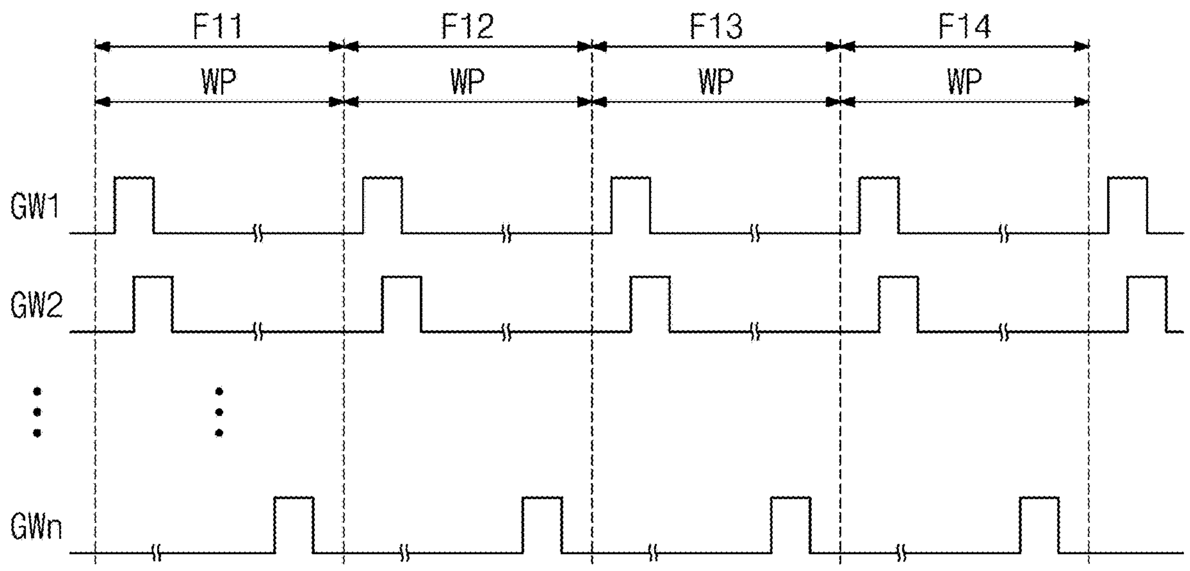
FIGS. 2A and 2B are timing diagrams for explaining the operation of the display device according to one or more embodiments of the present disclosure.
Figure 2B:
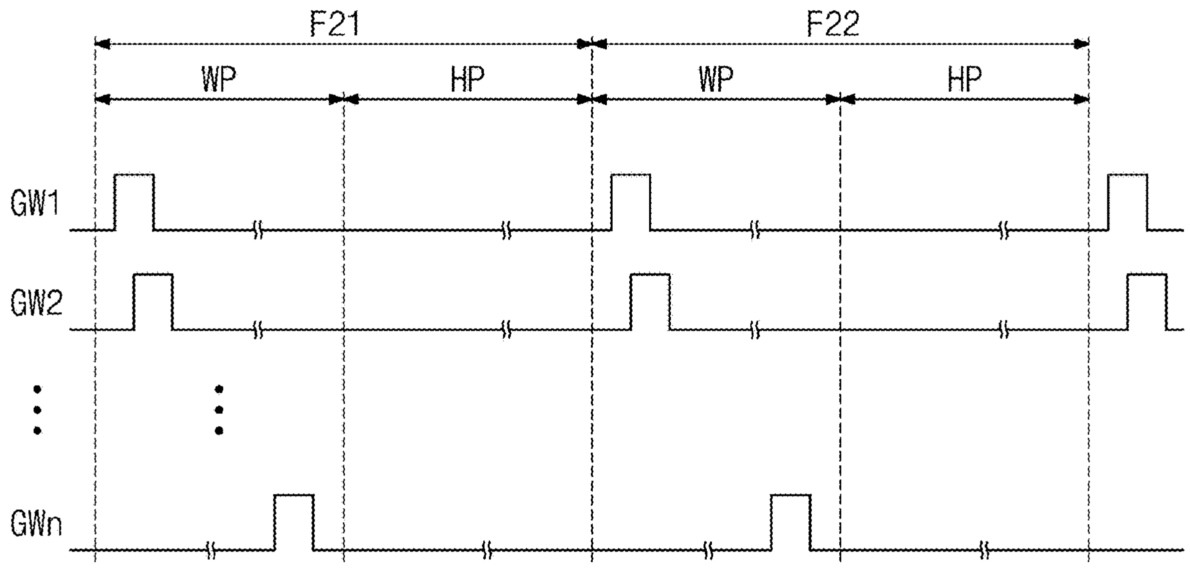

FIGS. 2A and 2B are timing diagrams for explaining the operation of the display device DD (refer to FIG. 1) according to one or more embodiments of the present disclosure. FIG. 2A is a timing diagram for explaining a case in which the display device DD (refer to FIG. 1) according to one or more embodiments of the present disclosure operates at a first drive frequency. FIG. 2B is a timing diagram for explaining a case in which the display device DD (refer to FIG. 1) according to one or more embodiments of the present disclosure operates at a second drive frequency.

Referring to FIGS. 1 and 2A, the drive frequency of the display device DD may be diversely varied. In one or more embodiments of the present disclosure, the first drive frequency may be the highest drive frequency at which the display device DD is capable of operating. The first drive frequency may be referred to as a reference frequency or a maximum frequency.

When the display device DD operates at the first drive frequency, the scan drive circuit 300 may sequentially activate scan signals (e.g., the first scan signals GW1 to GWn) to a high level in each of a plurality of frames F11, F12, F13, and F14. Although only the first scan signals GW1 to GWn are illustrated in FIGS. 2A and 2B for convenience of description, the second scan signals, the third scan signals, and the fourth scan signals may also be activated in a similar form depending on drive frequencies.

When the first drive frequency is the maximum frequency, each of the frames F11, F12, F13, and F14 may include only a write frame WP. In this case, the duration of the write frame WP may be equal to the duration of each of the frames F11, F12, F13, and F14.

Referring to FIGS. 1 and 2B, the display device DD may operate at the second drive frequency lower than the first drive frequency.

When the display device DD operates at the second drive frequency lower than the first drive frequency, the duration of each of frames F21 and F22 may be longer than the duration of each of the frames F11, F12, F13, and F14 illustrated in FIG. 2A. FIG. 2B illustrates an example that the duration of each of the frames F21 and F22 operating at the second drive frequency is twice the duration of each of the frames F11, F12, F13, and F14. However, the duration of each of the frames F21 and F22 operating at the second drive frequency is not limited to any one embodiment.

Each of the frames F21 and F22 may include a write frame WP and a holding frame HP. FIG. 2B illustrates an example that the write frame WP has the same duration as each of the frames F11, F12, F13, and F14 illustrated in FIG. 2A.

During the write frame WP, the scan drive circuit 300 may sequentially activate the first scan signals GW1 to GWn to an activation level (e.g., a high level). In one or more embodiments, the scan drive circuit 300 and the emission drive circuit 350 may sequentially activate the scan signals and the emission control signals to an activation level (e.g., a high level) during the write frame WP. Detailed description thereabout will be given below.

During the holding frame HP, the scan drive circuit 300 may hold the first scan signals GW1 to GWn at an inactivation level (e.g., a low level). During the holding frame HP, the scan drive circuit 300 may hold the second and third scan signals at an inactivation level.

Figure 4A:
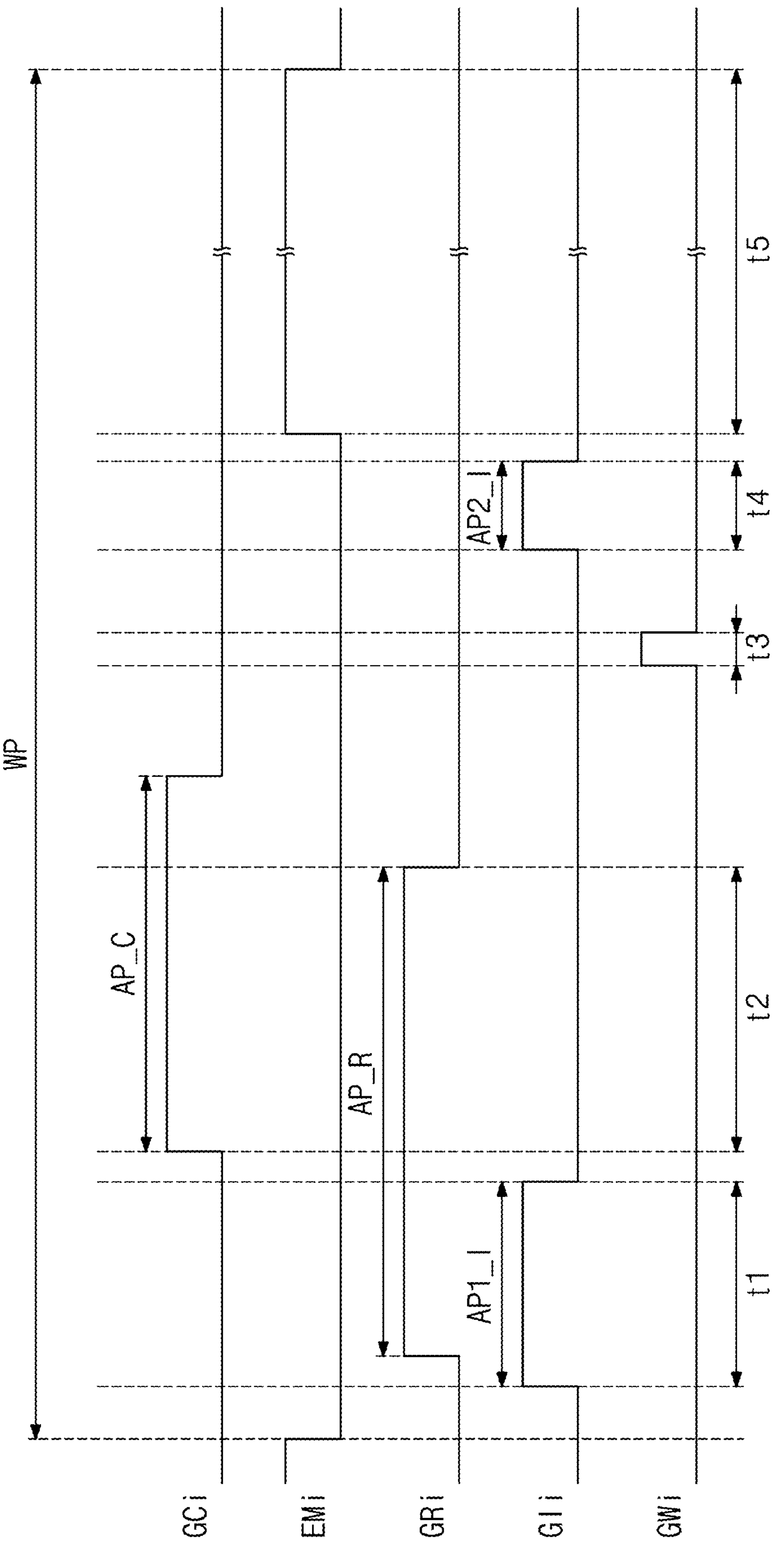
FIGS. 4A and 4B are timing diagrams for explaining the operation of the pixel of FIG. 3 according to one or more embodiments of the present disclosure.
Figure 4B:
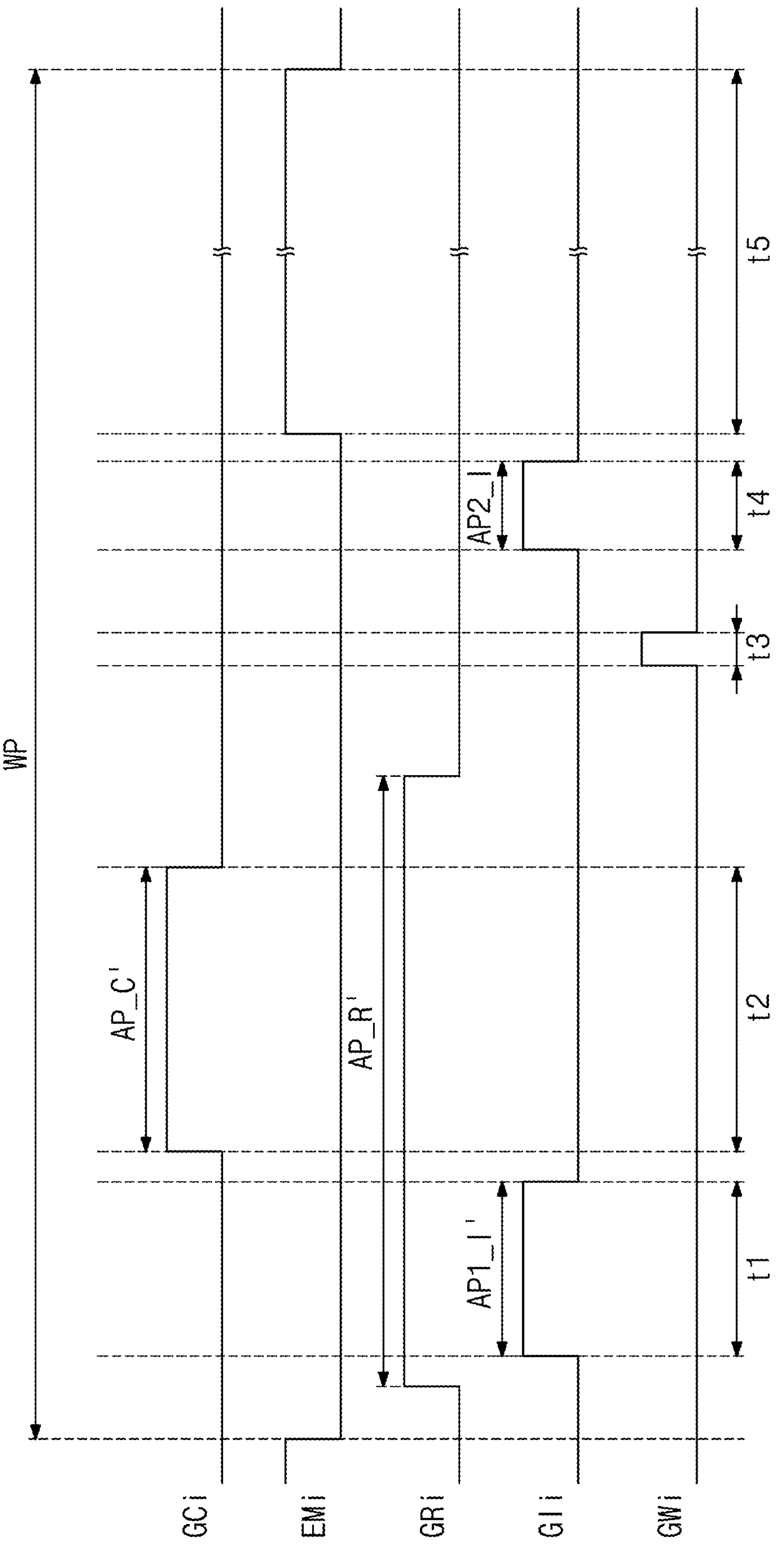

FIG. 3 is a circuit diagram of a pixel PXij according to one or more embodiments of the present disclosure. FIGS. 4A and 4B are timing diagrams for explaining the operation of the pixel PXij of FIG. 3 according to one or more embodiments of the present disclosure.

In FIG. 3, the pixel PXij connected to the i-th first scan line GWLi from among the first scan lines GWL1 to GWLn (refer to FIG. 1) and connected to the j-th data line DLj from among the plurality of data lines DL1 to DLm (refer to FIG. 1) is representatively illustrated. The pixel PXij is connected to the i-th second scan line GRLi from among the second scan lines GRL1 to GRLn (refer to FIG. 1), the i-th third scan line GCLi from among the third scan lines GCL1 to GCLn (refer to FIG. 1), and the i-th fourth scan line GILi from among the fourth scan lines GIL1 to GILn (refer to FIG. 1). In addition, the pixel PXij is connected to the i-th emission control line EMLi from among the emission control lines EML1 to EMLn.

The pixel PXij may include a pixel circuit PXC (or, a pixel drive circuit) and a light emitting element ED electrically connected to the pixel circuit PXC. In this embodiment, the pixel circuit PXC may include eight transistors (hereinafter, referred to as the first to eighth transistors T1 to T8) and two capacitors (hereinafter, referred to as the first capacitor C1 and the second capacitor C2). In one or more embodiments of the present disclosure, at least one of the first to eighth transistors T1 to T8 may be omitted from the pixel PXij, or an additional transistor may be further included in the pixel PXij.

The i-th first scan line GWLi may transfer the i-th first scan signal GWi to the pixel PXij, the i-th second scan line GRLi may transfer the i-th second scan signal GRi to the pixel PXij, the i-th third scan line GCLi may transfer the i-th third scan signal GCi to the pixel PXij, and the i-th fourth scan line GILi may transfer the i-th fourth scan signal Gli to the pixel PXij. The i-th emission control line EMLi may transfer the i-th emission control signal EMi to the pixel PXij. The j-th data line DLj may transfer a data signal DS to the pixel PXij. The data signal DS may have a voltage level corresponding to the gray level value of the image data signal DATA (refer to FIG. 1) output from the drive controller 100 (refer to FIG. 1).

In addition, the pixel PXij may be connected with a first power line PL1 that receives the first drive voltage ELVDD, a second power line PL2 that receives the second drive voltage ELVSS, a reference voltage line VL1 that receives the reference voltage VREF, a first initialization voltage line VL2 that receives the first initialization voltage VINT, and a second initialization voltage line VL3 that receives the second initialization voltage VAINT. The first drive voltage ELVDD has a higher voltage level than the second drive voltage ELVSS, and the reference voltage VREF has a voltage level higher than that of the second drive voltage ELVSS and lower than that of the first drive voltage ELVDD. The first initialization voltage VINT may have a lower voltage level than the second initialization voltage VAINT.

In this embodiment, each of the first to eighth transistors T1 to T8 may be an N-type thin film transistor (TFT) having an oxide semiconductor as a semiconductor layer. In particular, when an N-type thin film transistor is applied to the first transistor T1 referred to as a drive transistor, a variation in device characteristics due to previous data may be reduced as compared with when a P-type thin film transistor is applied to the first transistor T1. Accordingly, the characteristics of overcoming instantaneous afterimage may be improved.

The light emitting element ED may include an anode AE and a cathode CE. When the light emitting element ED is an organic light emitting element, the light emitting element ED may further include an organic layer disposed between the anode AE and the cathode CE. The anode AE of the light emitting element ED may be connected to the first power line PL1. In this embodiment, the anode AE of the light emitting element ED may be directly connected to the first power line PL1. The cathode CE of the light emitting element ED may be connected to the pixel circuit PXC. The light emitting element LD may emit light in response to the amount of current flowing through the first transistor T1 of the pixel circuit PXC.

The first transistor T1 is connected between the cathode CE of the light emitting element ED and the second power line PL2 that receives the second drive voltage ELVSS. The first transistor T1 may be referred to as a drive transistor. The first transistor T1 may include a first electrode D1, a second electrode S1, and a gate electrode G1_1. The gate electrode G1_1 may be connected to a first node N1, the second electrode S1 may be connected to a second node N2, and the first electrode D1 may be connected to a third node N3. The first electrode D1 may be referred to as a drain of the first transistor T1, and the second electrode S1 may be referred to as a source of the first transistor T1. The first transistor T1 may operate depending on the potential of the first node N1. In this embodiment, the first transistor T1 may further include a back gate electrode G1_2. The back gate electrode G1_2 may be connected to the second electrode S1 of the first transistor T1.

According to one or more embodiments of the present disclosure, the first transistor T1 may be an N-type thin film transistor, and the cathode CE of the light emitting element ED may be connected to the drain (or, the first electrode D1) of the first transistor T1 via the sixth transistor T6.

The second transistor T2 is connected between the j-th data line DLj and the first node N1 and receives the i-th first scan signal GWi. The second transistor T2 may be referred to as a switching transistor. The second transistor T2 may include a first electrode D2 connected to the j-th data line DLj, a second electrode S2 connected to the first node N1, and a gate electrode G2 connected to the i-th first scan line GWLi. The second transistor T2 may transfer the data signal DS received through the j-th data line DLj to the first node N1 in response to the i-th first scan signal GWi received through the i-th first scan line GWLi.

The third transistor T3 is connected between the reference voltage line VL1 and the first node N1 and receives the i-th second scan signal GRi. The third transistor T3 may be referred to as a first compensation transistor. The third transistor T3 may include a first electrode D3 connected to the reference voltage line VL1, a second electrode S3 connected to the first node N1, and a gate electrode G3 connected to the i-th second scan line GRLi. The third transistor T3 may be turned on by the i-th second scan signal GRi received through the i-th second scan line GRLi and may transfer the reference voltage VREF to the first node N1. In this embodiment, the reference voltage VREF may have a voltage level between the first drive voltage ELVDD and the second drive voltage ELVSS. For example, when the first drive voltage ELVDD is 13V and the second drive voltage ELVSS is OV, the reference voltage VREF may be 1.3V.

The fourth transistor T4 is connected between the first power line PL1 and the third node N3 and receives the i-th third scan signal GCi. The fourth transistor T4 may be referred to as a second compensation transistor. The fourth transistor T4 may include a first electrode D4 connected to the first power line PL1, a second electrode S4 connected to the first electrode D1 of the first transistor T1 (that is, the third node N3), and a gate electrode G4 connected to the i-th third scan line GCLi. The fourth transistor T4 may be turned on by the i-th third scan signal GCi received through the i-th third scan line GCLi and may transfer the first drive voltage ELVDD to the third node N3.

When the fourth transistor T4 is not connected to the first power line PL1 and receives a voltage using a separate power line, the number of power lines connected to the pixel PXij may be increased. However, because the fourth transistor T4 according to this embodiment uses the first drive voltage ELVDD supplied through the first power line PL1, the voltage generator 400 (refer to FIG. 1) may not further include a separate power line. Accordingly, the area of the non-display region NDA (refer to FIG. 1) may be decreased. In addition, the number of power lines connected to the pixel PXij may be decreased. Accordingly, the gap between lines connected to the pixel PXij may be increased, and thus signal interference between the lines may be decreased. As a result, the pixel PXij and the display device DD (refer to FIG. 1) with improved display quality may be provided.

The fifth transistor T5 is connected between the first initialization voltage line VL2 and the second node N2 and receives the i-th fourth scan signal Gli. The fifth transistor T5 may be referred to as a first initialization transistor. The fifth transistor T5 may include a first electrode D5 connected to the second electrode S1 of the first transistor T1, a second electrode S5 connected to the first initialization voltage line VL2, and a gate electrode G5 connected to the i-th fourth scan line GILi. The fifth transistor T5 may be turned on by the i-th fourth scan signal Gli received through the i-th fourth scan line GILi and may transfer the first initialization voltage VINT to the second node N2.

The sixth transistor T6 may be connected between the first transistor T1 and the cathode CE of the light emitting element ED and may receive the i-th emission control signal EMi. The sixth transistor T6 may be referred to as a first emission control transistor. The sixth transistor T6 may include a first electrode D6 connected to the cathode CE of the light emitting element ED, a second electrode S6 connected to the first electrode D1 of the first transistor T1, and a gate electrode G6 connected to the i-th emission control line EMLi. The sixth transistor T6 may be turned on by the i-th emission control signal EMi received through the i-th emission control line EMLi and may electrically connect the cathode CE of the light emitting element ED to the first electrode D1 of the first transistor T1.

The seventh transistor T7 may be connected between the first transistor T1 and the second power line PL2 and may receive the i-th emission control signal EMi. The seventh transistor T7 may be referred to as a second emission control transistor. The seventh transistor T7 may include a first electrode D7 connected to the second electrode S1 of the first transistor T1, a second electrode S7 connected to the second power line PL2, and a gate electrode G7 connected to the i-th emission control line EMLi. The seventh transistor T7 may be turned on by the i-th emission control signal EMi received through the i-th emission control line EMLi and may electrically connect the second power line PL2 to the second electrode S1 of the first transistor T1.

The eighth transistor T8 may be connected between the second initialization voltage line VL3 and the cathode CE of the light emitting element ED and may receive the i-th fourth scan signal Gli. The eighth transistor T8 may be referred to as a second initialization transistor. The eighth transistor T8 may include a first electrode D8 connected to a fourth node N4, a second electrode S8 connected to the second initialization voltage line VL3, and a gate electrode G8 connected to the i-th fourth scan line GILi. The cathode CE of the light emitting element ED and the first electrode D6 of the sixth transistor T6 may be connected to the fourth node N4. The eighth transistor T8 may be turned on by the i-th fourth scan signal Gli received through the i-th fourth scan line GILi and may transfer the second initialization voltage VAINT to the cathode CE of the light emitting element ED.

In this embodiment, the fourth transistor T4 and the eighth transistor T8 may receive different scan signals. In addition, the fourth transistor T4 and the eighth transistor T8 may be connected to different voltage lines. Accordingly, an initialization operation of the cathode CE through the eighth transistor T8 and a compensation operation of the first transistor T1 through the fourth transistor T4 may be independently performed. Furthermore, in the compensation operation, the third node N3 to which the drain of the first transistor T1 is connected and the fourth node N4 to which the cathode CE of the light emitting element ED is connected may be separated from each other. Accordingly, in the compensation operation, an influence of parasitic capacitance formed at the fourth node N4 may be reduced. Thus, compensation stability may be improved.

In contrast, when the fourth transistor T4 and the eighth transistor T8 receive the same scan signal and are connected to the same voltage line unlike in this embodiment, the third node N3 and the fourth node N4 may not be separated from each other in the compensation operation, and therefore the parasitic capacitance formed at the fourth node N4 may affect the amount of compensation.

The first capacitor C1 may be connected between the first node N1 and the second node N2. The first capacitor C1 may include a first electrode E1 connected to the first node N1 and a second electrode E2 connected to the second node N2. The first capacitor C1 may store a difference voltage between the first node N1 and the second node N2. The first capacitor C1 may be referred to as a storage capacitor.

The second capacitor C2 may be connected between the first power line PL1 and the second node N2. The second capacitor C2 may include a first electrode E3 connected to the first power line PL1 and a second electrode E4 connected to the second node N2. The second capacitor C2 may store a difference voltage between the first drive voltage ELVDD and the second node N2. The second capacitor C2 may be referred to as a hold capacitor.

Operation of the pixel PXij will be described in more detail with reference to FIGS. 3-4C.

The display device DD (refer to FIG. 1) displays an image in each frame. The first scan lines GWL1 to GWLn (refer to FIG. 1), the second scan lines GBL1 to GBLn (refer to FIG. 1), the third scan lines GCL1 to GCLn (refer to FIG. 1), the fourth scan lines GIL1 to GILn (refer to FIG. 1), and the emission control lines EML1 to EMLn may sequentially receive scan signals and/or emission control signals during the frame. FIG. 4A illustrates operation of the pixel PXij during the write frame WP within one frame from among the frames F11 to F14 illustrated in FIG. 2A, and FIG. 4B illustrates operation of the pixel PXij during the write frame WP within the frames F21 and F22 illustrated in FIG. 2B. FIG. 4C illustrates operation of the pixel PXij during the holding frame HP within the frames F21 and F22 illustrated in FIG. 2B.

Figure 4C:
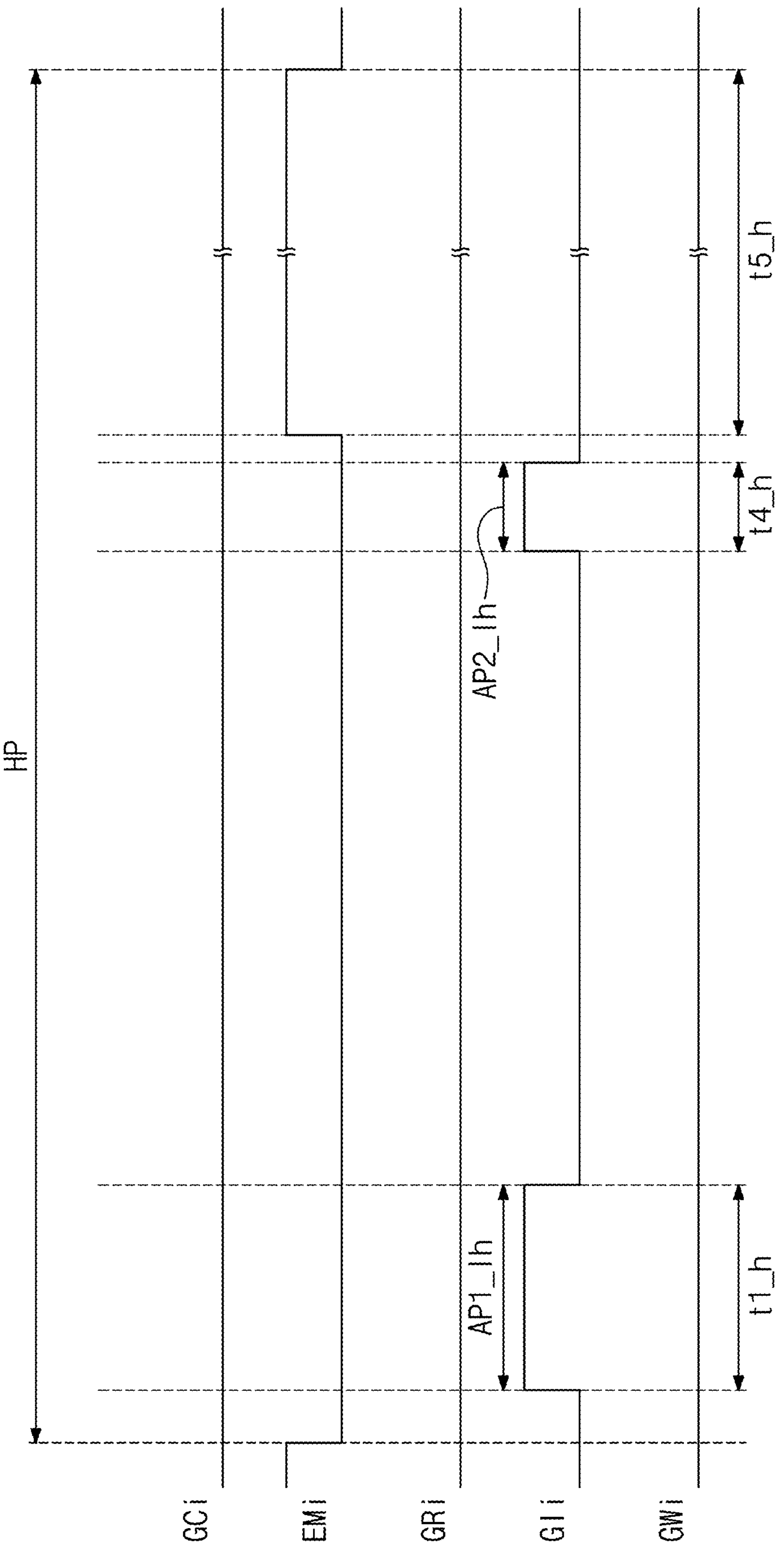
FIG. 4C is a timing diagram for explaining the operation of the pixel of FIG. 3 according to one or more embodiments of the present disclosure.

As illustrated in FIGS. 4A-4C, the scan signals GRi, GWi, GCi, and Gli and the emission control signals EMi may each have an activation level (or, a high level) during a partial period and may have an inactivation level (or, a low level) during a partial period. Each of the above-described N-type first to eighth transistors T1 to T8 is turned on when a corresponding scan signal or a corresponding emission control signal has a high level.

Referring to FIGS. 3-4B, the write frame WP may include a first initialization period t1, a compensation period t2, a data write period t3, a second initialization period t4, and an emission period t5. In this embodiment, the first initialization period t1 may be located before the data write period t3, and the second initialization period t4 may be located after the data write period t3.

During the first initialization period t1, the second scan signal GRi and the fourth scan signal Gli may have an activation level. In this embodiment, the first initialization period t1 may correspond to a first period AP1_I or AP1_I' (or, a first-first activation period) during which the fourth scan signal Gli has an activation level. During the first initialization period t1, the first scan signal GWi, the third scan signal GCi, and the emission control signal EMi may have an inactivation level.

During the first initialization period t1, the third transistor T3, the fifth transistor T5, and the eighth transistor T8 may be turned on. During the first initialization period t1, the first node N1 may be initialized to the reference voltage VREF, the second node N2 may be initialized to the first initialization voltage VINT, and the cathode CE of the light emitting element ED may be initialized to the second initialization voltage VAINT.

A portion of a period AP_R or AP_R' (or, a second activation period) during which the second scan signal GRi has an activation level overlaps the first period AP1_I or AP1_I' during the fourth scan signal Gli has an activation level. Accordingly, as the first node N1 and the second node N2 are concurrently (e.g., simultaneously) initialized during the first initialization period t1, the first capacitor C1 may be initialized to a difference value between the reference voltage VREF and the first initialization voltage VINT. The second capacitor C2 may be initialized to a difference value between the first drive voltage ELVDD and the first initialization voltage VINT. The first initialization period t1 may be a period during which the gate electrode G1_1 and the source S1 of the first transistor T1 are initialized and the cathode CE of the light emitting element ED is initialized.

In one or more embodiments, as illustrated in FIG. 4A, the time point at which the second activation period AP_R of the second scan signal GRi starts may be located after the time point at which the first-first activation period AP1_I of the fourth scan signal Gli starts. However, the present disclosure is not limited thereto. For example, as illustrated in FIG. 4B, the time point at which the first-first activation period AP1_I' of the fourth scan signal Gli starts may be located after the time point at which the second activation period AP_R' of the second scan signal GRi starts. In this case, the first-first activation period AP1_I' of the fourth scan signal Gli may all overlap the second activation period AP_R' of the second scan signal GRi. Alternatively, the first-first activation period AP1_I' and the second activation period AP_R' may start at the same time.

During the compensation period t2, the second scan signal GRi and the third scan signal GCi may have an activation level. In this embodiment, the second scan signal GRi may substantially maintain an activation level during the first initialization period t1 and the compensation period t2. During the compensation period t2, the first scan signal GWi, the fourth scan signal Gli, and the emission control signal EMi may have an inactivation level.

During the compensation period t2, the third transistor t3 and the fourth transistor T4 may be turned on in response to the second scan signal GRi and the third scan signal GCi, respectively. Another portion of the period AP_R or AP_R' during which the second scan signal GRi has an activation level overlaps a period AP_C or AP_C' (or, a third activation period) during the third scan signal GCi has an activation level. During the compensation period t2, the threshold voltage Vth of the first transistor T1 may be compensated for by coupling of the first capacitor C1. A voltage "VREF-Vth" lower than the reference voltage VREF provided to the gate electrode G1_1 of the first transistor T1 by the threshold voltage Vth of the first transistor T1 may be provided to the second node N2.

In one or more embodiments, as illustrated in FIG. 4A, the time point at which the third activation period AP_C of the third scan signal GCi ends may be located after the time point at which the second activation period AP_R of the second scan signal GRi ends. However, the present disclosure is not limited thereto. For example, as illustrated in FIG. 4B, the time point at which the second activation period AP_R' of the second scan signal GRi ends may be located after the time point at which the third activation period AP_C' of the third scan signal GCi ends. In this case, the third activation period AP_C' of the third scan signal GCi may all overlap the second activation period AP_R' of the second scan signal GRi. Alternatively, the second activation period AP_R' and the third activation period AP_C' may end at the same time.

In this embodiment, the period during which the third scan signal GCi is activated and the period during which the fourth scan signal Gli is activated may not overlap each other. Accordingly, the compensation period t2 may not overlap the first initialization period t1. That is, the compensation period t2 and the first initialization period t1 may independently proceed without proceeding at the same time. Accordingly, during the compensation period t2, the third node N3 to which the drain of the first transistor T1 is connected and the fourth node N4 to which the cathode CE of the light emitting element ED is connected may be maintained in a separated state, and an influence of the parasitic capacitance formed at the fourth node N4 may be reduced in a compensation operation. Thus, compensation stability may be improved.

During the data write period t3, the first scan signal GWi may have an activation level. During the data write period t3, the second scan signal GRi, the third scan signal GCi, the fourth scan signal Gli, and the emission control signal EMi may have an inactivation level.

During the data write period t3, the second transistor T2 may be turned on. The second transistor T2 may output a voltage corresponding to the data signal DS, and the data signal DS may be provided to the first node N1. The potential of the first node N1 may be changed from the reference voltage VREF to the data signal DS. For example, the voltage of the first node N1 may be raised from the reference voltage VREF to the data signal DS in response to a certain gray level. Alternatively, the voltage of the first node N1 may be lowered from the reference voltage VREF to the data signal DS in response to a black grayscale.

The data signal DS may be charged in the first capacitor C1. The threshold voltages Vth of the first transistors T1 of the respective pixels PX (refer to FIG. 1) may be different from one another, but the pixel PXij illustrated in FIG. 3 may supply a current proportional to the data signal DS to the light emitting element ED irrespective of the deviations of the threshold voltages Vth of the first transistors T1.

During the second initialization period t4, the fourth scan signal Gli may have an activation level. In this embodiment, the second initialization period t4 may correspond to a second period AP2_I (or, a first-second activation period) during which the fourth scan signal Gli has an activation level. During the second initialization period t4, the first scan signal GWi, the second scan signal GRi, the third scan signal GCi, and the emission control signal EMi may have an inactivation level. Unlike in the first initialization period t1, in the second initialization period t4, the second scan signal GRi may have an inactivation level, and only the fourth scan signal Gli may have an activation level.

During the second initialization period t4, the fifth transistor T5 and the eighth transistor T8 may be turned on. During the second initialization period t4, the second node N2 may be initialized to the first initialization voltage VINT, and the cathode CE of the light emitting element ED may be initialized to the second initialization voltage VAINT.

In this embodiment, as the eighth transistor T8 initializes the cathode CE of the light emitting element ED, the light emitting element ED may be prevented from instantaneously emitting light with high luminance due to the residual voltage remaining in the cathode CE of the light emitting element ED in the initial stage of operation of the light emitting element ED. The characteristics of a black grayscale may be prevented from being deteriorated, and a stain on the display surface DS (refer to FIG. 1) may be prevented from being visually recognized by the initialization voltage provided to the light emitting element ED at a low gray level. Accordingly, the pixel PXij (refer to FIG. 1) and the display device DD (refer to FIG. 1) with improved display quality may be provided. In one or more embodiments, the second initialization voltage VAINT may have the same voltage level (e.g., 13V) as the first drive voltage ELVDD. However, the present disclosure is not limited thereto.

In this embodiment, the fourth scan signal Gli may concurrently (e.g., simultaneously) control the fifth transistor T5 and the eighth transistor T8. Because the fifth transistor T5 and the eighth transistor T8 are capable of being turned on by the same scan signal, an operation of initializing the source of the first transistor T1 through the fifth transistor T5 and an operation of initializing the cathode CE of the light emitting element ED may be concurrently (e.g., simultaneously) performed. Accordingly, as compared with when separate scan lines are used to control the fifth transistor T5 and the eighth transistor T8, the number of scan lines connected to the pixel PXij may be decreased, and the configuration of the pixel circuit PXC or the configuration of the scan drive circuit 300 (refer to FIG. 1) for panel driving may be simplified. Thus, the area of the non-display region NDA (refer to FIG. 1) may be decreased, and the gap between lines included in the pixel PXij may be increased. As a result, signal interference between the lines may be reduced.

In this embodiment, because the second period AP2_I proceeds after the data write period t3, the second period AP2_I proceeds in a state in which the data signal DS is charged in the first capacitor C1. In this case, even though the first initialization voltage VINT is provided to the second node N2 by a turn-on operation of the fifth transistor T5, the difference voltage between the first node N1 and the second node N2 that is stored in the first capacitor C1 may not be varied as the first node N1 is set to a floating state. Accordingly, a drive current in the emission period may be determined by the gate-source voltage of the first transistor T1 that corresponds to the difference voltage stored in the first capacitor C1, and the drive current may also not be varied.

In one or more embodiments of the present disclosure, the second period AP2_I may have a shorter duration than the first period AP1_I. For example, the duration of the second period AP2_I may be set to be short such that the difference voltage stored in the first capacitor C1 is not varied. Accordingly, even after the second initialization period t4 has elapsed, the difference voltage stored in the first capacitor C1 may remain substantially constant (e.g., may remain constant) in response to the data signal DS. Thereafter, during the emission period t5, the emission control signal EMi may have an activation level. During the emission period t5, the first scan signal GWi, the second scan signal GRi, the third scan signal GCi, and the fourth scan signal Gli may have an inactivation level.

During the emission period t5, the sixth transistor T6 may be turned on, and the cathode CE of the light emitting element ED and the first transistor T1 may be electrically connected. In addition, during the emission period t5, the seventh transistor T7 may be turned on, and the first transistor T1 may be electrically connected with the second power line PL2. When the sixth transistor T6 and the seventh transistor T7 are turned on, the drive current may flow from the first drive voltage ELVDD to the second drive voltage ELVSS via the light emitting element ED, the sixth transistor T6, the first transistor T1, and the seventh transistor T7.

The drive current flowing through the light emitting element ED may be proportional to the square "$(Vgs\text{-}Vth)^2$" of the difference between the gate-source voltage Vgs of the first transistor T1 and the threshold voltage Vth of the first transistor T1. Because the gate voltage level of the first transistor T1 is "(DS+ELVSS−(VREF-Vth))" and the source voltage level of the first transistor T1 is the second drive voltage ELVSS, the current flowing through the light emitting element ED may be proportional to the square "(DS-VREF)$^2$" of the difference between the data signal DS and the reference voltage VREF.

According to the present disclosure, the threshold voltage Vth of the first transistor T1 may not affect the current flowing through the light emitting element ED. The threshold voltages of the first transistors T1 included in the respective pixels PX (refer to FIG. 1) may be different from one another depending on the characteristics of the first transistors T1. However, the current flowing through the light emitting element ED in the emission period t5 may be substantially constant (e.g., constant) irrespective of the characteristics of the first transistors T1 included in each of the pixels PX (refer to FIG. 1). That is, as the current flowing through the light emitting element ED is proportional to "(DS-VREF)$^2$", the pixels PX (refer to FIG. 1) and the display device DD (refer to FIG. 1) with improved display quality may be provided.

According to one or more embodiments of the present disclosure, the fourth scan signal Gli may be activated only during the first period AP1_I or AP1_I' and may provide only the first initialization period t1. That is, the second initialization period t4 may be omitted. The emission period t5 may proceed without a separate initialization period after the data write period t3.

Referring to FIGS. 3-4C, the holding frame HP may include a first initialization period t1_*h*, a second initialization period t4_*h*, and an emission period t5_*h*. The first initialization period t1_*h*, the second initialization period t4_*h*, and the emission period t5_*h* within the holding frame HP may be located at time points that correspond to the first initialization period t1, the second initialization period t4, and the emission period t5 within the write frame WP described above with reference to FIG. 4A.

Within the holding frame HP, the fourth scan signal Gli may have an activation level during a first period AP1_Ih and a second period AP2_Ih. Within the holding frame HP, the first scan signal GWi, the second scan signal GRi, the third scan signal GCi, and the emission control signal EMi may all have an inactivation level in the remaining periods other than the emission period t5_*h*. That is, within the holding frame HP, only the fourth scan signal Gli may have an activation level in the remaining periods other than the emission period t5_*h*.

The first period AP1_Ih and the second period AP2_Ih within the holding frame HP may be located at the time points that correspond to the first period AP1_I and the second period AP2_I within the write frame WP described above with reference to FIG. 4A. That is, according to this embodiment, the fourth scan signal Gli may be activated according to a fixed period even in a low-frequency operation, and the cathode CE of the light emitting element ED may also be initialized according to a fixed period. Accordingly, a change in the drive current within the holding frame HP may be reduced or minimized, and a flicker phenomenon may be prevented from occurring due to a luminance deviation caused by a current deviation.

The emission period t5_*h* within the holding frame HP may be driven in the same manner as the emission period t5 within the write frame WP. During the emission period t5_*h* within the holding frame HP, the sixth transistor T6 and the seventh transistor T7 may be turned on, and the drive current may flow from the first drive voltage ELVDD to the second drive voltage ELVSS via the light emitting element ED, the sixth transistor T6, the first transistor T1, and the seventh transistor T7.

According to one or more embodiments of the present disclosure, the first initialization period t1_*h* and the second initialization period t4_*h* may be omitted within the holding frame HP. That is, the scan signals may all have an inactive state in the remaining periods other than the emission period t5_*h* within the holding frame HP.

Figure 5A:
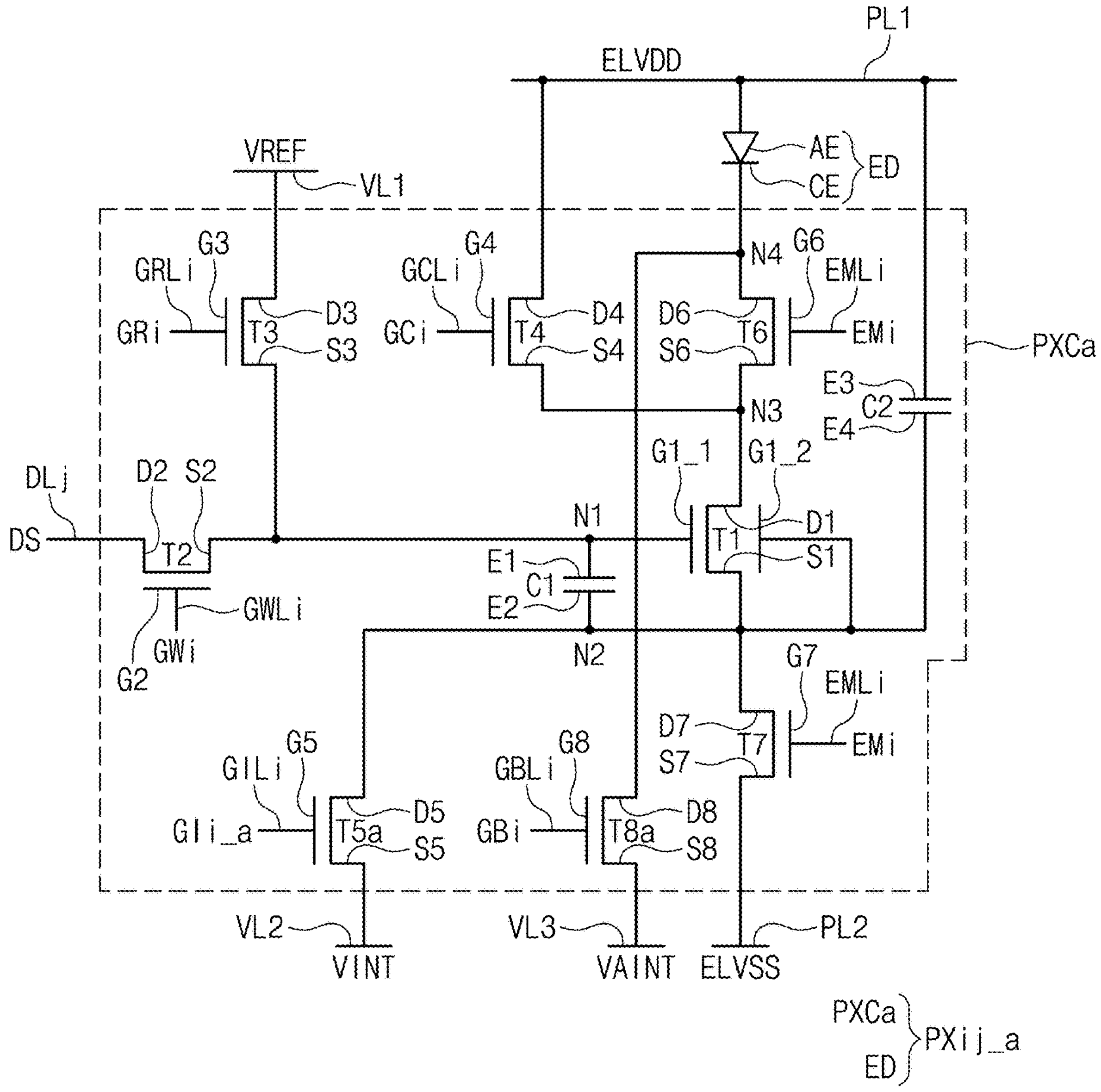
FIG. 5A is a circuit diagram of a pixel according to one or more embodiments of the present disclosure.
Figure 5B:
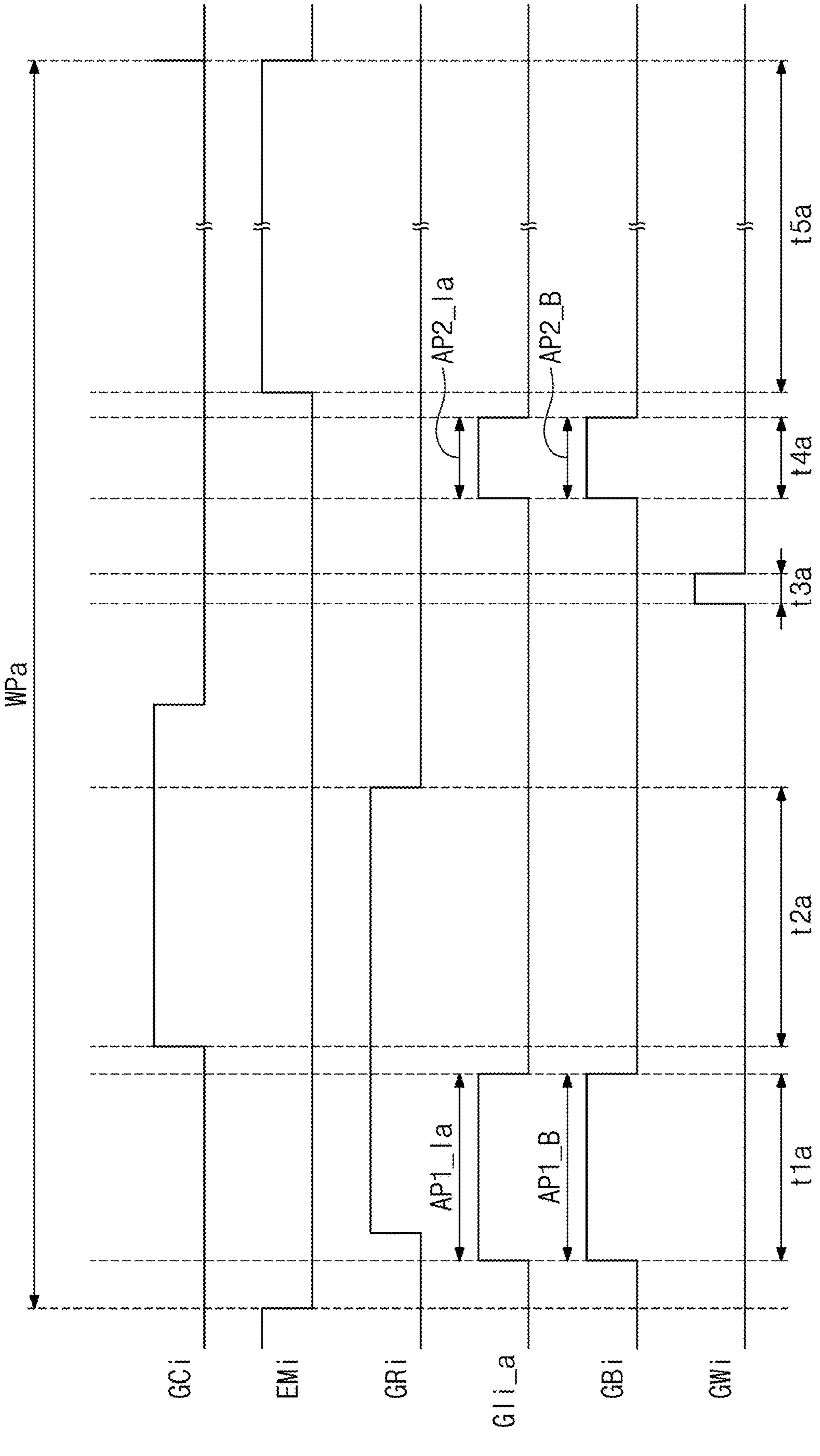
FIGS. 5B and 5C are timing diagrams for explaining the operation of the pixel of FIG. 5A according to one or more embodiments of the present disclosure.
Figure 5C:
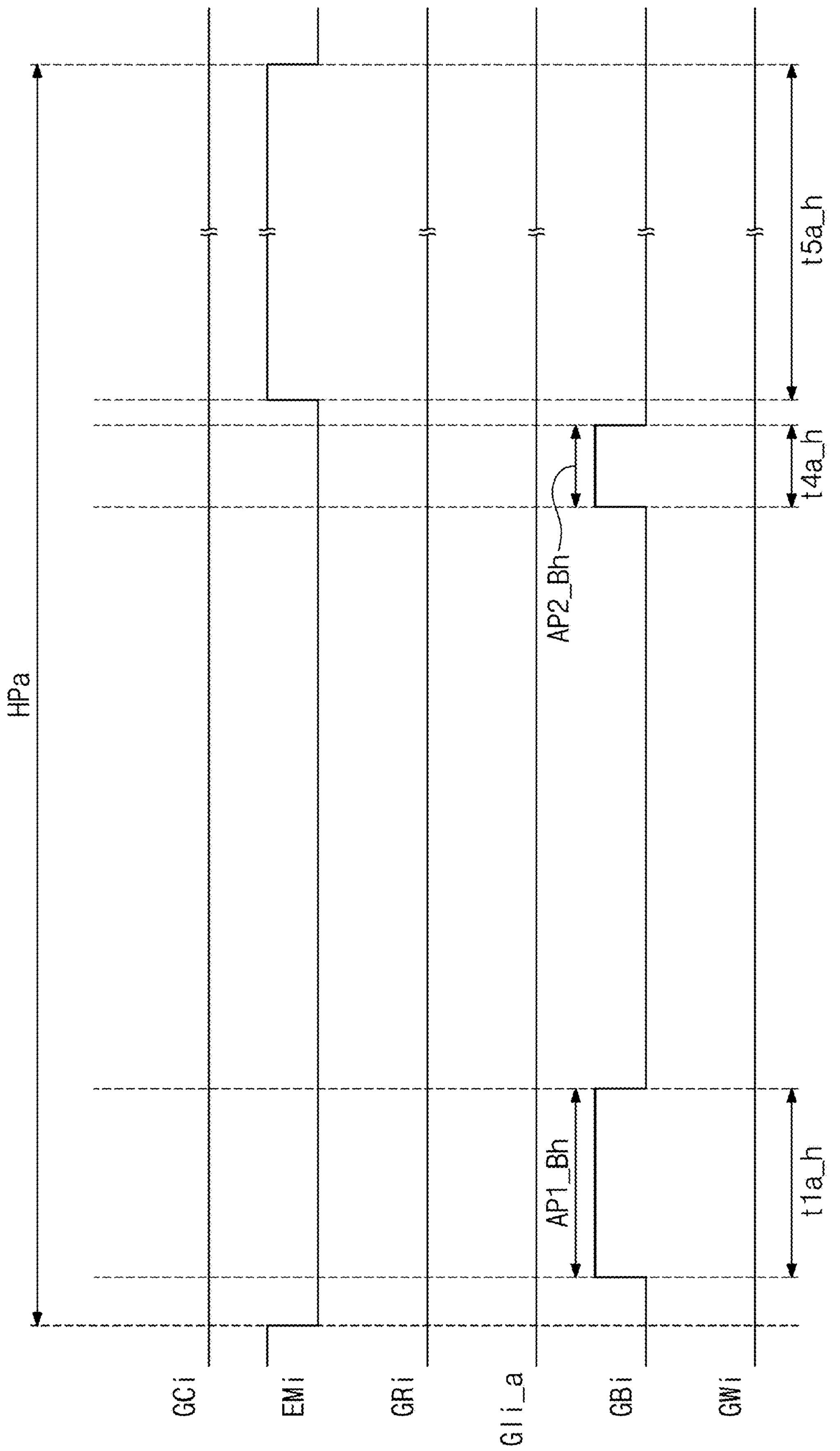

FIG. 5A is a circuit diagram of a pixel PXij_a according to one or more embodiments of the present disclosure. FIGS. 5B and 5C are timing diagrams for explaining operation of the pixel PXij_a of FIG. 5A according to one or more embodiments of the present disclosure. Among the components illustrated in FIG. 5A, the components identical to the components illustrated in FIG. 3 will be assigned with identical reference numerals, and specific descriptions thereabout will be omitted.

Referring to FIGS. 5A-5C, the pixel PXij_a according to one or more embodiments include a pixel circuit PXCa and a light emitting element ED. In this embodiment, the pixel circuit PXCa may include eight transistors T1 to T4, T5*a*, T6, T7, and T8*a* and two capacitors C1 and C2.

In this embodiment, the display panel DP (refer to FIG. 1) may further include fifth scan lines that output fifth scan signals. FIG. 5A illustrates an example that the pixel PXij_a is connected with the i-th fifth scan line GBLi outputting the i-th fifth scan signal GBi from among the fifth scan lines.

The eighth transistor T8*a* may be connected between a second initialization voltage line VL3 and a cathode CE of the light emitting element ED and may receive the i-th fifth scan signal GBi. A gate electrode G8 of the eighth transistor T8*a* may be connected to the i-th fifth scan line GBLi. That is, the eighth transistor T8*a* may receive a scan signal different from the scan signal that the fifth transistor T5*a* receives, and the fifth transistor T5*a* and the eighth transistor T8*a* may be independently controlled.

As illustrated in FIG. 5B, a write frame WPa may include a first initialization period t1*a*, a compensation period t2*a*, a data write period t3*a*, a second initialization period t4*a*, and an emission period t5*a*.

According to this embodiment, the fifth scan signal GBi may have an activation level during a first period AP1_B and a second period AP2_B in the write frame WPa. The first period AP1_B may be located before the data write period t3*a*, and the second period AP2_B may be located after the data write period t3*a*. In this embodiment, the first initialization period t1*a* may correspond to the first period AP1_B during which the fifth scan signal GBi has an activation level, and the second initialization period t4*a* may correspond to the second period AP2_B during which the fifth scan signal GBi has an activation level. The fifth scan signal GBi may have an inactivation level during the compensation period t2*a*, the data write period t3*a*, and the emission period t5*a*. An initialization operation of the cathode CE may be performed during the first initialization period t1*a* and the second initialization period t4*a*.

The fifth scan signal GBi may have an activation level during a first period AP1_Bh and a second period AP2_Bh in a holding frame HPa. The first period AP1_Bh and the second period AP2_Bh within the holding frame HPa may be located at the time points that correspond to the first period AP1_B and the second period AP2_B within the write frame WPa. That is, according to this embodiment, the fifth scan signal GBi may be activated according to a fixed period even in a low-frequency operation, and the cathode CE of the light emitting element ED may also be initialized according to a fixed period. Accordingly, a change in a drive current within the holding frame HPa may be reduced or minimized, and a flicker phenomenon may be prevented from occurring (e.g., may be reduced) due to a current deviation.

According to this embodiment, the fourth scan signal GIi_a may be activated during a first period AP1_Ia and a second period AP2_Ia in the write frame WPa, and the first period AP1_Ia and the second period AP2_Ia during which the fourth scan signal GIi_a is activated may overlap the first period AP1_B and the second period AP2_B during which the fifth scan signal GBi is activated. That is, the fourth scan signal GIi_a may have an activation level in the first initialization period t1*a* and the second initialization period t4*a*.

According to one or more embodiments of the present disclosure, a period during which the fourth scan signal GIi_a is activated in the write frame WPa may overlap only the first period AP1_B during which the fifth scan signal GBi is activated and may not overlap the second period AP2_B during which the fifth scan signal GBi is activated. That is, the fourth scan signal GIi_a may be activated only during the first initialization period t1*a* and may be deactivated during the second initialization period t4*a*. Accordingly, only the initialization operation of the cathode CE of the light emitting element ED may be performed during the second initialization period t4*a*. Thus, an initialization operation of a source S1 of the first transistor T1 may be performed during the first initialization period t1*a* before the data write period t3*a* and may not be performed after the data write period t3*a*. That is, because the fifth transistor T5*a* and the eighth transistor T8*a* are independently controlled, a separate initialization voltage may not be provided to a first node N1 after the data write period t3*a*, and even after the second initialization period t4*a* has elapsed, a difference voltage stored in the first capacitor C1 may remain substantially constant (e.g., may remain constant) in response to a data signal DS.

The fourth scan signal GIi_a may be deactivated in the holding frame HPa. That is, in this embodiment, only the initialization operation of the cathode CE of the light emitting element ED may be performed during a first initialization period t1*a*_h and a second initialization period t4*a*_h within the holding frame HPa. Because the flicker phenomenon is capable of being prevented by reducing or minimizing a change in the drive current only by the initialization operation of the cathode CE in the holding frame HPa, power consumption may be reduced by maintaining the fourth scan signal GIi_a at an inactivation level in the holding frame HPa.

Figure 6A:
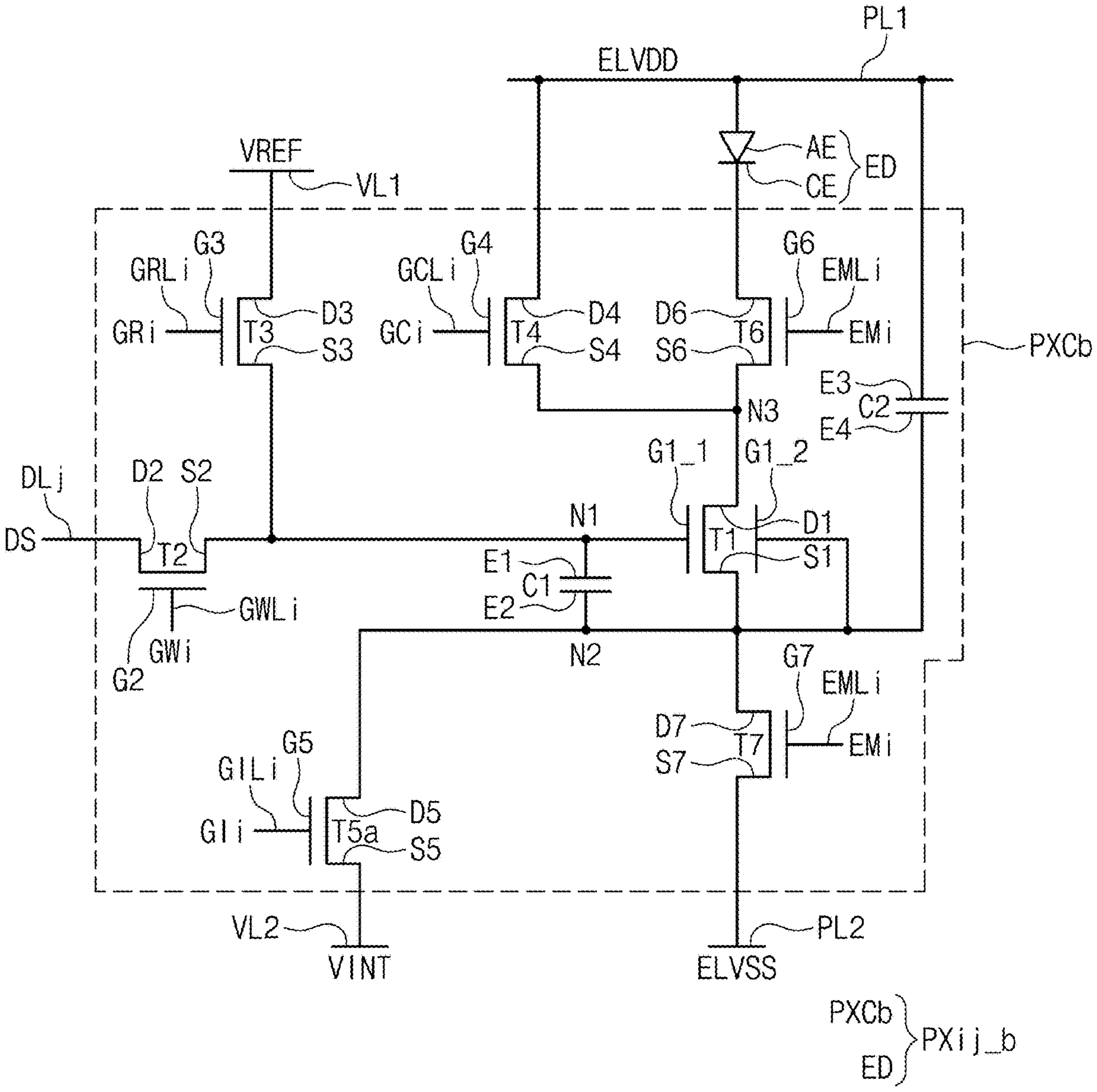
FIG. 6A is a circuit diagram of a pixel according to one or more embodiments of the present disclosure.

FIG. 6A is a circuit diagram of a pixel PXij_b according to one or more embodiments of the present disclosure. Among the components illustrated in FIG. 6A, the components identical to the components illustrated in FIG. 3 will be assigned with identical reference numerals, and specific descriptions thereabout will be omitted.

Referring to FIG. 6A, the pixel PXij_b according to one or more embodiments of the present disclosure includes a pixel circuit PXCb and a light emitting element ED. In this embodiment, the pixel circuit PXCb may include seven transistors T1 to T7 and two capacitors C1 and C2. That is, unlike in the embodiment described with reference to FIG. 3, a transistor (that is, the eighth transistor T8 (refer to FIG. 3)) that provides an initialization voltage to a cathode CE of the light emitting element ED may be omitted in this embodiment. Accordingly, the configuration of the pixel circuit PXCb may be simplified, and thus the degree of freedom in the design of the pixel circuit PXCb may be increased. In addition, a separate initialization voltage line (that is, the second initialization voltage line VL3 (refer to FIG. 3)) for providing the initialization voltage to the cathode CE may be omitted. Accordingly, the area of the non-display region NDA (refer to FIG. 1) may be decreased, and the gap between lines connected to the pixel PXij_b may be increased. Thus, signal interference between the lines may be reduced.

In one or more embodiments of the present disclosure, the fourth scan signal GIi may operate as described above with reference to FIGS. 5B and 5C. That is, the fourth scan signal GIi may have an activation level during the first initialization period t1*a* (refer to FIG. 5B) and the second initialization period t4*a* (refer to FIG. 5B) within the write frame (refer to FIG. 5B) and may have an inactivation level within the holding frame HPa (refer to FIG. 5C). Alternatively, the fourth scan signal GIi may have an activation level only during the first initialization period t1*a* (refer to FIG. 5B) within the write frame WPa (refer to FIG. 5B).

Figure 6B:
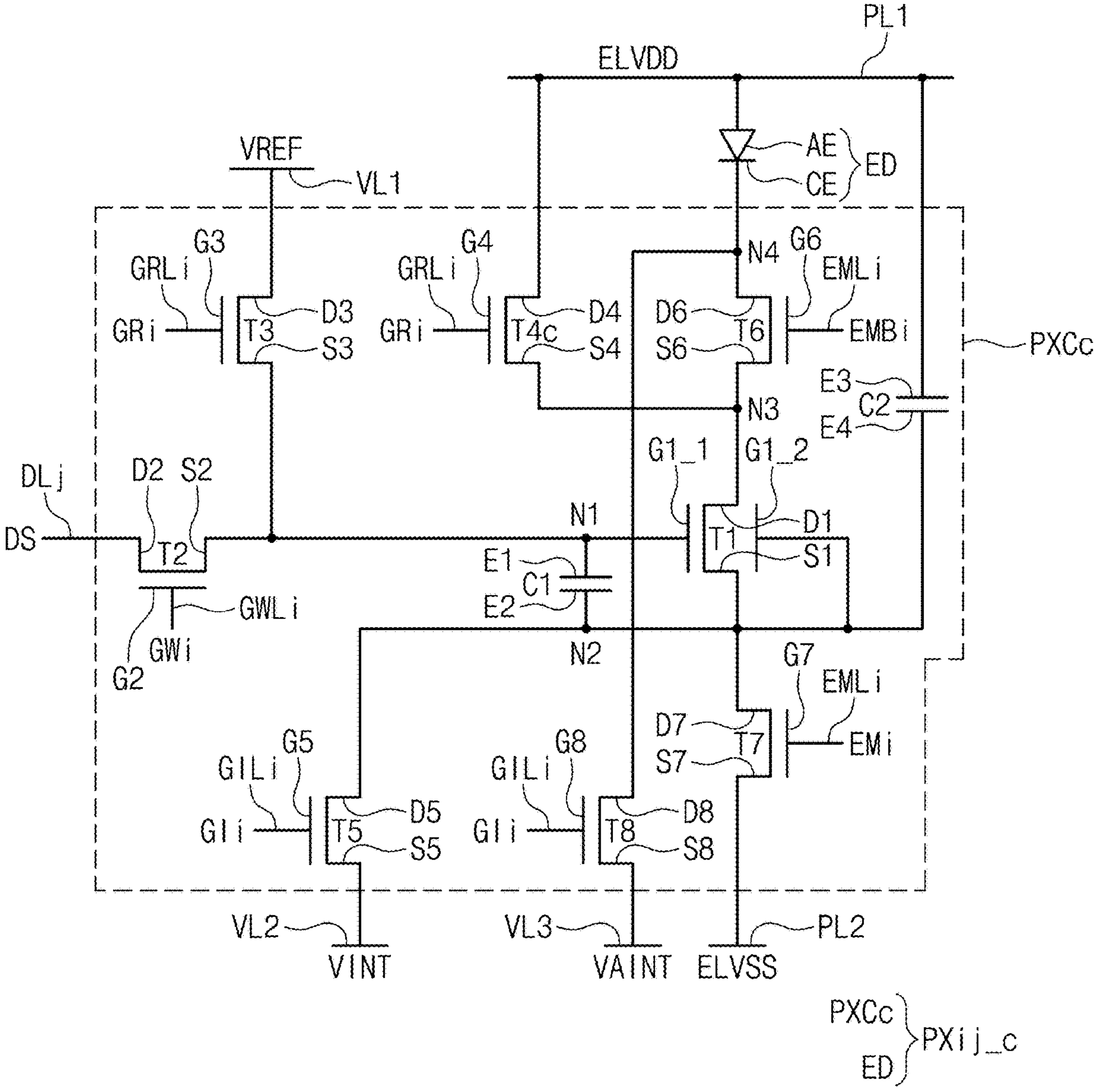
FIG. 6B is a circuit diagram of a pixel according to one or more embodiments of the present disclosure.

FIG. 6B is a circuit diagram of a pixel PXij_c according to one or more embodiments of the present disclosure. Among the components illustrated in FIG. 6B, the components identical to the components illustrated in FIG. 3 will be assigned with identical reference numerals, and specific descriptions thereabout will be omitted.

Referring to FIG. 6B, the pixel PXij_c according to one or more embodiments of the present disclosure includes a pixel circuit PXCc and a light emitting element ED. In this embodiment, the pixel circuit PXCc may include eight transistors T1 to T3, T4*c*, and T5 to T8 and two capacitors C1 and C2. In this embodiment, the third scan lines GCL1 to GCLn (refer to FIG. 1) that output the third scan signals may be omitted. As illustrated in FIG. 6B, the fourth transistor T4*c* may receive the i-th second scan signal GRi. A gate electrode G4 of the fourth transistor T4*c* may be connected to the i-th second scan line GRLi. That is, the fourth transistor T4*c* may receive the same scan signal as the third transistor T3, and the third transistor T3 and the fourth transistor T4*c* may be concurrently (e.g., simultaneously) controlled.

According to this embodiment, as compared with when separate scan lines are used to control the third transistor T3 and the fourth transistor T4*c*, the number of scan lines may be decreased, and the configuration of the pixel circuit PXCc or the configuration of the scan drive circuit 300 (refer to FIG. 1) for panel driving may be simplified. Accordingly, the area of the non-display region NDA (refer to FIG. 1) may be decreased, and the gap between lines connected to the pixel PXij_c may be increased. Thus, signal interference between the lines may be reduced.

In one or more embodiments of the present disclosure, the second scan signal GRi may operate as described above with reference to FIGS. 4A-4C. That is, the second scan signal GRi may have an activation level during the first initialization period t1 (refer to FIG. 4A) and the compensation period t2 (refer to FIG. 4A) within the write frame WPa (refer to FIG. 5B) and may have an inactivation level within the holding frame HP (refer to FIG. 4B).

Figure 6C:
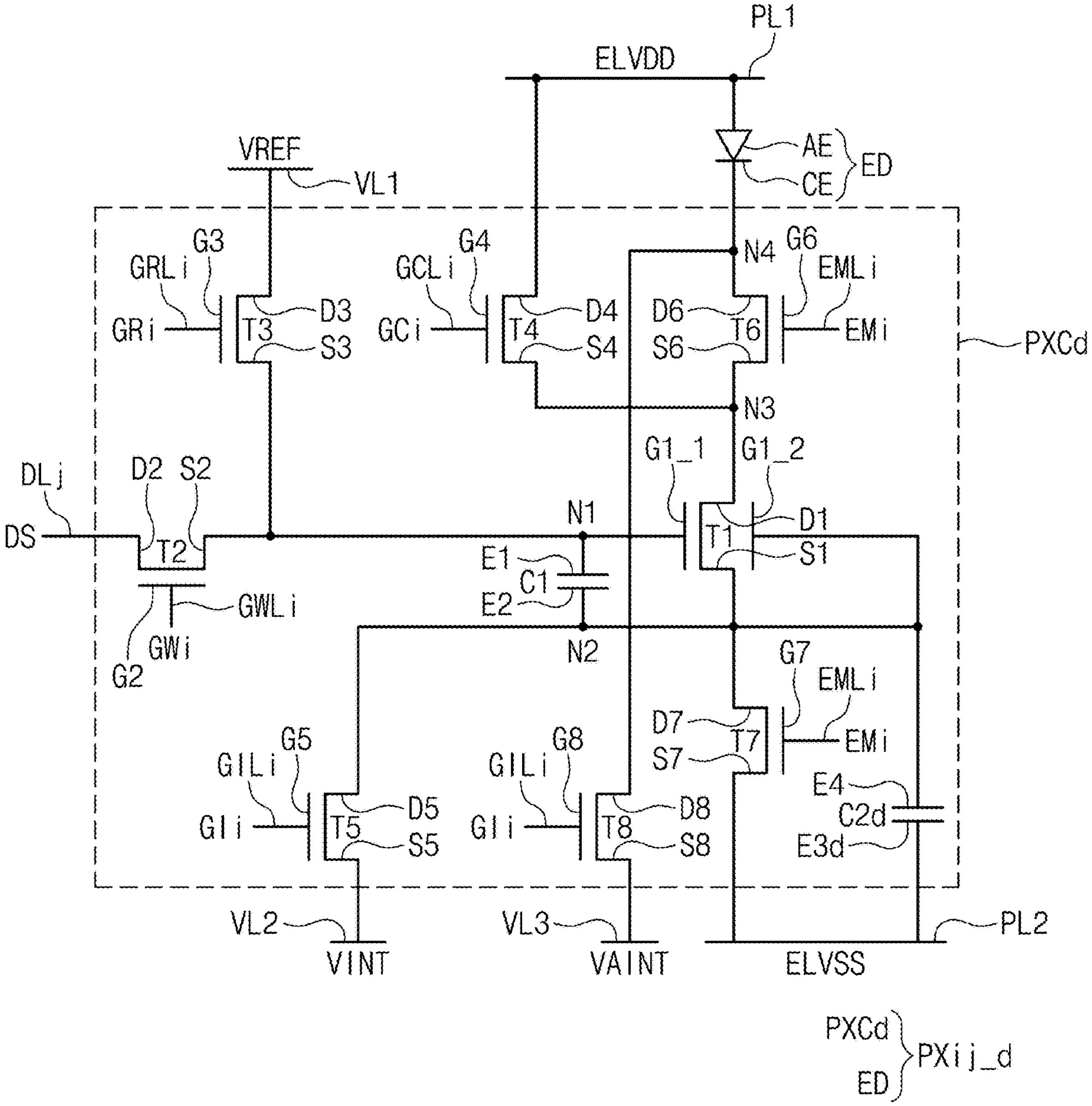
FIG. 6C is a circuit diagram of a pixel according to one or more embodiments of the present disclosure.

FIG. 6C is a circuit diagram of a pixel PXij_d according to one or more embodiments of the present disclosure. From among the components illustrated in FIG. 6C, the components identical to the components illustrated in FIG. 3 will be assigned with identical reference numerals, and specific descriptions thereabout will be omitted.

Referring to FIG. 6C, the pixel PXij_d according to one or more embodiments of the present disclosure includes a pixel circuit PXCd and a light emitting element ED. In this embodiment, the pixel circuit PXCd may include eight transistors T1 to T8 and two capacitors C1 and C2*d*.

According to this embodiment, the second capacitor C2*d* may be connected between a second power line PL2 and a second node N2. The second capacitor C2*d* may include a first electrode E3*d* connected to the second power line PL2 and a second electrode E4 connected to the second node N2. Accordingly, in this embodiment, the second capacitor C2*d* may store a difference voltage between the second drive voltage ELVSS and the second node N2.

Figure 7A:
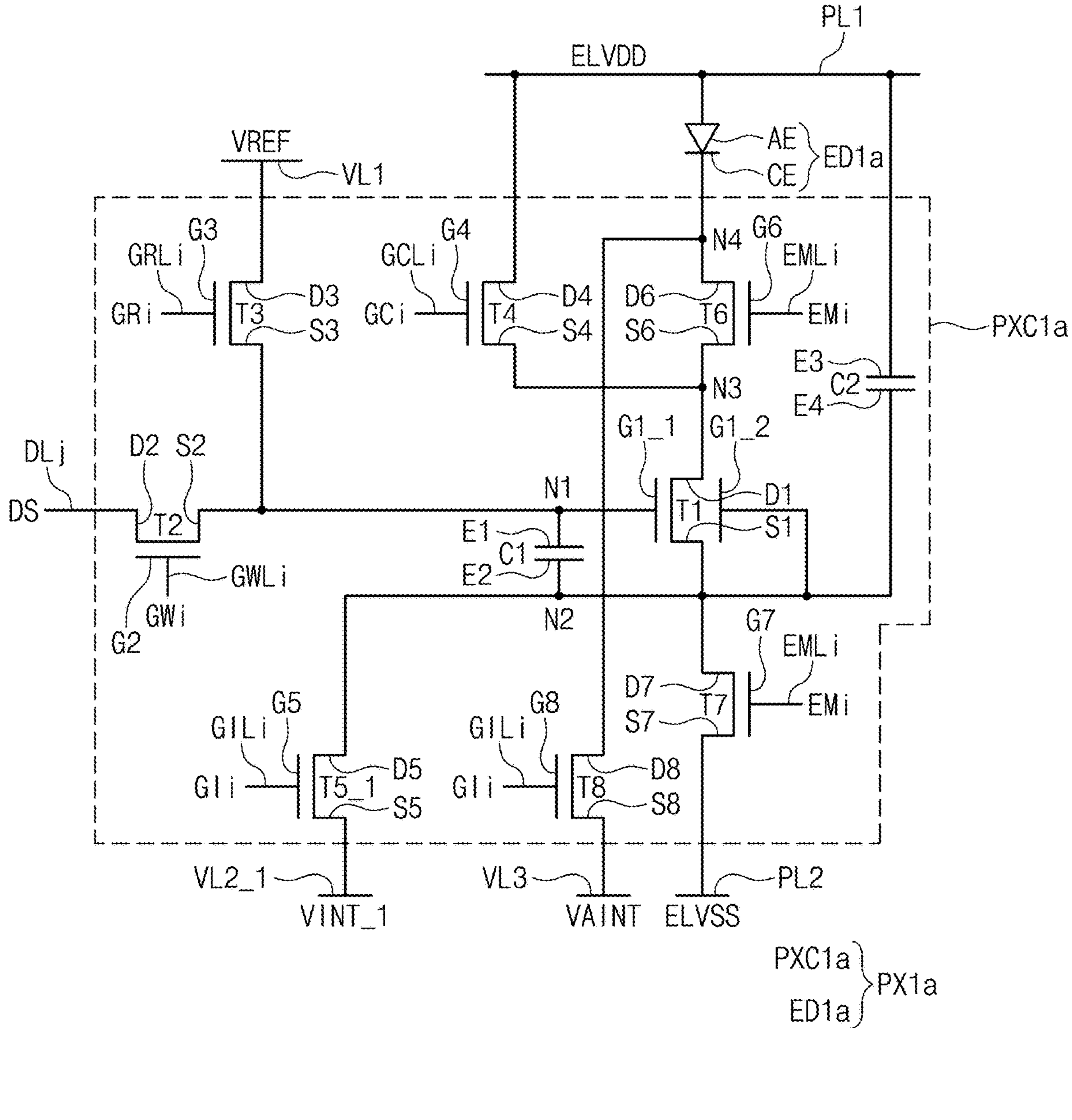
FIGS. 7A and 7B are circuit diagrams of pixels according to one or more embodiments of the present disclosure.
Figure 7B:
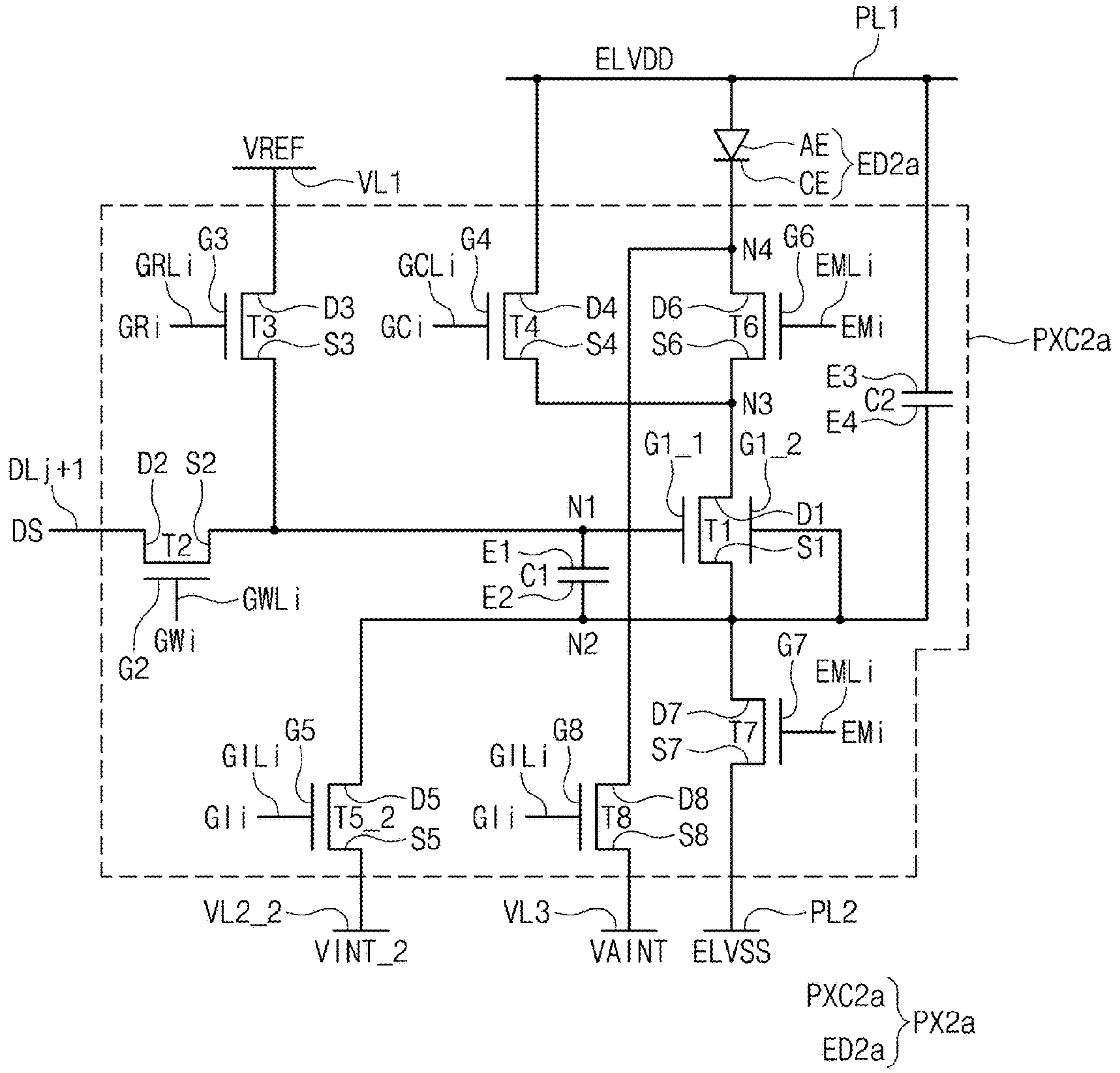

FIGS. 7A and 7B are circuit diagrams of pixels PX1*a* and PX2*a* according to one or more embodiments of the present disclosure.

FIG. 7A illustrates the pixel PX1*a* (hereinafter, referred to as the first pixel PX1*a*) connected to the i-th first scan line GWLi and the j-th data line DLj, and FIG. 7B illustrates the pixel PX2*a* (hereinafter, referred to as the second pixel PX2*a*) connected to the i-th first scan line GWLi and the (j+1)th data line DLj+1. The first pixel PX1*a* and the second pixel PX2*a* are illustrated as being disposed in the same row. The first pixel PX1*a* and the second pixel PX2*a* may be commonly connected to the i-th first scan line GWLi, the i-th second scan line GRLi, the i-th third scan line GCLi, the i-th fourth scan line GILi, and the i-th emission control line EMLi.

The first pixel PX1*a* may include a first pixel circuit PXC1*a* and a first light emitting element ED1*a* electrically connected to the first pixel circuit PXC1*a*. The second pixel PX2*a* may include a second pixel circuit PXC2*a* and a second light emitting element ED2*a* electrically connected to the second pixel circuit PXC2*a*. The first light emitting element ED1*a* and the second light emitting element ED2*a* may provide light of different colors. For example, the first light emitting element ED1*a* may provide light of a first color, for example, one of red light, blue light, and/or green light, and the second light emitting element ED2*a* may provide light of a second color, for example, another one of red light, blue light, and/or green light.

A fifth transistor T5_1 included in the first pixel circuit PXC1*a* may be connected to a first-first initialization voltage line VL2_1. The first-first initialization voltage line VL2_1 may receive a first-first initialization voltage VINT_1. A fifth transistor T5_2 included in the second pixel circuit PXC2*a* may be connected to a first-second initialization voltage line VL2_2. The first-second initialization voltage line VL2_2 may receive a first-second initialization voltage VINT_2. The first-second initialization voltage VINT_2 may have a voltage level different from that of the first-first initialization voltage VINT_1. That is, according to this embodiment, the initialization voltage VINT_1 provided to a source S1 of a first transistor T1 in the first pixel circuit PXC1*a* and the initialization voltage VINT_2 provided to a source S1 of a first transistor T1 in the second pixel circuit PXC2*a* may be independently provided depending on the characteristics of the light emitting elements ED1*a* and ED2*a*.

Figure 8A:
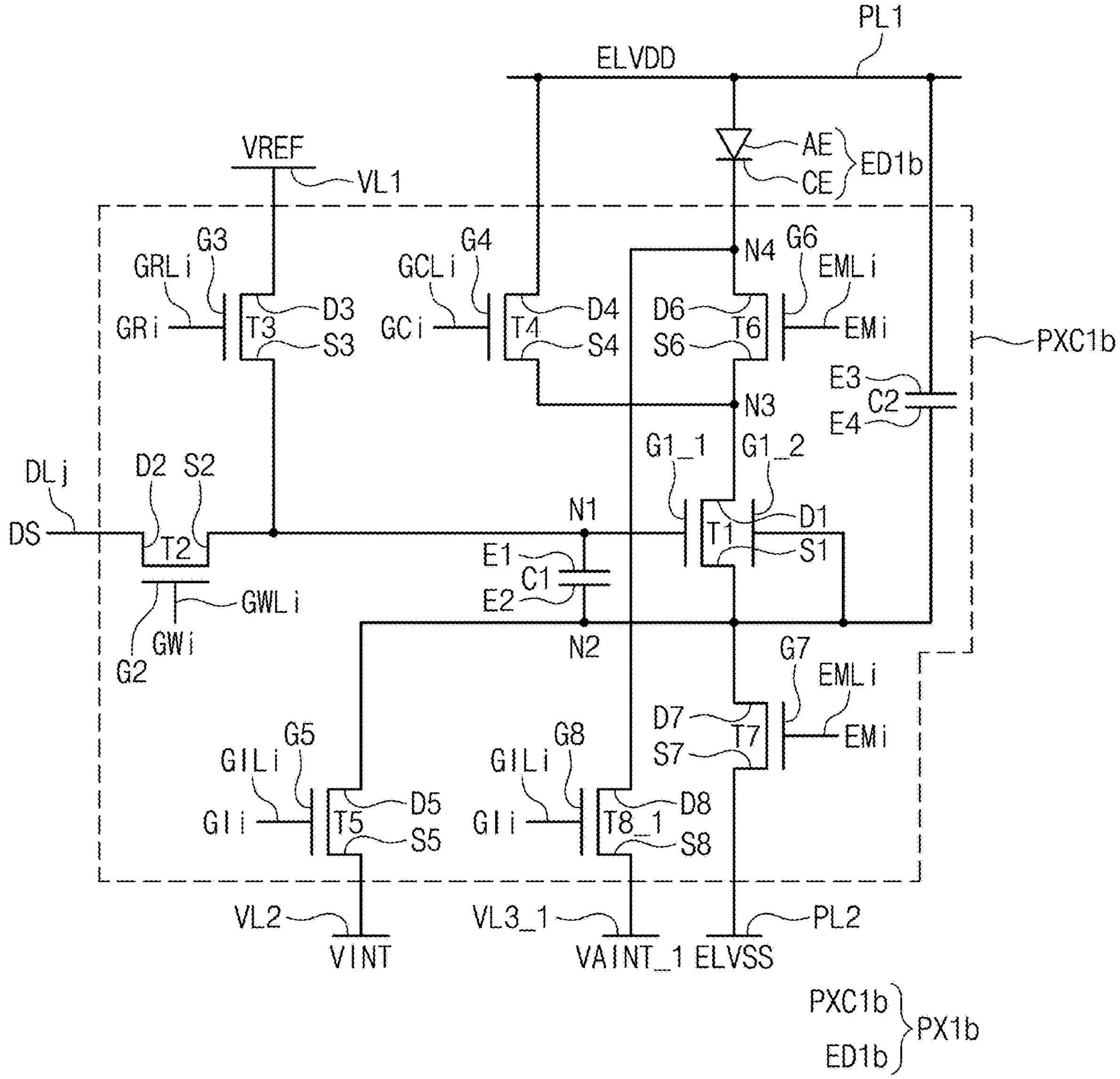
FIGS. 8A and 8B are circuit diagrams of pixels according to one or more embodiments of the present disclosure.
Figure 8B:
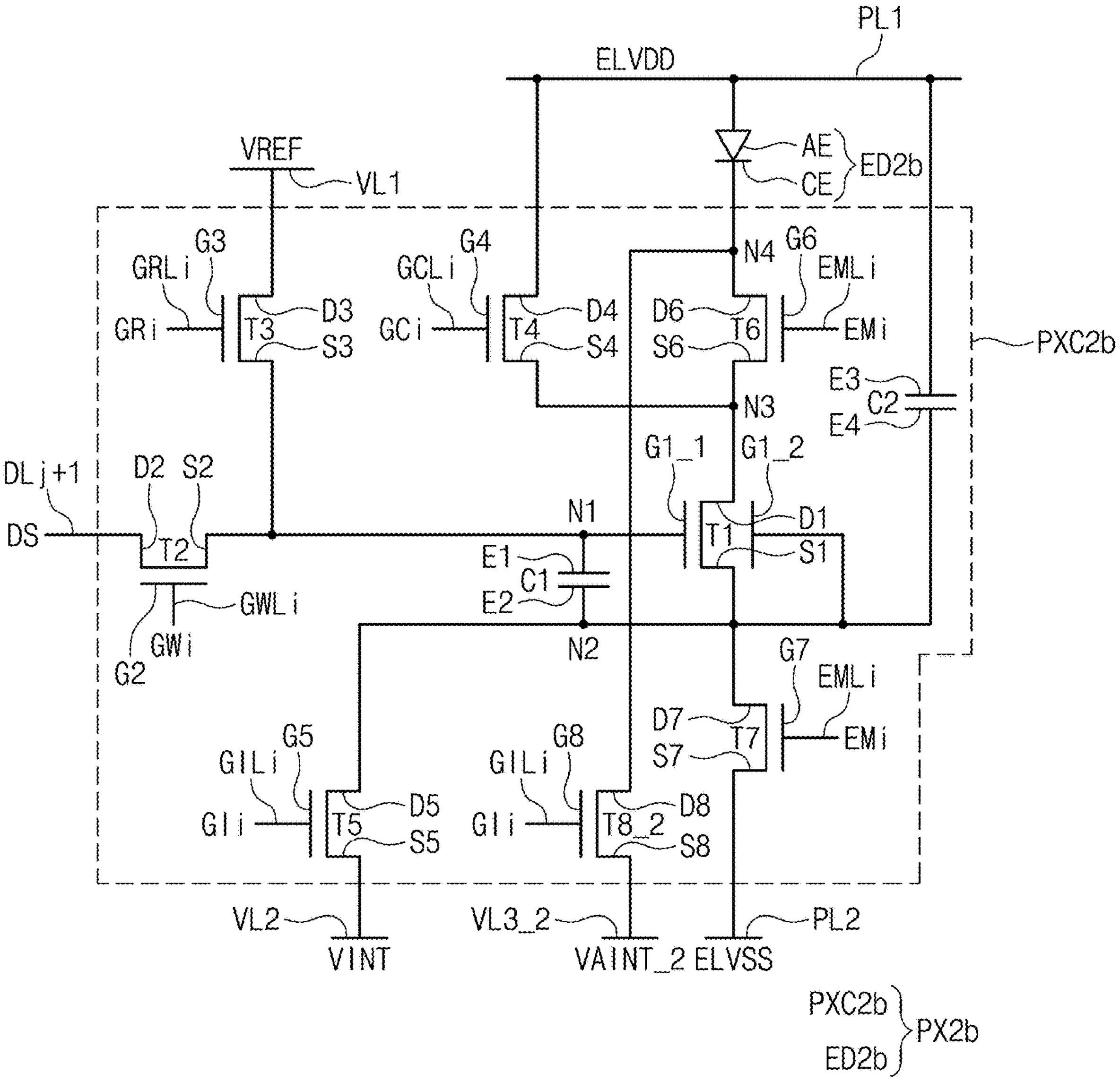

FIGS. 8A and 8B are circuit diagrams of pixels PX1*b* and PX2*b* according to one or more embodiments of the present disclosure.

FIG. 8A illustrates the pixel PX1*b* (hereinafter, referred to as the first pixel PX1*b*) connected to the i-th first scan line GWLi and the j-th data line DLj, and FIG. 8B illustrates the pixel PX2*b* (hereinafter, referred to as the second pixel PX2*b*) connected to the i-th first scan line GWLi and the (j+1)th data line DLj+1. The first pixel PX1*b* and the second pixel PX2*b* are illustrated as being disposed in the same row. The first pixel PX1*b* and the second pixel PX2*b* may be commonly connected to the i-th first scan line GWLi, the i-th second scan line GRLi, the i-th third scan line GCLi, the i-th fourth scan line GILi, and the i-th emission control line EMLi.

The first pixel PX1*b* may include a first pixel circuit PXC1*b* and a first light emitting element ED1*b* electrically connected to the first pixel circuit PXC1*b*. The second pixel PX2*b* may include a second pixel circuit PXC2*b* and a second light emitting element ED2*b* electrically connected to the second pixel circuit PXC2*b*. The first light emitting element ED1*b* and the second light emitting element ED2*b* may provide light of different colors. For example, the first light emitting element ED1*b* may provide light of a first color, for example, one of red light, blue light, and/or green light, and the second light emitting element ED2*b* may provide light of a second color, for example, another one of red light, blue light, and/or green light.

An eighth transistor T8_1 included in the first pixel circuit PXC1*b* may be connected to a second-first initialization voltage line VL3_1. The second-first initialization voltage line VL3_1 may receive a second-first initialization voltage VAINT_1. An eighth transistor T8_2 included in the second pixel circuit PXC2*b* may be connected to a second-second initialization voltage line VL3_2. The second-second initialization voltage line VL3_2 may receive a second-second initialization voltage VAINT_2. The second-second initialization voltage VAINT_2 may have a voltage level different from that of the second-first initialization voltage VAINT_1. That is, according to this embodiment, the initialization voltage VAINT_1 provided to a cathode CE of the light emitting element ED1*b* in the first pixel circuit PXC1*b* and the initialization voltage VAINT_2 provided to a cathode CE of the light emitting element ED2*b* in the second pixel circuit PXC2*b* may be independently provided depending on the characteristics of the light emitting elements ED1*b* and ED2*b*.

For example, different amounts of parasitic capacitance may be formed in the light emitting elements ED1*b* and ED2*b* that provide light of different colors. According to one or more embodiments, the second-first and second-second initialization voltages VAINT_1 and VAINT_2 having different levels may be provided to the cathode CE of the first light emitting element ED1*b* and the cathode CE of the second light emitting element ED2*b*, respectively, to reflect the parasitic capacitance formed in the first light emitting element ED1*b*, which provides the light of the first color, and the parasitic capacitance formed in the second light emitting element ED2*b*, which provides the light of the second color. Accordingly, the gradation may be improved, and the ability to express a changed color may also be improved. Thus, the display device DD (refer to FIG. 1) with improved display quality may be provided.

Figure 9A:
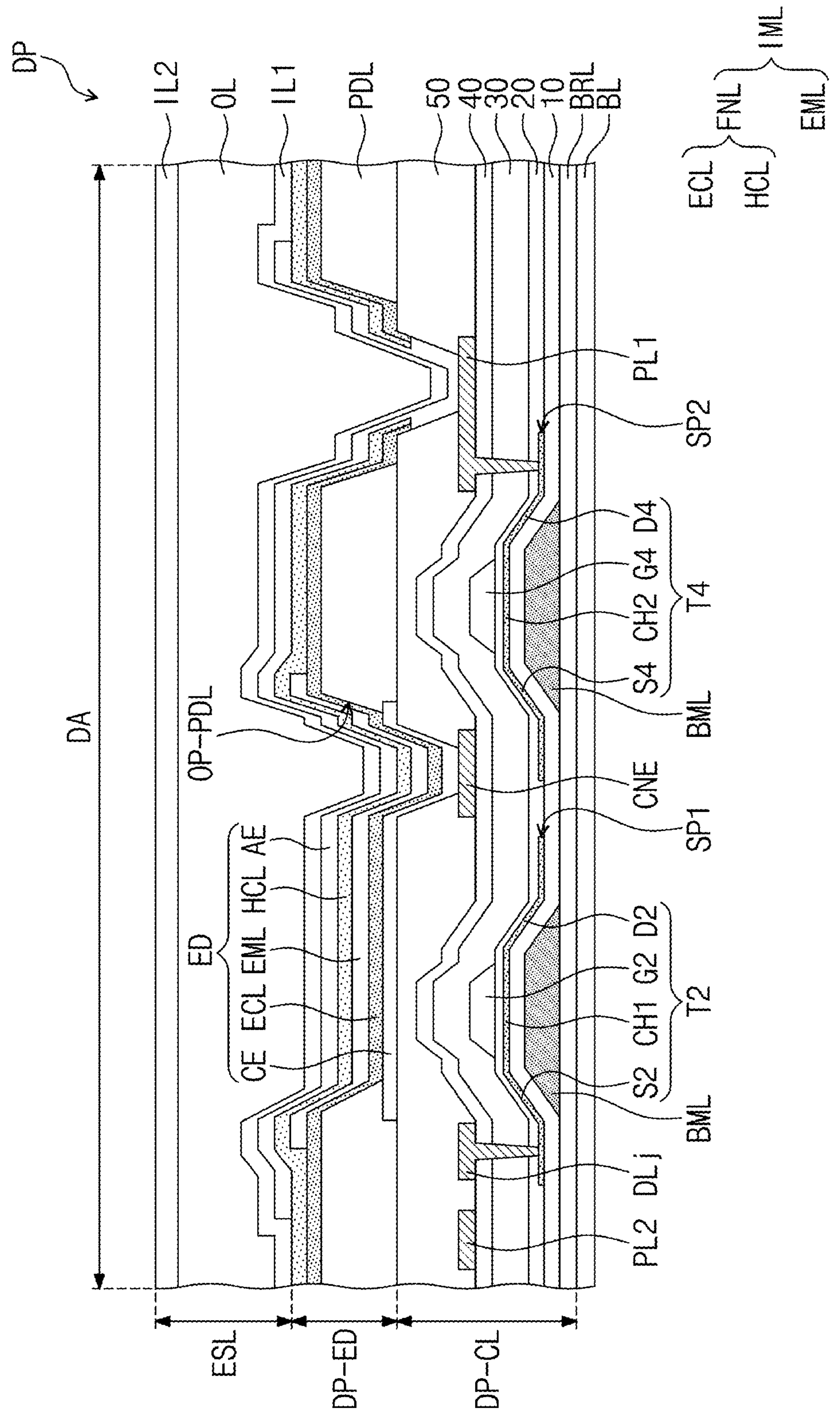
FIGS. 9A and 9B are sectional views of display panels according to one or more embodiments of the present disclosure.
Figure 9B:
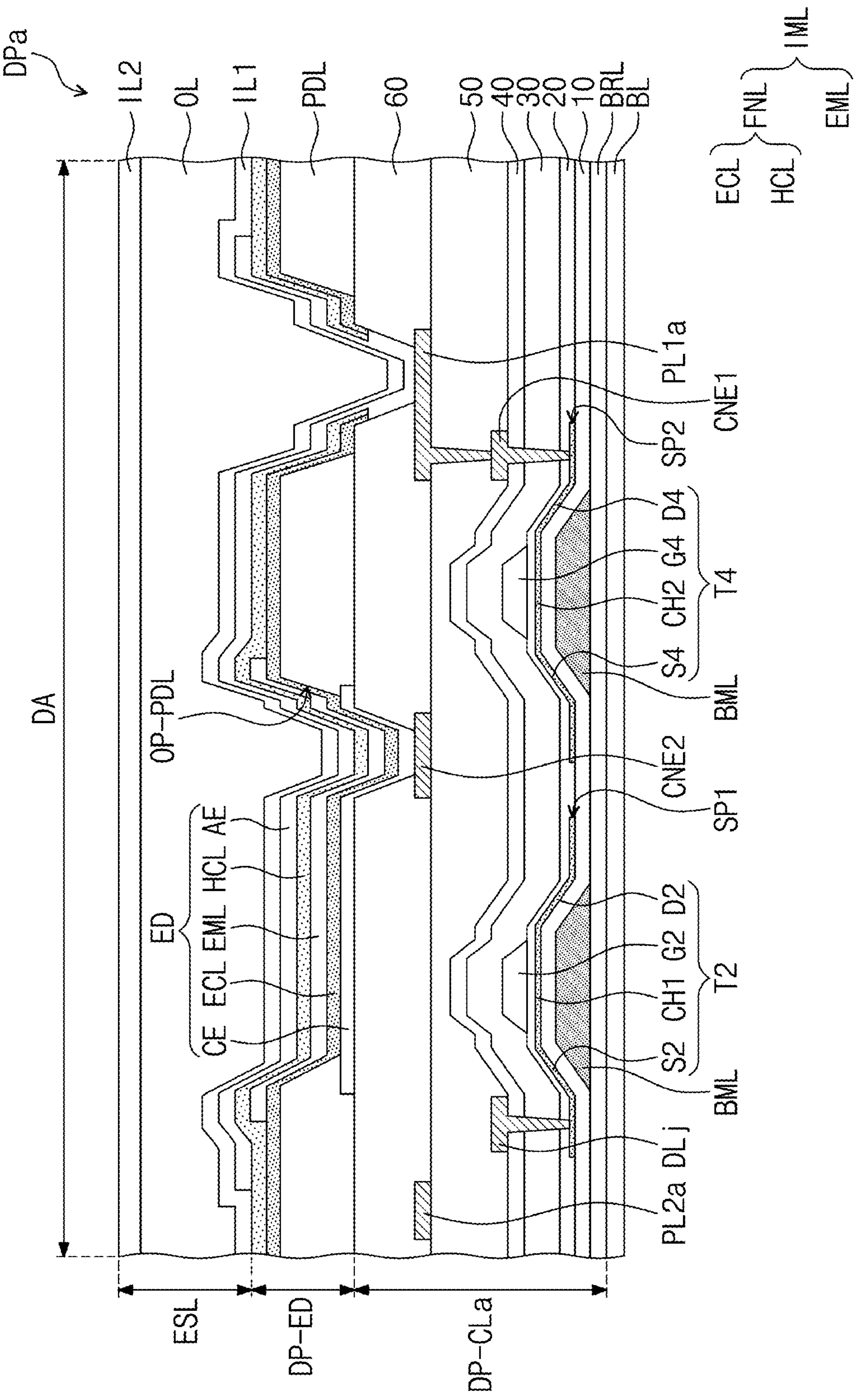
Figure 10:
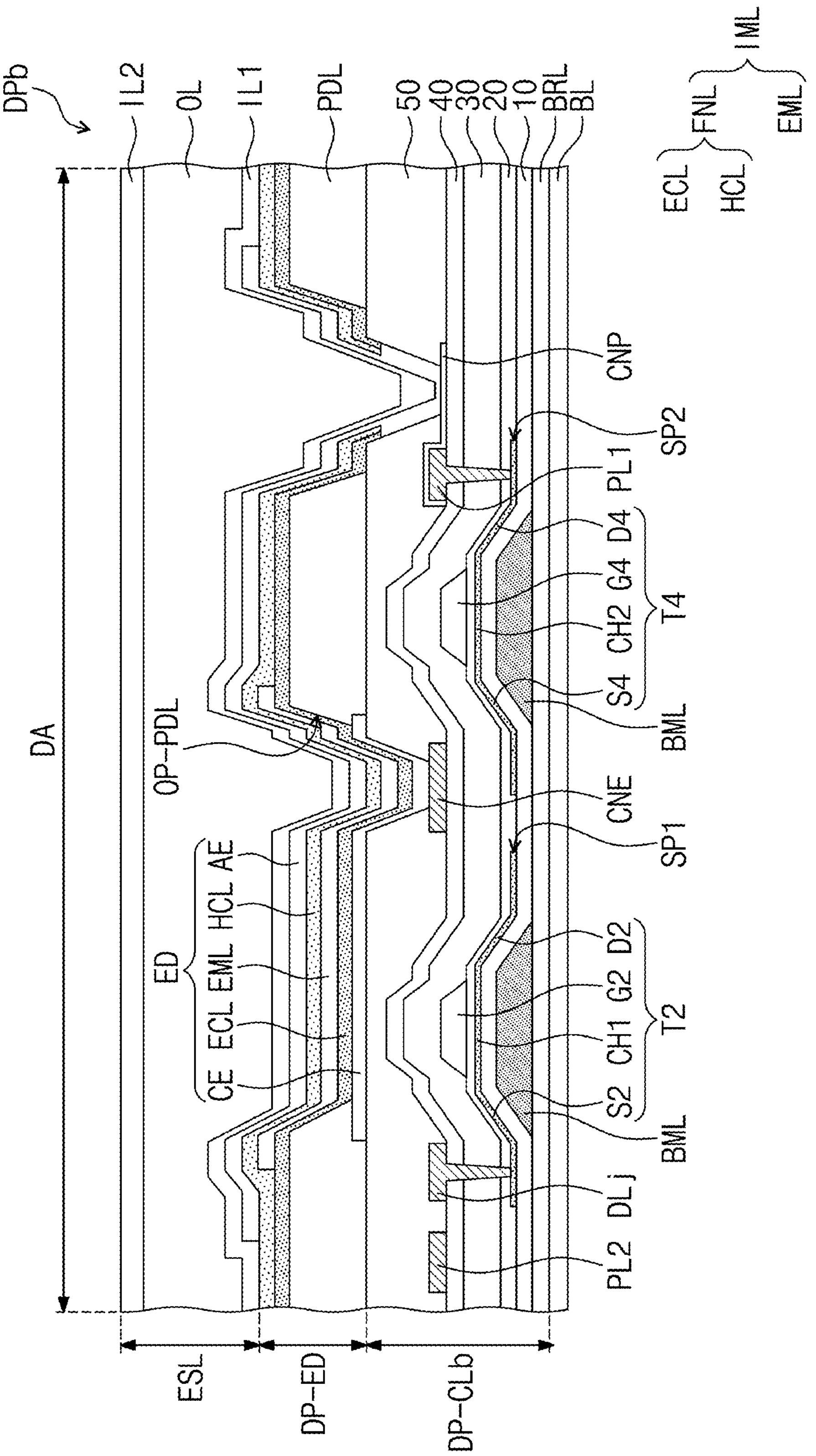
FIG. 10 is a sectional view of a display panel according to one or more embodiments of the present disclosure.
Figure 11:
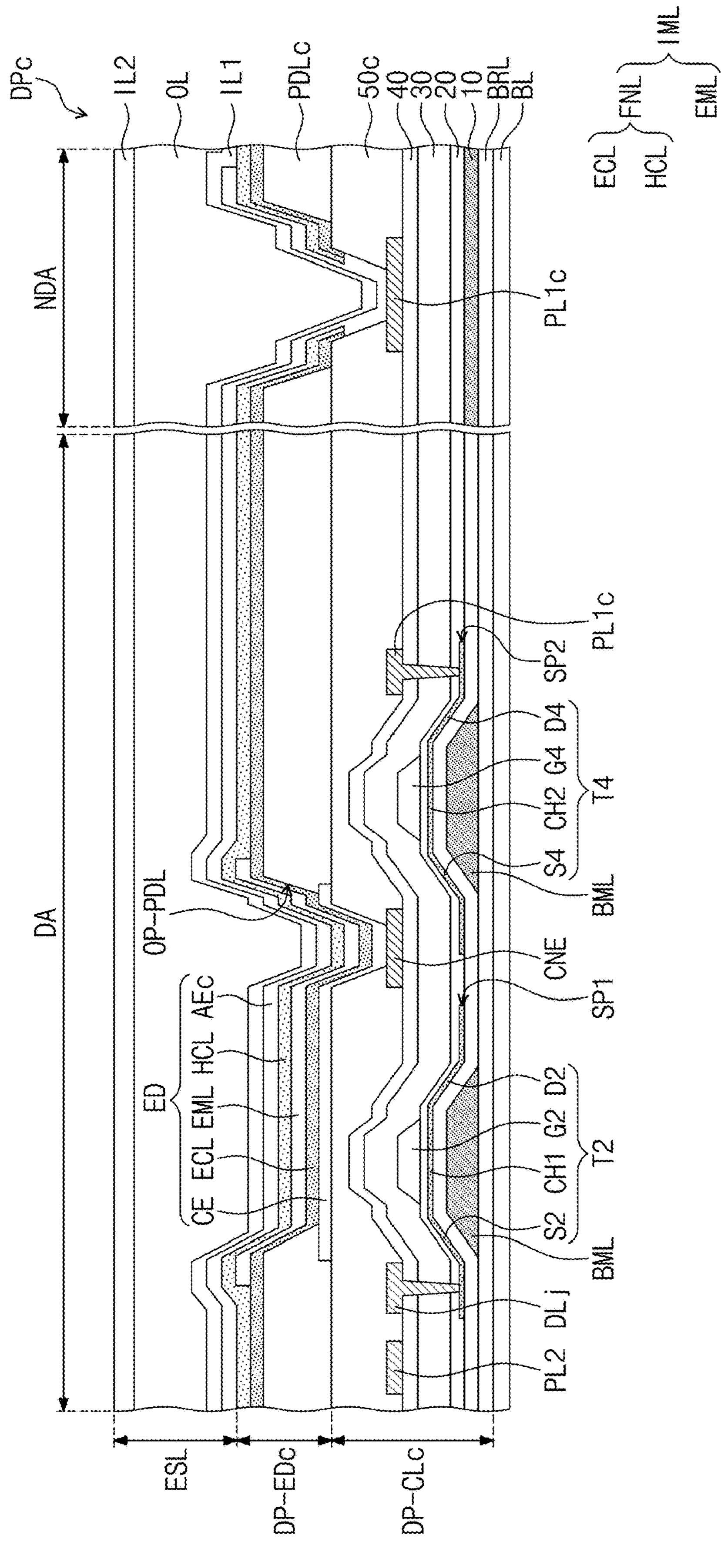
FIG. 11 is a sectional view of a display panel according to one or more embodiments of the present disclosure.

FIGS. 9A and 9B are sectional views of display panels DP and DPa according to one or more embodiments of the present disclosure. FIG. 10 is a sectional view of a display panel DPb according to one or more embodiments of the present disclosure. FIG. 11 is a sectional view of a display panel DPc according to one or more embodiments of the present disclosure. FIGS. 9A-10 illustrate enlarged views of portions of display regions DA, respectively, and FIG. 11 illustrates an enlarged view of a portion of a display region DA and a portion of a non-display region NDA.

Referring to FIG. 9A, the display panel DP may include a base layer BL, and a circuit element layer DP-CL, a display element layer DP-ED, and an encapsulation layer ESL that are disposed on the base layer BL. The circuit element layer DP-CL includes at least a plurality of insulating layers and a circuit element. The insulating layers that will be described below may include an organic layer and/or an inorganic layer.

An insulating layer, a semiconductor layer, and a conductive layer are formed by coating, deposition, and/or the like. Thereafter, the insulating layer, the semiconductor layer, and the conductive layer may be selectively subjected to patterning through a photolithography process and an etching process. A semiconductor pattern, a conductive pattern, and a signal line are formed through these processes. Patterns disposed on the same layer are formed through the same process.

The base layer BL may include a synthetic resin layer. The synthetic resin layer may include a thermosetting resin. In particular, the synthetic resin layer may be a polyimide-based resin layer, and the material thereof is not particularly limited. The synthetic resin layer may include at least one of an acrylic resin, a methacrylic resin, a polyisoprene resin, a vinyl resin, an epoxy resin, a urethane-based resin, a cellulosic resin, a siloxane-based resin, a polyamide resin, and/or a perylene-based resin. In addition, the base layer BL may include a glass substrate, a metal substrate, and/or an organic/inorganic composite substrate. The base layer BL may include a first polyimide layer, a second polyimide layer, and/or an inorganic layer disposed therebetween.

At least one inorganic layer is formed on the upper surface of the base layer BL. The inorganic layer may include at least one of aluminum oxide, titanium oxide, silicon oxide, silicon nitride, silicon oxy nitride, zirconium oxide, and/or hafnium oxide. The inorganic layer may be formed of multiple layers. The multiple inorganic layers may constitute a barrier layer BRL that will be described below. The barrier layer BRL prevents infiltration of foreign matter from the outside. The barrier layer BRL may include a silicon oxide layer and/or a silicon nitride layer. A plurality of silicon oxide layers and/or a plurality of silicon nitride layers may be provided. The silicon oxide layers and/or the silicon nitride layers may be alternately stacked one above another. For example, the base layer BL may include a first synthetic resin layer, a silicon oxide (SiOx) layer disposed on the first synthetic resin layer, an amorphous silicon (a-Si) layer disposed on the silicon oxide layer, and/or a second synthetic resin layer disposed on the amorphous silicon layer. The silicon oxide layer and/or the amorphous silicon layer may be referred to as a base barrier layer.

A lower conductive layer BML may be disposed on the barrier layer BRL. The lower conductive layer BML may be provided in a pattern form and may be disposed to overlap each of transistors. The lower conductive layer BML may block an influence of an electrical potential due to a polarization phenomenon of the base layer BL on the transistors. In addition, the lower conductive layer BML may block light incident toward the transistors from below.

The lower conductive layer BML may include a reflective metal. For example, the lower conductive layer BML may include titanium (TI), molybdenum (Mo), an alloy containing molybdenum, aluminum (Al), an alloy containing aluminum, aluminum nitride (AlN), tungsten (W), tungsten nitride, and/or copper (Cu).

The lower conductive layer BML may be provided in an isolated form. Alternatively, the lower conductive layer BML may be synchronized with the sources and/or gate of the transistor. In another case, the lower conductive layer BML may be connected to another electrode and may independently receive a constant voltage and/or a pulse signal. The lower conductive layer BML according to one or more embodiments of the present disclosure may be provided in various forms and is not limited to any one embodiment.

A first insulating layer 10 may be disposed on the barrier layer BRL and the lower conductive layer BML. The first insulating layer 10 may be referred to as a buffer layer. The first insulating layer 10 may improve the coupling force between the barrier layer BRL and a semiconductor pattern and/or a conductive pattern. The first insulating layer 10 may include silicon oxide layers and/or silicon nitride layers. The silicon oxide layers and the silicon nitride layers may be alternately stacked one above another.

A semiconductor layer may be disposed on the first insulating layer 10. The semiconductor layer may include a plurality of oxide semiconductor patterns SP1 and SP2. Each of the oxide semiconductor patterns SP1 and SP2 may include a crystalline and/or amorphous oxide semiconductor. For example, each of the oxide semiconductor patterns SP1 and SP2 may include a metal oxide of zinc (Zn), indium (In), gallium (Ga), tin (Sn), and/or titanium (Ti). Alternatively, each of the oxide semiconductor patterns SP1 and SP2 may include a mixture of metal such as zinc (Zn), indium (In), gallium (Ga), tin (Sn), and/or titanium (Ti) and/or an oxide thereof. Each of the oxide semiconductor patterns SP1 and SP2 may include indium-tin oxide (ITO), indium-gallium-zinc oxide (IGZO), zinc oxide (ZnO), indium-zinc oxide (IZnO), zinc-indium oxide (ZIO), indium oxide (InO), titanium oxide (TiO), indium-zinc-tin oxide (IZTO), and/or zinc-tin oxide (ZTO).

Each of the oxide semiconductor patterns SP1 and SP2 may include a plurality of regions distinguished depending on whether metal oxide is reduced or not. A region where metal oxide is reduced (hereinafter, referred to as the reduced region) has a higher conductivity than a region where metal oxide is not reduced (hereinafter, referred to as the non-reduced region). The reduced region substantially serves as a source region, a drain region, and/or a signal transmission region of a transistor. The non-reduced region substantially corresponds to a channel region (or, a semiconductor region or a non-reduced region) of the transistor. In other words, one portion of the semiconductor pattern may be the channel region of the transistor, another portion may be the source region or the drain region of the transistor, and another portion may be the signal transmission region.

Source regions or drain regions may be the sources S1 to S8 or the drains D1 to D8 of the transistors T1 to T8 described with reference to FIG. 3. The sources S1 to S8 or the drains D1 to D8 of the transistors T1 to T8 may include the source regions or the drain regions of the above-described oxide semiconductor patterns SP1 and SP2 and conductive patterns connected thereto. Hereinafter, for convenience of description, the source regions or the drain regions of the oxide semiconductor patterns SP1 and SP2 are referred to as sources or drains.

From among the transistors T1 to T8 of FIG. 3, the second transistor T2 and the fourth transistor T4 are illustrated in FIG. 9A. The second transistor T2 may include the first oxide semiconductor pattern SP1 including the source S2, a first channel part CH1, and the drain D2. The source S2 and the drain D2 of the second transistor T2 may extend from the first channel part CH1 in opposite directions. The fourth transistor T4 may include the second oxide semiconductor pattern SP2 including the source S4, a second channel part CH2, and the drain D4. The source S4 and the drain D4 of the fourth transistor T4 may extend from the second channel part CH2 in opposite directions. The description of the first and second oxide semiconductor patterns SP1 and SP2 may be identically applied to the oxide semiconductor patterns of the remaining transistors not illustrated in FIG. 9A.

A second insulating layer 20 may be disposed on the first insulating layer 10 to cover the oxide semiconductor patterns SP1 and SP2. The second insulating layer may be an inorganic layer and/or an organic layer and may have a single-layer structure and/or a multi-layer structure. The second insulating layer 20 may include at least one of aluminum oxide, titanium oxide, silicon oxide, silicon nitride, silicon oxy nitride, zirconium oxide, and/or hafnium oxide.

The gate electrodes G2 and G4 may be disposed on the second insulating layer 20. The gate electrodes G2 and G4 may be disposed over the oxide semiconductor patterns SP1 and SP2, respectively. However, this is illustrative, and the gate electrodes G2 and G4 may be disposed under the oxide semiconductor patterns SP1 and SP2, respectively.

In FIG. 9A, the gate electrode G2 of the second transistor T2 and the gate electrode G4 of the fourth transistor T4 are illustrated as an example. The gate electrode G2 of the second transistor T2 may be disposed over the channel part CH1 of the first oxide semiconductor pattern SP1, and the gate electrode G4 of the fourth transistor T4 may be disposed over the channel part CH2 of the second oxide semiconductor pattern SP2. The description of the gate electrodes G2 and G4 of the second and fourth transistors T2 and T4 may be identically applied to the gate electrodes of the remaining transistors not illustrated in FIG. 9A.

The gate electrodes G2 and G4 may include titanium (TI), silver (Ag), molybdenum (Mo), aluminum (Al), aluminum nitride (AlN), tungsten (W), tungsten nitride (WN), copper (Cu), and/or an alloy thereof, but are not particularly limited thereto.

A third insulating layer 30 may be disposed on the second insulating layer 20 to cover the gate electrodes G2 and G4. A fourth insulating layer 40 may be disposed on the third insulating layer 30. Each of the third insulating layer 30 and the fourth insulating layer 40 may be an inorganic layer and/or an organic layer and may have a single layer structure or a multi-layer structure. In one or more embodiments, each of the third insulating layer 30 and the fourth insulating layer 40 may include at least one of aluminum oxide, titanium oxide, silicon oxide, silicon nitride, silicon oxy nitride, zirconium oxide, and/or hafnium oxide.

A plurality of conductive patterns may be disposed on the fourth insulating layer 40. In this embodiment, the conductive patterns disposed on the fourth insulating layer 40 may include a connecting electrode CNE, the data line DLj, the first power line PL1, and the second power line PL2.

In FIG. 9A, the connecting electrode CNE to which the cathode CE is connected is illustrated as an example. In addition, in one or more embodiments, the connecting electrode CNE to which the cathode CE is connected may be connected to the source S6 of the sixth transistor T6, which has been described above with reference to FIG. 3, through a contact hole penetrating the second to fourth insulating layers 20, 30, and 40. Although only the connecting electrode CNE to which the cathode CE is connected is illustrated in FIG. 9A, a plurality of connecting electrodes connected to the drains and the sources of the transistors may be disposed on the second insulating layer 20.

In FIG. 9A, a portion of the first power line PL1 is illustrated. The first power line PL1 may be connected to the drain D4 of the fourth transistor T4 through a contact hole penetrating the second to fourth insulating layers 20, 30, and 40. In one or more embodiments, from among the connecting electrodes, the connecting electrode connected to the drain D4 of the fourth transistor T4 may be integrated with the first power line PL1. In this embodiment, the first power line PL1 may include a structure of Ti/Al/Ti.

In FIG. 9A, a portion of the data line DLj is illustrated. The data line DLj may be connected to the source S2 of the second transistor T2 through a contact hole penetrating the second to fourth insulating layers 20, 30, and 40. From among the connecting electrodes, the connecting electrode connected to the source S2 of the second transistor T2 may be integrated with the data line DLj.

In FIG. 9A, a portion of the second power line PL2 is illustrated. In this embodiment, the second power line PL2 may be disposed on (e.g., at) the same layer as the first power line PL1. In addition, the first and second power lines PL1 and PL2 may be disposed on (e.g., at) the same layer as the data line DLj.

The second power line PL2 may include the same material as the first power line PL1. According to this embodiment, the second power line PL2 may include a structure of Ti/Al/Ti. As the second power line PL2 has a low specific resistance, the amount of noise caused by voltage drop and ripple in the second power line PL2 may be reduced. The source S1 (refer to FIG. 3) of the first transistor T1 (refer to FIG. 3) referred to as a drive transistor may be electrically connected to the noise-reduced second power line PL2, and thus the voltage level of the source S1 (refer to FIG. 3) of the first transistor T1 (refer to FIG. 3) may be prevented from being varied. In addition, the light emitting element ED may be connected between the drain D1 (refer to FIG. 3) of the first transistor T1 (refer to FIG. 3) and the first power line PL1, and thus the voltage level of the source S1 (refer to FIG. 3) of the first transistor T1 (refer to FIG. 3) may not be affected by the specific resistance of the material included in one electrode of the light emitting element ED. Accordingly, the drive current of the light emitting element ED may be prevented from being varied. Thus, the display quality of the display device DD (refer to FIG. 1) may be improved.

A fifth insulating layer 50 may be disposed on the fourth insulating layer 40, the connecting electrode CNE, the data line DLj, the first power line PL1, and the second power line PL2. The fifth insulating layer 50 may cover the connecting electrode CNE, the data line DLj, the first power line PL1, and the second power line PL2 that are disposed on the fourth insulating layer 40. In this embodiment, the fifth insulating layer 50 may be an organic layer and may have a single-layer structure, but is not particularly limited.

The cathode CE of the light emitting element ED may be disposed on the fifth insulating layer 50. The cathode CE may be connected to the connecting electrode CNE through a contact hole penetrating the fifth insulating layer 50. In this embodiment, the cathode CE may have a structure of ITO/Ag/ITO.

A pixel defining layer PDL may be disposed on the fifth insulating layer 50. An opening OP-PDL (hereinafter, referred to as the light emitting opening) of the pixel defining layer PDL may expose at least a portion of the cathode CE. The light emitting opening OP-PDL of the pixel defining layer PDL may define an emissive region. For example, the plurality of pixels PX (refer to FIG. 1) may be arranged on the plane of the display layer DP according to a certain rule. The regions where the plurality of pixels PX (refer to FIG. 1) are disposed may be defined as pixel regions, and one pixel region may include an emissive region and a non-emissive region adjacent to the emissive region. The non-emissive region may be around (e.g., may surround) the emissive region.

The pixel defining layer PDL may be an organic layer. For example, the pixel defining layer PDL may include a general purpose polymer, such as benzocyclobutene (BCB), polyimide, hexamethyldisiloxane (HMDSO), Polymethylmethacrylate (PMMA), or Polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, and/or a blend thereof.

In one or more embodiments, the pixel defining layer PDL may have a property of absorbing light. For example, the pixel defining layer PDL may be black in color. That is, the pixel defining layer PDL may include a black coloring agent. The black coloring agent may include a black dye and/or a black pigment. The black coloring agent may include carbon black, metal such as chromium, and/or oxide thereof. The pixel defining layer PDL may correspond to a light blocking pattern having light-blocking characteristics.

An intermediate layer IML may be disposed on the cathode CE. The intermediate layer IML may include at least an emissive layer EML. In one or more embodiments, the intermediate layer IML may include a functional layer FNL and the emissive layer EML. The functional layer FNL may control the movement of charges between the cathode CE and the anode AE. For example, the functional layer FNL may include a plurality of layers, or may include two or more layers spaced (e.g., spaced apart) from each other with the emissive layer EML therebetween. FIG. 9A illustrates an example that the functional layer FNL includes an electron control layer ECL and a hole control layer HCL.

The electron control layer ECL may be disposed on the cathode CE. The electron control layer ECL may include at least one of an electron injection layer and/or an electron transport layer. In one or more embodiments, the electron control layer may further include a hole blocking layer.

The emissive layer EML may be disposed on the electron control layer ECL. The emissive layer EML may be disposed only in a region corresponding to the light emitting opening OP-PDL. The emissive layer EML may be separately formed in each of the plurality of pixels PX (refer to FIG. 1). Although the patterned emissive layer EML is illustrated in this embodiment, the emissive layer EML may be commonly disposed for the plurality of pixels PX. The commonly disposed emissive layer EML may generate white light and/or blue light. In addition, the emissive layer EML may have a multi-layer structure.

The hole control layer HCL may be disposed on the emissive layer EML. The hole control layer HCL may include at least one of a hole injection layer and/or a hole transport layer. The hole transport layer may include at least one of a hole buffer layer and/or an electron blocking layer.

The anode AE may be disposed on the hole control layer HCL. That is, according to this embodiment, in the light emitting opening OP-PDL, the emissive layer EML may be disposed over the cathode CE, and the anode AE may be disposed over the emissive layer EML. In this embodiment, a plurality of anodes AE may be provided. The anodes AE may be separated for the respective pixels PX (refer to FIG. 1) and may be arranged in a pattern form. Each of the anodes AE may be connected to the second power line PL2 through a contact hole penetrating the pixel defining layer PDL and the fifth insulating layer 50 in the non-emissive region in the display region DA. In this embodiment, the anode AE may be connected to the first power line PL1 by making direct contact with the first power line PL1.

Because the anodes AE are separated for the respective pixels PX (refer to FIG. 1), a voltage drop may be reduced or prevented as compared with when the anode AE is provided as a common layer. Accordingly, the anodes AE may not be provided thick in preparation for a voltage drop, and display efficiency may be prevented from being reduced. In this embodiment, the anodes AE may include MgAg alloy.

The display panel DP may further include the encapsulation layer ESL that is disposed on the display element layer DP-ED and that seals the display element layer DP-ED. The encapsulation layer ESL may include at least an inorganic layer and/or an organic layer. In one or more embodiments, the encapsulation layer ESL may include two inorganic layers IL1 and IL2 and/or an organic layer OL disposed therebetween. In addition, the display panel DP may further include functional layers such as an anti-reflective layer, a reflective index control layer, and/or the like.

Referring to FIG. 9B, the display panel DPa according to this embodiment may include a base layer BL, a circuit element layer DP-CLa, a display element layer DP-ED and an encapsulation layer ESL. From among the components illustrated in FIG. 9B, the components identical to the components illustrated in FIG. 9A will be assigned with identical reference numerals, and specific descriptions thereabout will be omitted.

When compared to the circuit element layer DP-CL in the embodiment illustrated in FIG. 9A, the circuit element layer DP-CLa according to this embodiment may further include a sixth insulating layer 60 disposed on a fifth insulating layer 50.

A first connecting electrode CNE1 and a data line DLj may be disposed on a fourth insulating layer 40. Although only the first connecting electrode CNE1 connected to a drain D4 of a fourth transistor T4 is illustrated in FIG. 9B, a plurality of first connecting electrodes connected to drains and sources of transistors may be disposed on a third insulating layer 30.

A second connecting electrode CNE2 to which a cathode CE is connected, a first power line PL1*a*, and a second power line PL2*a* may be disposed on the fourth insulating layer 40. in one or more embodiments, the second connecting electrode CNE2 may be connected to the first connecting electrode CNE1 connected to a source S6 of a sixth transistor T6 and may be electrically connected with the sixth transistor T6 by the first connecting electrode CNE1. The first power line PL1*a* may be connected to the first connecting electrode CNE1 connected to the drain D4 of the fourth transistor T4 through a contact hole penetrating the fifth insulating layer 50. The first power line PL1*a* may be electrically connected to the drain D4 of the fourth transistor T4 through the first connecting electrode CNE1.

In this embodiment, the first power line PL1*a* and the second power line PL2*a* may be disposed on a layer different from the layer on which the data line DLj is disposed. However, an arrangement of the data line DLj, the first power line PL1*a*, and the second power line PL2*a* is not limited to any one embodiment. For example, the first power line PL1*a* and the second power line PL2*a* may be disposed on different layers. One of the first power line PL1*a* and the second power line PL2*a* may be disposed on the fourth insulating layer 40, and the other one of the first power line PL1*a* and the second power line PL2*a* may be disposed on the fifth insulating layer 50.

Referring to FIG. 10, the display panel DPb according to this embodiment may include a base layer BL, a circuit element layer DP-CLb, a display element layer DP-ED, and the encapsulation layer ESL. From among the components illustrated in FIG. 10, the components identical to the components illustrated in FIG. 9A will be assigned with identical reference numerals, and specific descriptions thereabout will be omitted.

When compared to the circuit element layers DP-CL and DP-CLa in the embodiments illustrated in FIGS. 9A and 9B, the circuit element layer DP-CLb according to this embodiment may further include a connection conductive pattern CNP that connects an anode AE and a first power line PL1. The connection conductive pattern CNP may be disposed on a fourth insulating layer 40 and may cover the first power line PL1. Accordingly, the anode AE may be connected to the connection conductive pattern CNP through a contact hole penetrating a fifth insulating layer 50 and a pixel defining layer PDL and may be electrically connected with the first power line PL1 through the connection conductive pattern CNP.

In this embodiment, the connection conductive pattern CNP may include indium tin oxide (ITO). The connection conductive pattern CNP may include the same material as the material disposed in the uppermost layer of the first power line PL1. However, the material of the connection conductive pattern CNP is not limited thereto.

According to this embodiment, by providing the connection conductive pattern CNP that covers the first power line PL1, damage to the first power line PL1 may be prevented in a subsequent process, for example, a process of forming a contact hole penetrating the fifth insulating layer 50.

Referring to FIG. 11, the display panel DPc according to this embodiment may include a base layer BL, a circuit element layer DP-CLc, a display element layer DP-EDc, and the encapsulation layer ESL. From among the components illustrated in FIG. 11, the components identical to the components illustrated in FIG. 9A will be assigned with identical reference numerals, and specific descriptions thereabout will be omitted.

When compared to the anodes AE in the embodiments illustrated in FIGS. 9A-10, an anode AEc according to this embodiment may be commonly disposed for the plurality of pixels PX (refer to FIG. 1). The anode AEc commonly disposed for the pixels PX (refer to FIG. 1) may be connected to a first power line PL1*c* in the non-display region NDA. Although FIG. 11 illustrates an example that the anode AEc is connected to the first power line PL1*c* through a contact hole penetrating a pixel defining layer PDLc and a fifth insulating layer 50*c* in the non-display region NDA, the present disclosure is not limited thereto. For example, the first power line may be disposed outward of the pixel defining layer and the fifth insulating layer. In this case, the anode may extend along the edge of the pixel defining layer and the edge of the fifth insulating layer and may be connected to the first power line outside the pixel defining layer and the fifth insulating layer.

According to this embodiment, a contact hole for connecting the anode AEc and the first power line PL1*c* may not be formed in the fifth insulating layer 50*c* and the pixel defining layer PDLc for each of the pixels PX (refer to FIG. 1) in the display region DA, and thus the process may be relatively simplified.

Figure 12:
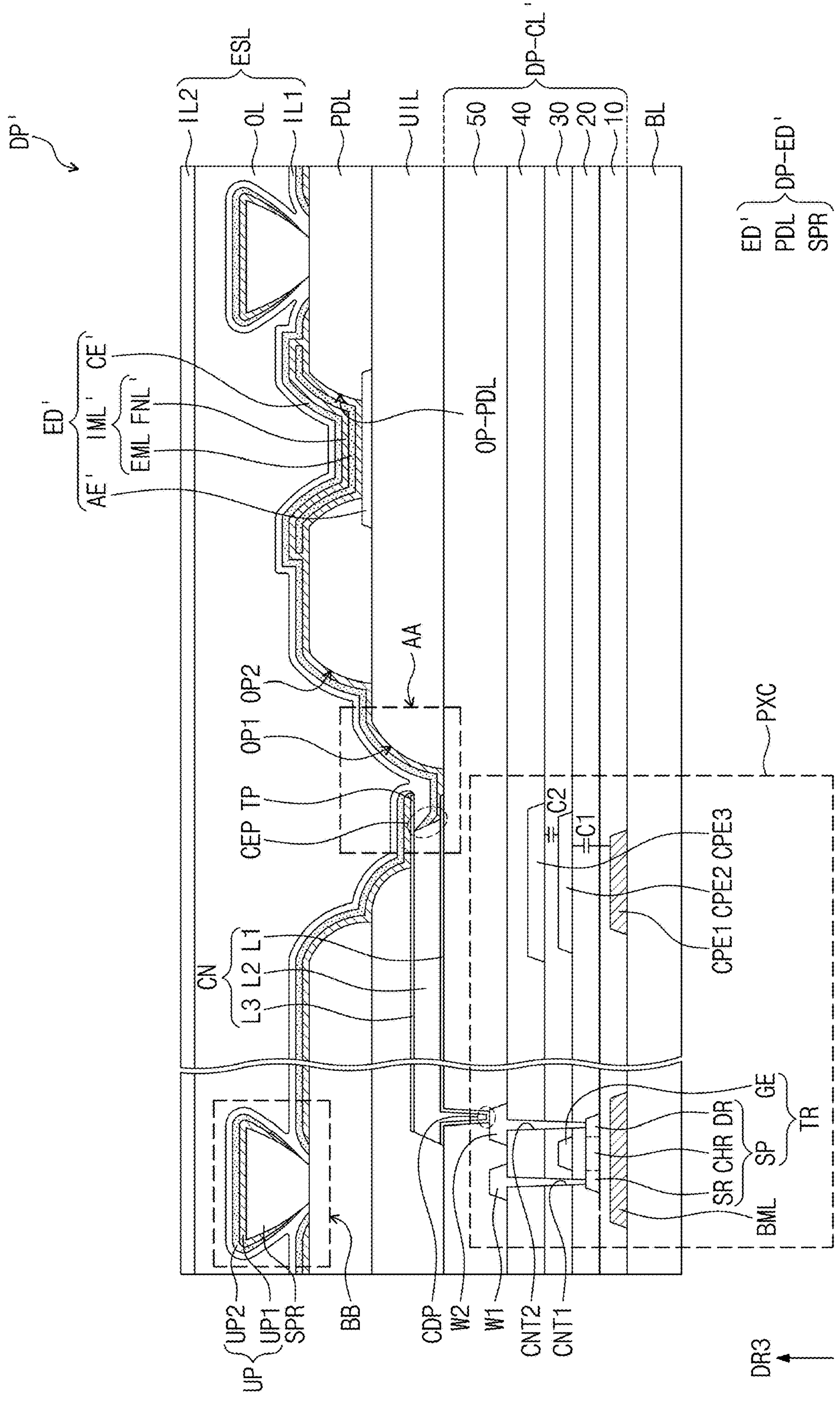
FIG. 12 is a sectional view of a display panel according to one or more embodiments of the present disclosure.

FIG. 12 is a sectional view of a display panel according to one or more embodiments of the present disclosure.

Referring to FIG. 12, the display panel DP' may include a base layer BL, and a circuit element layer DP-CL', an upper insulating layer UIL, a connecting line CN, a display element layer DP-ED', and an encapsulation layer ESL that are disposed on the base layer BL.

In FIG. 12, one transistor TR and two capacitors C1 and C2 of a pixel driver PXC are illustrated. The transistor TR may correspond to a transistor connected to a light emitting element ED' through the connecting line CN, that is, a connection transistor connected to a node (e.g., the fourth node N4 of FIG. 3) that corresponds to a cathode CE' of the light emitting element ED'. Specifically, the transistor TR may correspond to the sixth transistor T6 of FIG. 3. In one or more embodiments, other transistors constituting the pixel driver PXC may have the same structure as the transistor TR (hereinafter, referred to as the connection transistor) illustrated in FIG. 12. However, this is illustrative, and the other transistors constituting the pixel driver PXC may have a structure different from that of the connection transistor TR and are not limited to any one embodiment.

A lower conductive layer BML may be disposed to overlap the connection transistor TR and may be covered by a first insulating layer 10. At least one of an inorganic barrier layer and/or a buffer layer may be additionally disposed between the lower conductive layer BML and the base layer BL.

In this embodiment, the lower conductive layer BML may be connected with a source of the connection transistor TR (or, the transistor) through a source electrode pattern W1. In this case, the lower conductive layer BML may be synchronized with the source of the transistor TR. However, this is illustrative, and the lower conductive layer BML may be connected to a gate of the transistor TR and may be synchronized with the gate. Alternatively, the lower conductive layer BML may be connected to another electrode and may independently receive a constant voltage or a pulse signal. In another case, the lower conductive layer BML may be provided in a form isolated from another conductive pattern. The lower conductive layer BML according to one or more embodiments of the present disclosure may be provided in various forms and is not limited to any one embodiment.

The connection transistor TR may be disposed on the first insulating layer 10. The connection transistor TR may include a semiconductor pattern SP and a gate electrode GE. The semiconductor pattern SP may be disposed on the first insulating layer 10. The semiconductor pattern SP may include a source region SR, a drain region DR, and a channel region CHR distinguished from one another depending on the degree of conductivity.

The display panel DP' according to this embodiment may further include the source electrode pattern W1 and a drain electrode pattern W2 that are connected to the source region SR and the drain region DR, respectively. Specifically, each of the source electrode pattern W1 and the drain electrode pattern W2 may be integrally formed with one of lines constituting the pixel driver and is not limited to any one embodiment.

A second insulating layer 20 may commonly overlap a plurality of pixels and may cover the semiconductor pattern SP and the first insulating layer 10. The gate electrode GE may be disposed on the second insulating layer 20. The gate electrode GE may correspond to the gate of the connection transistor TR and may overlap the channel region CHR in a thickness direction of the base layer BL (e.g., a third direction DR3).

A third insulating layer 30 may be disposed on the gate electrode GE and the second insulating layer 20, and a fourth insulating layer 40 may be disposed on the third insulating layer 30. A first capacitor electrode CPE1, a second capacitor electrode CPE2, and a third capacitor electrode CPE3 may be included in a plurality of conductive patterns.

The first capacitor electrode CPE1 and the second capacitor electrode CPE2 constitute the first capacitor C1. The first capacitor electrode CPE1 and the second capacitor electrode CPE2 may be spaced (e.g., spaced apart) from each other with the first insulating layer 10 and the second insulating layer 20 therebetween.

In one or more embodiments of the present disclosure, the first capacitor electrode CPE1 and the lower conductive layer BML may have a one-body shape (e.g., may be integrally formed at a same layer). In addition, the second capacitor electrode CPE2 and the gate electrode GE may have a one-body shape (e.g., may be integrally formed at a same layer).

The third capacitor electrode CPE3 may be disposed on the third insulating layer 30. The third capacitor electrode CPE3 may be spaced (e.g., spaced apart) from the second capacitor electrode CPE2 with the third insulating layer 30 therebetween and may overlap the second capacitor electrode CPE2 when viewed from above the plane (e.g., in a plan view). In other words, the second capacitor electrode CPE2 may overlap the third capacitor electrode CPE3 in the third direction DR3. The third capacitor electrode CPE3, together with the second capacitor electrode CPE2, may constitute the second capacitor C2.

The fourth insulating layer 40 may be disposed on the third insulating layer and/or the third capacitor electrode CPE3. The source electrode pattern W1 and the drain electrode pattern W2 may be disposed on the fourth insulating layer 40. The source electrode pattern W1 may be connected to the source region SR of the connection transistor TR through a first contact hole CNT1, and the source electrode pattern W1 and the source region SR of the semiconductor pattern SP may function as the source of the connection transistor TR. The drain electrode pattern W2 may be connected to the drain region DR of the connection transistor TR through a second contact hole CNT2, and the drain electrode pattern W2 and the drain region DR of the semiconductor pattern SP may function as the drain of the connection transistor TR. In one or more embodiments, the source electrode pattern W1 and the drain electrode pattern W2 may be disposed in the display panels DP, DPa, DPb, and DPc described above with reference to FIGS. 9A-11. A fifth insulating layer 50 may be disposed on the source electrode pattern W1 and the drain electrode pattern W2 and the fourth insulating layer 40.

The connecting line CN may be disposed on the fifth insulating layer 50. The connecting line CN may electrically connect the pixel driver PXC and the light emitting element ED'. That is, the connecting line CN may electrically connect the connection transistor TR and the light emitting element ED'. The connecting line CN may be a connection node that connects the pixel driver PXC and the light emitting element ED'. That is, the connecting line CN may correspond to the fourth node N4 illustrated in FIG. 3. However, this is illustrative, and as long as the connecting line CN is capable of being connected with the light emitting element ED', the connecting line CN may be defined as a connection node with various elements from among elements constituting the pixel driver PXC depending on the design of the pixel driver PXC and is not limited to any one embodiment.

The upper insulating layer UIL may be disposed on the connecting line CN and the fifth insulating layer 50. The upper insulating layer UIL may be disposed on the fifth insulating layer 50 and may cover the connecting line CN. The upper insulating layer UIL may be an organic layer. For example, the upper insulating layer UIL may include a general purpose polymer, such as benzocyclobutene (BCB), polyimide, hexamethyldisiloxane (HMDSO), Polymethylmethacrylate (PMMA), and/or Polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, and/or a blend thereof.

The upper insulating layer UIL may include an opening for exposing at least a portion of the connecting line CN. The connecting line CN may be electrically connected with the light emitting element ED' through the portion exposed from the upper insulating layer UIL. That is, the connecting line CN may electrically connect the connection transistor TR and the light emitting element ED'. Detailed description thereabout will be given below. In one or more embodiments, in the display panel DP' according to one or more embodiments of the present disclosure, the upper insulating layer UIL may be omitted, or a plurality of upper insulating layers UIL may be provided. However, the present disclosure is not limited to any one embodiment.

The display element layer DP-ED' may be disposed on the upper insulating layer UIL. The display element layer DP-ED' may include a pixel defining layer PDL, the light emitting element ED', and a separator SPR. The light emitting element ED' may include an anode AE', an intermediate layer IML', and the cathode CE'.

In this embodiment, the anode AE' may be disposed on the upper insulating layer UIL. The anode AE' may be a transflective electrode, a transmissive electrode, and/or a reflective electrode. According to one or more embodiments of the present disclosure, the anode AE' may include a reflective layer formed of silver (Ag), magnesium (Mg), aluminum (Al), platinum (Pt), palladium (Pd), gold (Au), nickel (Ni), neodymium (Nd), iridium (Ir), chromium (Cr), and/or a compound thereof and/or a transparent and/or translucent electrode layer formed on the reflective layer. The transparent and/or translucent electrode layer may include at least one selected from the group consisting of indium tin oxide (ITO), indium zinc oxide (IZO), indium gallium zinc oxide (IGZO), zinc oxide (ZnO), indium oxide ($In_2O_3$), aluminum-doped zinc oxide (AZO), and combinations thereof. For example, the anode AE' may include a stacked structure of ITO/Ag/ITO. The anode AE' may be connected with the first power line PL1 (refer to FIG. 3), and the first drive voltage ELVDD (refer to FIG. 3) may be applied to the anode AE'.

A light emitting opening OP-PDL for exposing at least a portion of the anode AE' may be defined in the pixel defining layer PDL. A plurality of light emitting openings OP-PDL may be provided. The plurality of light emitting openings OP-PDL may be disposed to correspond to light emitting elements, respectively. All components of the light emitting element ED' may be disposed in the light emitting opening OP-PDL to overlap one another, and the light emitting opening OP-PDL may be a region where light emitted by the light emitting element ED' is substantially displayed.

The intermediate layer IML' may be disposed between the anode AE' and the cathode CE'. The intermediate layer IML' may include an emissive layer EML and a functional layer FNL'. The light emitting element ED' may include the intermediate layer IML' having various structures and is not limited to any one embodiment. For example, the functional layer FNL' may include a plurality of layers, or may include two or more layers that are spaced (e.g., spaced apart) from each other with the emissive layer EML therebetween (e.g., see FIG. 11). Alternatively, in one or more embodiments, the functional layer FNL' may be omitted. Although FIG. 12 illustrates an embodiment in which the emissive layer EML and the functional layer FNL' have different shapes, the present disclosure is not limited thereto, and the emissive layer EML and the functional layer FNL' may be disposed in the same shape (e.g., may be integrally provided at a same layer) when viewed from above the plane (e.g., in a plan view).

The functional layer FNL' may be disposed between the anode AE' and the cathode CE'. Specifically, the functional layer FNL' may be disposed between the anode AE' and the emissive layer EML, or may be disposed between the cathode CE' and the emissive layer EML. Alternatively, the functional layer FNL' may be disposed between the anode AE' and the emissive layer EML and between the cathode CE' and the emissive layer EML. In this embodiment, the emissive layer EML is illustrated as being inserted into the functional layer FNL'. However, this is illustrative, and the functional layer FNL' may include a layer disposed between the emissive layer EML and the anode AE' and/or a layer disposed between the emissive layer EML and the cathode CE' and is not limited to any one embodiment. The functional layer FNL' may include a hole control layer and an electron control layer. At least a portion of the hole control layer may be disposed between the anode AE' and the emissive layer EML, and at least a portion of the electron control layer may be disposed between the emissive layer EML and the cathode CE'.

The cathode CE' may be disposed on the intermediate layer IML'. As described above, the cathode CE' may be connected to the connecting line CN and may be electrically connected to the pixel driver PXC. That is, the cathode CE' may be electrically connected with the connection transistor TR through the connecting line CN.

As described above, the connecting line CN may include a drive connection part CDP and a light emitting connection part CEP. The drive connection part CDP may be a part of the connecting line CN connected with the pixel driver PXC and may be a part substantially connected with the connection transistor TR. In this embodiment, the drive connection part CDP may penetrate the fifth insulating layer 50 and may be electrically connected to the drain region DR of the semiconductor pattern SP through the drain electrode pattern W2. The light emitting connection part CEP may be a part of the connecting line CN connected with the light emitting element ED'. The light emitting connection part CEP may be a part that is defined in a region exposed from the upper insulating layer UIL and to which the cathode CE' is connected. A tip portion TP may be defined in the light emitting connection part CEP.

Figure 13A:
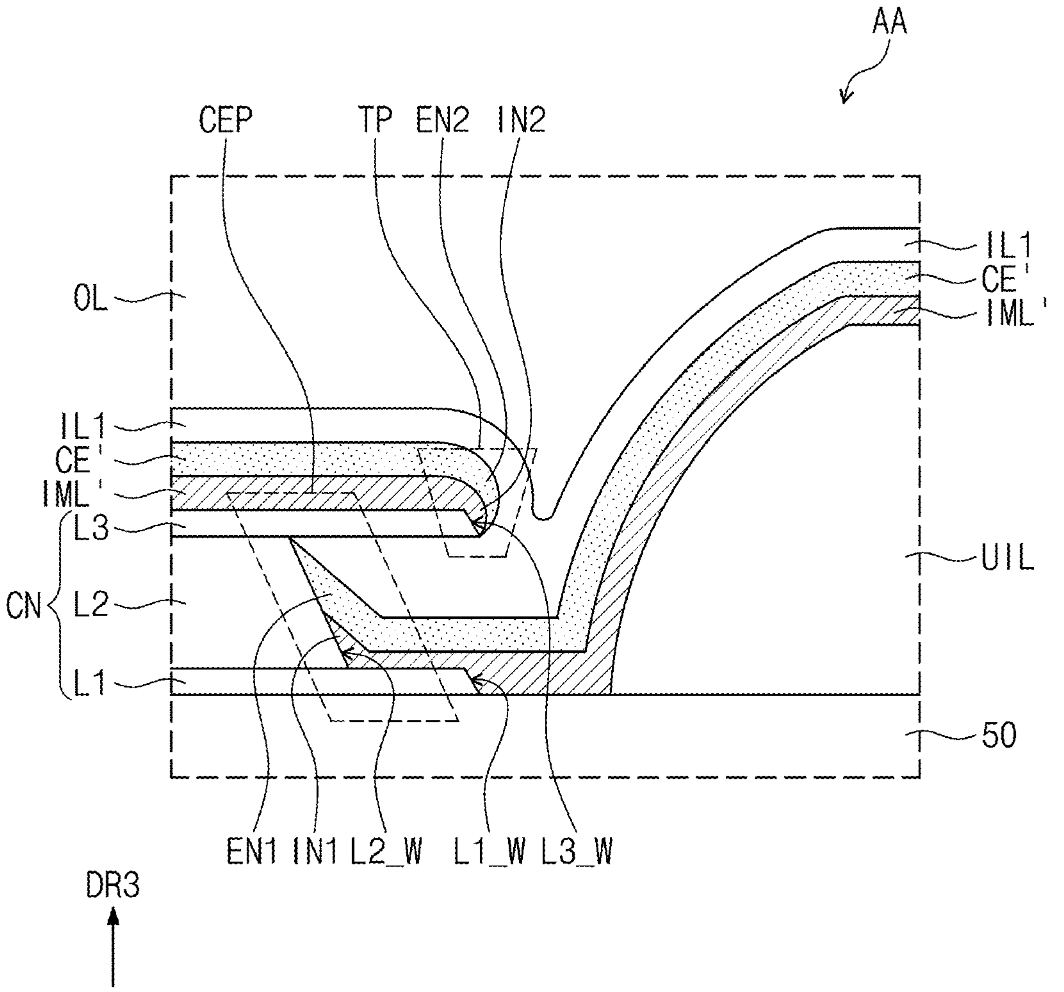
FIG. 13A is an enlarged sectional view of a region AA in FIG. 12 according to one or more embodiments of the present disclosure.

The light emitting connection part CEP of the connecting line CN will be described below in more detail with reference to FIGS. 12 and 13A. As illustrated in FIGS. 12 and 13A, the connecting line CN may have a three-layer structure. Specifically, the connecting line CN may include a first layer L1, a second layer L2, and a third layer L3 sequentially stacked in the third direction DR3. The second layer L2 may include a material different from that of the first layer L1. In addition, the second layer L2 may include a material different from that of the third layer L3. The second layer L2 may have a greater thickness than the first layer L1. In addition, the second layer L2 may have a greater thickness than the third layer L3. The second layer L2 may include a highly conductive material. In one or more embodiments, the second layer L2 may include aluminum (Al).

In one or more embodiments, the first layer L1 may include a material having a lower etch rate than the second layer L2. That is, the second layer L2 may be formed of materials having a high etch selectivity with respect to the first layer L1. In one or more embodiments, the first layer L1 may include titanium (Ti), and the second layer L2 may include aluminum (Al). In this case, a side surface L1_W of the first layer L1 may be defined outward of a side surface L2_W of the second layer L2. That is, the light emitting connection part CEP of the connecting line CN may have a shape in which the side surface L1_W of the first layer L1 protrudes outward from the side surface L2_W of the second layer L2. That is, the light emitting connection part CEP of the connecting line CN may have a shape in which the side surface L2_W of the second layer L2 is recessed inward from the side surface L1_W of the first layer L1.

In addition, the third layer L3 may include a material having a lower etch rate than the second layer L2. That is, the third layer L3 and the second layer L2 may be formed of materials with high etch selectivity. In one or more embodiments, the third layer L3 may include titanium (Ti), and the second layer L2 may include aluminum (Al). In this case, a side surface L3_W of the third layer L3 may be defined outward of the side surface L2_W of the second layer L2. That is, the light emitting connection part CEP of the connecting line CN may have a shape in which the side surface L3_W of the third layer L3 protrudes outward from the side surface L2_W of the second layer L2. That is, the light emitting connection part CEP of the connecting line CN may have an undercut shape or an overhang structure, and the tip portion TP of the light emitting connection part CEP may be defined by the portion of the third layer L3 that protrudes relative to the second layer L2.

The upper insulating layer UIL and the pixel defining layer PDL may expose at least a portion of the tip portion TP and at least a portion of the second side surface L2_W. Specifically, a first opening OP1 for exposing one side of the connecting line CN may be defined in the upper insulating layer UIL, and a second opening OP2 overlapping the first opening OP1 may be defined in the pixel defining layer PDL. The planar area of the second openings OP2 may be greater than the planar area of the first opening OP1. However, the present disclosure is not limited thereto, and the planar area of the second openings OP2 may be smaller than or equal to the planar area of the first opening OP1 as long as at least a portion of the tip portion TP and at least a portion of the second side surface L2_W are capable of being exposed.

The intermediate layer IML' may be disposed on the pixel defining layer PDL. The intermediate layer IML' may also be disposed on a partial region of the upper insulating layer UIL exposed by the second opening OP2 of the pixel defining layer PDL. In addition, the intermediate layer IML' may also be disposed on a partial region of the connecting line CN exposed by the first opening OP1 of the upper insulating layer UIL. As illustrated in FIG. 13A, the intermediate layer IML' may include one end IN1 disposed along the upper surface of the fifth insulating layer 50 and an opposite end IN2 disposed along the upper surfaces of the connecting line CN and the tip portion TP. That is, when viewed on the section, the intermediate layer IML' may have a shape that is partially disconnected with respect to the tip portion TP in the region where the light emitting connection part CEP is defined. However, when viewed from above the plane (e.g., in a plan view), the intermediate layer IML' may have a one-body shape that is connected as a whole within a region (refer to FIG. 15A) defined as a closed line by the separator SPR.

The cathode CE' may be disposed on the intermediate layer IML'. The cathode CE' may also be disposed on a partial region of the upper insulating layer UIL exposed by the second opening OP2 of the pixel defining layer PDL. In addition, the cathode CE' may also be disposed on a partial region of the connecting line CN exposed by the first opening OP1 of the upper insulating layer UIL. As illustrated in FIG. 13A, the cathode CE' may include one end EN1 disposed along the upper surface of the fifth insulating layer 50 and an opposite end EN2 disposed along the upper surfaces of the connecting line CN and the tip portion TP. That is, when viewed on the section, the cathode CE' may have a shape that is partially disconnected with respect to the tip portion TP in the region where the light emitting connection part CEP is defined. However, when viewed from above the plane (e.g., in a plan view), the cathode CE' may have a one-body shape that is connected as a whole within the region (refer to FIG. 15A) defined as a closed curve by the separator SPR.

In one or more embodiments, the one end EN1 of the cathode CE' may be disposed along the side surface of the second layer L2 and may make contact with the side surface L2_W of the second layer L2. Specifically, through a difference in deposition angle between the cathode CE' and the intermediate layer IML', the cathode CE' may be formed to make contact with the side surface L2_W of the second layer L2 exposed from the intermediate layer IML' by the tip portion TP. That is, the cathode CE' may be connected to the connecting line CN without a separate patterning process for the intermediate layer IML', and thus the light emitting element ED' may be electrically connected with the pixel driver PXC through the connecting line CN.

Although the opposite end IN2 of the intermediate layer IML' and the opposite end EN2 of the cathode CE' are illustrated as covering the side surface L3_W of the third layer L3 in this embodiment, this is illustrative, and at least a portion of the side surface L3_W of the third layer L3 may be exposed from the opposite end IN2 of the intermediate layer IML' and/or the opposite end EN2 of the cathode CE'.

The display panel DP' according to this embodiment may include the separator SPR. The separator SPR may be disposed on the pixel defining layer PDL. In one or more embodiments, the cathode CE' and the intermediate layer IML' may be commonly formed for the plurality of pixels by deposition through an open mask. In this case, the cathode CE' and the intermediate layer IML' may be divided by the separator SPR. As described above, the separator SPR may have a closed-line shape for each of light emitting parts, and thus the cathode CE' and the intermediate layer IML' may have a divided shape for each light emitting part. That is, the cathode CE' and the intermediate layer IML' may be electrically independent of each adjacent pixel.

Figure 13B:
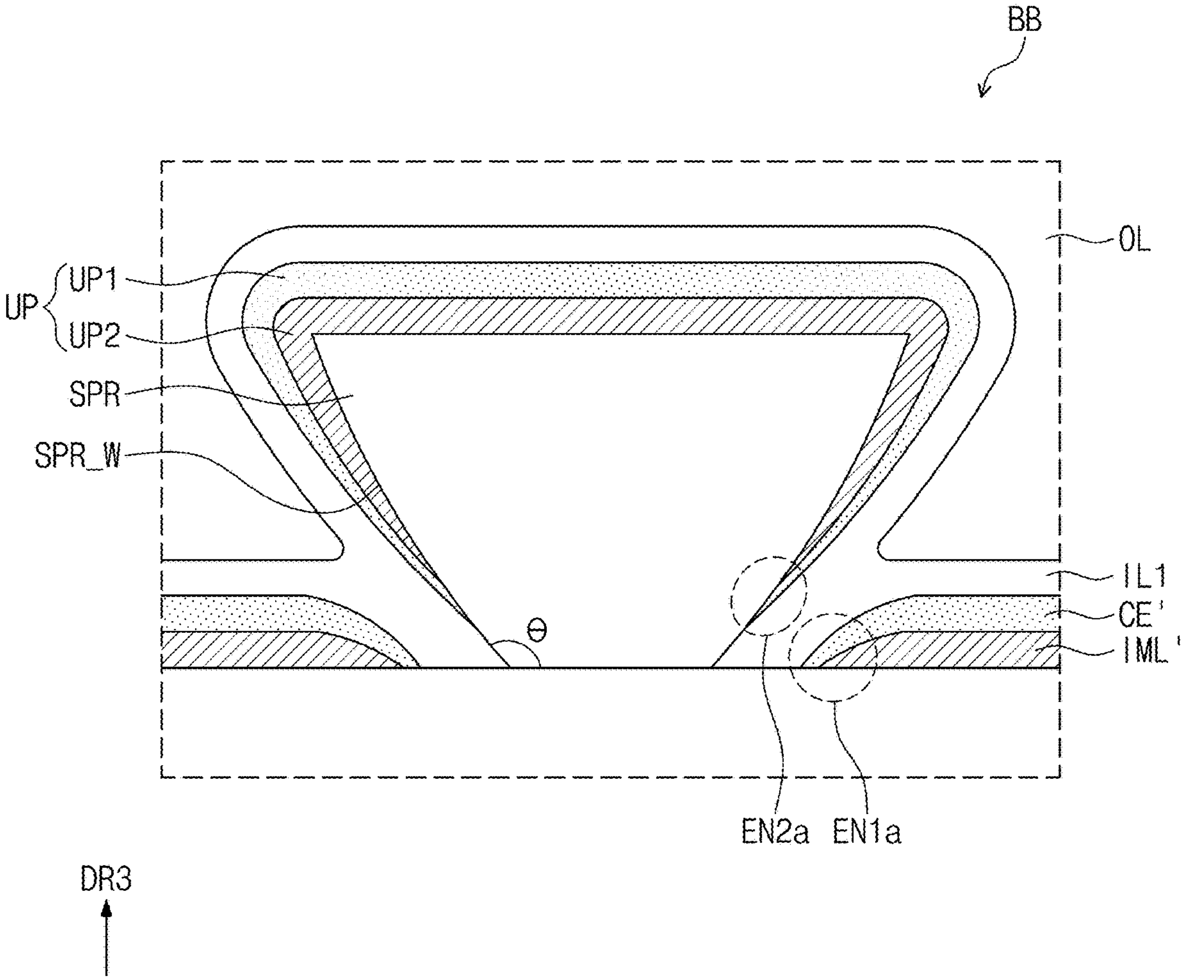
FIG. 13B is an enlarged sectional view of a region BB in FIG. 12 according to one or more embodiments of the present disclosure.

The separator SPR will be described below in more detail with reference to FIGS. 12 and 13B. As illustrated in FIG. 13B, the separator SPR may have an inverted tapered shape. That is, the angle θ (hereinafter, referred to as the taper angle) formed by a side surface SPR_W of the separator SPR with respect to the upper surface of the pixel defining layer PDL may be an obtuse angle. However, this is illustrative, and the taper angle θ may be diversely set as long as the separator SPR is capable of electrically disconnecting the cathode CE' for each pixel. In addition, the separator SPR may have the same structure as the tip portion TP and is not limited to any one embodiment.

In one or more embodiments, the separator SPR may include an insulating material. In particular, the separator SPR may include an organic insulating material. Alternatively, the separator SPR may include an inorganic insulating material. In another case, the separator SPR may be constituted by multiple layers of an organic insulating material and an inorganic insulating material. In one or more embodiments, the separator SPR may include a conductive material. That is, the type of material of the separator SPR is not particularly limited as long as the cathode CE' is capable of being electrically disconnected for each pixel.

A dummy layer UP may be disposed on the separator SPR. The dummy layer UP may include a first dummy layer UP1 disposed on the separator SPR and a second dummy layer UP2 disposed on the first dummy layer UP1. The first dummy layer UP1 may be formed through the same process as that of the intermediate layer IML' and may include the same material as the intermediate layer IML'. The second dummy layer UP2 may be formed through the same process as that of the cathode CE' and may include the same material as the cathode CE'. That is, the first dummy layer UP1 and the second dummy layer UP2 may be concurrently (e.g., simultaneously) formed in a process of forming the intermediate layer IML' and the cathode CE'. In one or more embodiments, the display panel DP' may not include the dummy layer UP.

As illustrated in FIG. 13B, in one or more embodiments, the cathode CE' may include a first end portion EN1*a*, and the second dummy layer UP2 may include a second end portion EN2*a*. The first end portion EN1*a* may be spaced (e.g., spaced apart) from the separator SPR and may be located on the pixel defining layer PDL, and the second end portion EN2*a* may be separated from the first end portion EN1*a* and may be located on the side surface SPR_W of the separator SPR. However, although the first end portion EN1*a* is illustrated as being spaced (e.g., spaced apart) from the side surface SPR_W of the separator SPR at a certain interval in FIG. 13B, the present disclosure is not limited thereto, and the first end portion EN1*a* may make contact with the side surface SPR_W of the separator SPR as long as the first end portion EN1*a* is electrically disconnected from the second end portion EN2*a*. In addition, even if the first end portion EN1*a* and the second end portion EN2*a* are connected without being distinguished from each other, when a portion formed along the side surface SPR_W of the separator SPR is thin so that electrical resistance is high, the cathode CE' may be considered to be divided by the separator SPR if the cathode CE' is electrically disconnected between adjacent pixels.

According to the present disclosure, even though there is no separate patterning process for the cathode CE' or the intermediate layer IML', the cathode CE' and/or the intermediate layer IML' may be divided for each pixel by preventing the cathode CE' and/or the intermediate layer IML' from being formed on the side surface SPR_W of the separator SPR or by making the cathode CE' and/or the intermediate layer IML' thin. In addition, as long as the cathode CE' and/or the intermediate layer IML' is capable of being electrically disconnected between adjacent pixels, the shape of the separator SPR may be modified in various ways and is not limited to any one embodiment.

Figure 14:
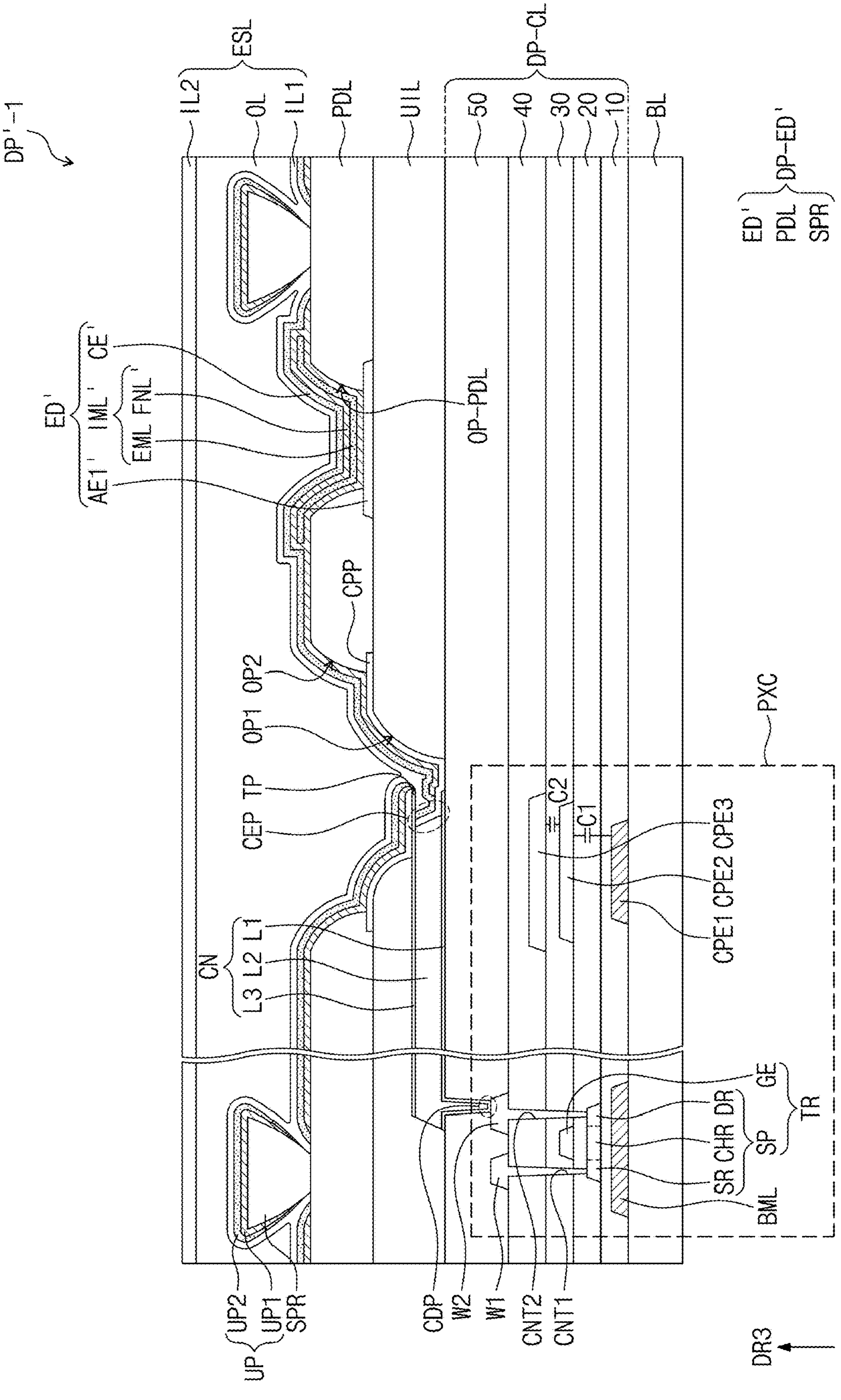
FIG. 14 is a sectional view of a display panel according to one or more embodiments of the present disclosure.

FIG. 14 is a sectional view of a display panel according to one or more embodiments of the present disclosure. For ease of description, a sectional view of a region corresponding to FIG. 12 is illustrated in FIG. 14. Hereinafter, components identical to the components described above with reference to FIG. 13 will be assigned with identical reference numerals, and repetitive descriptions will be omitted.

When compared to the display panel DP' illustrated in FIG. 12, the display panel DP'-1 illustrated in FIG. 14 may further include a capping pattern CPP. The capping pattern CPP may be disposed on an upper insulating layer UIL. In addition, the capping pattern CPP may also be disposed on a partial region of a connecting line CN exposed by a first opening OP1 of the upper insulating layer UIL. The capping pattern CPP may be disposed to overlap the connecting line CN. Specifically, the capping pattern CPP may be disposed to overlap a light emitting connection part CEP and/or a tip portion TP.

In addition, when viewed on the section illustrated in FIG. 14, the capping pattern CPP may have a shape that is partially disconnected with respect to the tip portion TP in the region where the light emitting connection part CEP is defined. However, when viewed from above the plane (e.g., in a plan view), the capping pattern CPP may have a one-body shape that is connected as a whole within the region (refer to FIG. 15A) defined as a closed line by the separator SPR. In one or more embodiments, one end portion of the partially disconnected capping pattern CPP may make contact with a side surface of a second layer L2 of the connecting line CN, and another end portion of the capping pattern CPP may be disposed on a third layer L3 of the connecting line CN and may cover the tip portion TP.

The capping pattern CPP may include a conductive material. Accordingly, a cathode CE' may be electrically connected to the connecting line CN through the capping pattern CPP. That is, the capping pattern CPP may make contact with the side surface of the second layer L2 of the connecting line CN, and thereafter the cathode CE' may make contact with the capping pattern CPP and may be electrically connected to the connecting line CN. The capping pattern CPP may be disposed outward of the second layer L2 of the connecting line CN, and the cathode CE' may be electrically connected with the second layer L2 only by making a connection with the capping pattern CPP instead of the side surface of the second layer L2. Accordingly, the connection between the connecting line CN and the cathode CE' may be more easily performed.

In addition, the capping pattern CPP may include a material having a lower reactivity than the second layer L2 of the connecting line CN. For example, the capping pattern CPP may include copper (Cu), silver (Ag), and/or transparent conductive oxide. The side surface of the second layer L2 of the connecting line CN may be protected by the capping pattern CPP having a lower reactivity than the second layer L2 of the connecting line CN, and thus oxidation of the material included in the second layer L2 may be reduced or prevented. In addition, a phenomenon in which a silver (Ag) component included in an anode AE1' is reduced during an etching process of making the anode AE1' subject to patterning and remains as particles that cause defects may be reduced or prevented.

In one or more embodiments, the capping pattern CPP may be formed through the same process as that of the anode AE1' and may include the same material as the anode AE1'. However, this is illustrative, and the capping pattern CPP may be formed through a process different from that of the anode AE1' and may include a material different from that of the anode AE1'. The present disclosure is not limited to any one embodiment.

Figure 15A:
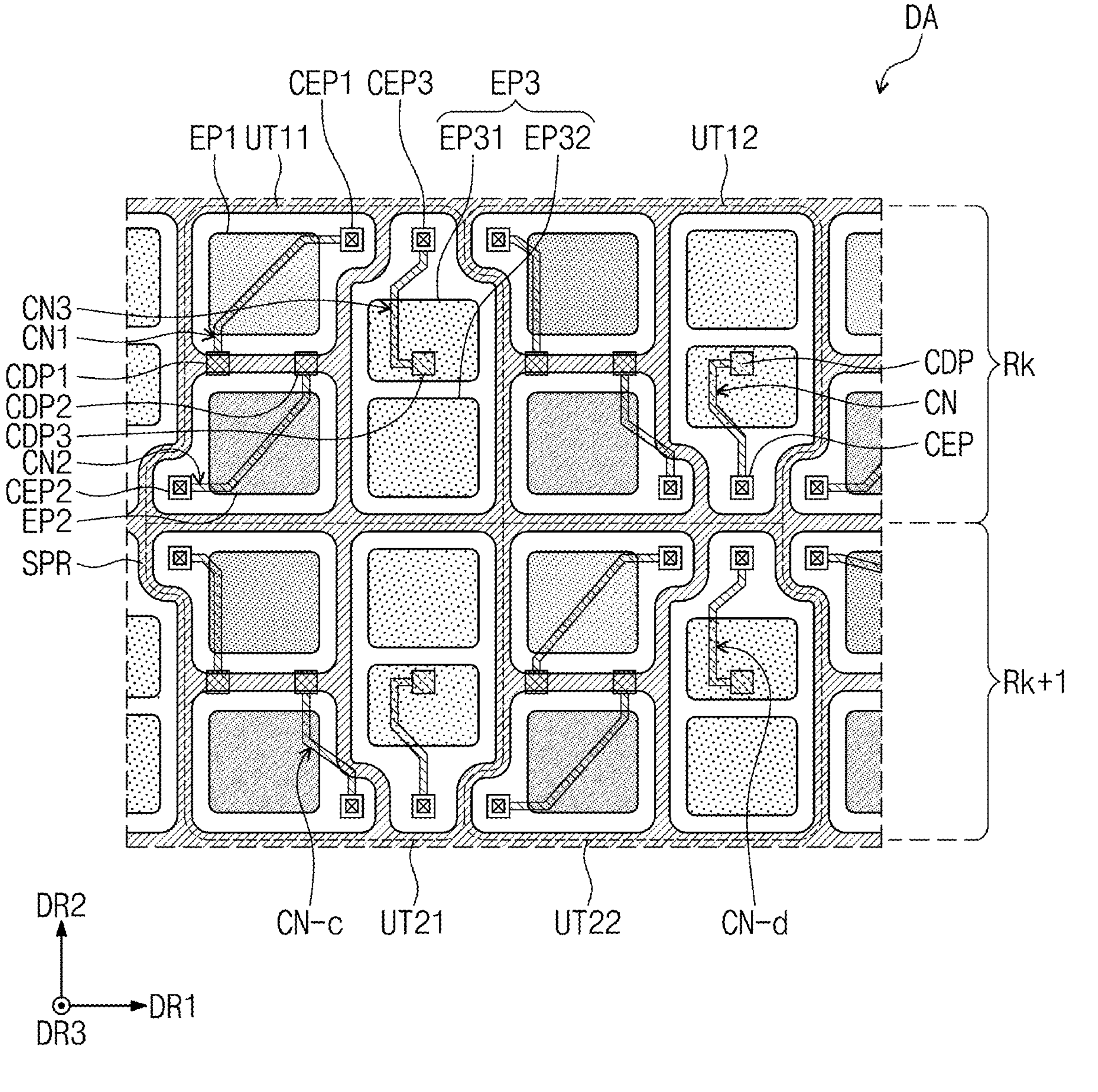
FIGS. 15A-15C are enlarged plan views of partial regions of a display panel according to one or more embodiments of the present disclosure.
Figure 15B:
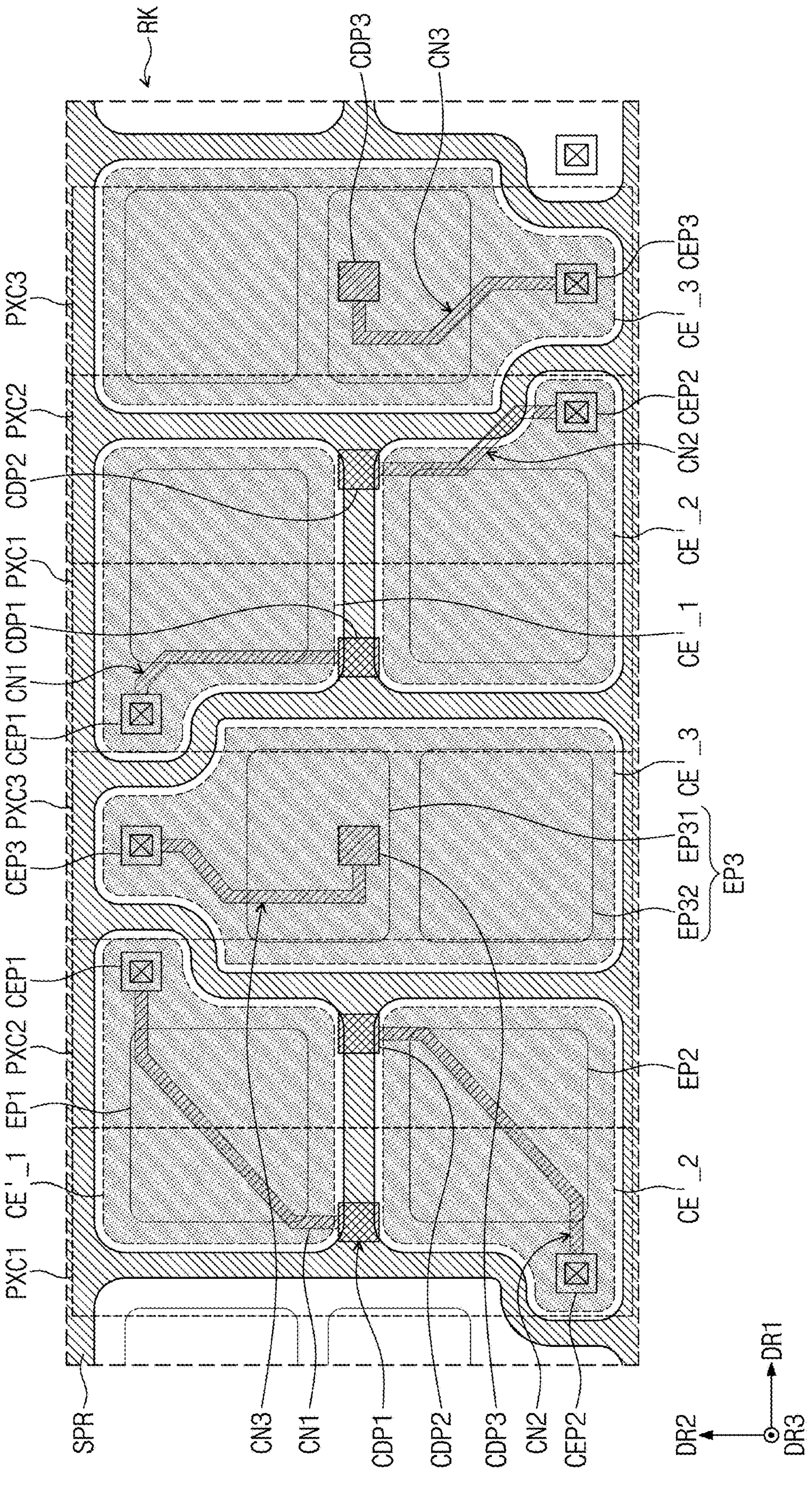
Figure 15C:
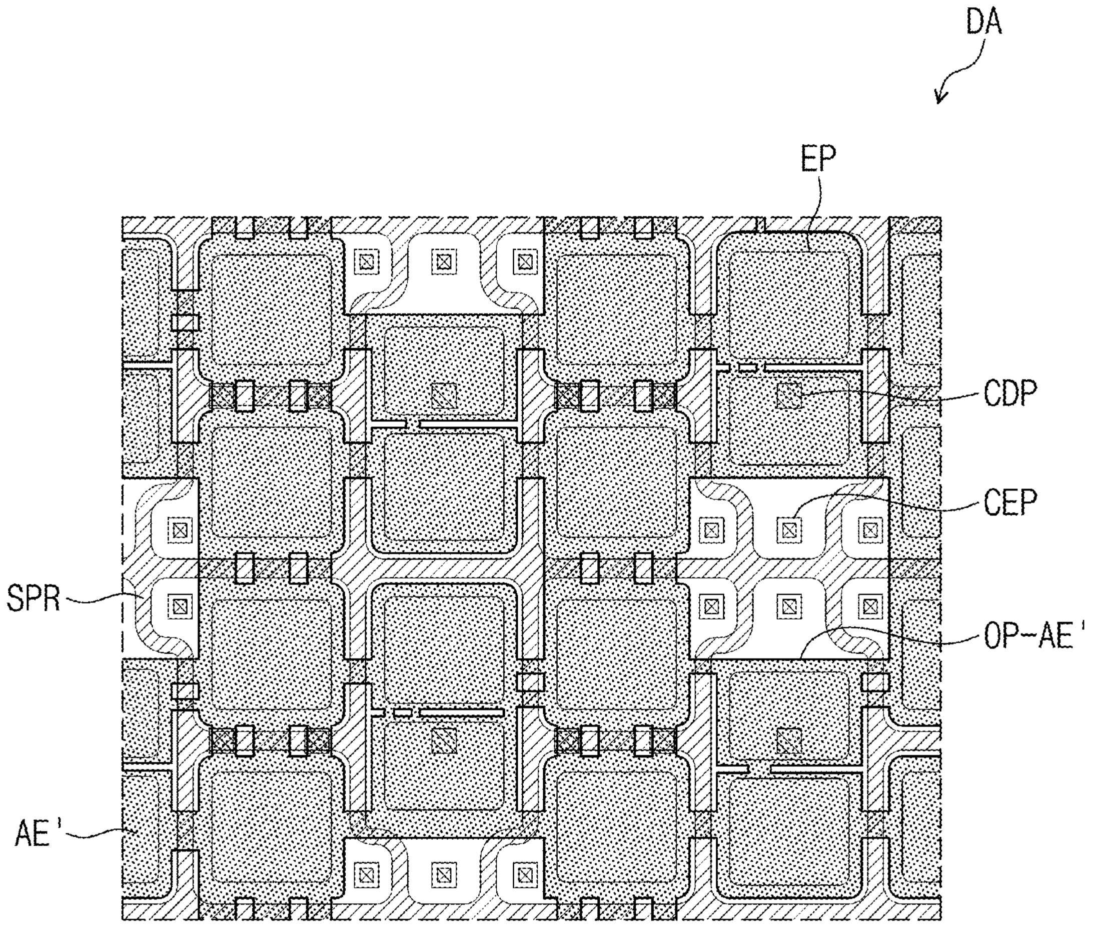

FIGS. 15A-15C are enlarged plan views of partial regions of a display panel according to one or more embodiments of the present disclosure. FIGS. 15A-15C may correspond to enlarged plan views of the display panels DP' and DP'-1 according to the embodiments described above with reference to FIGS. 12-14. FIG. 15A illustrates a region where a total of four light emitting units are arranged in two rows and two columns, and FIG. 15B illustrates an enlarged view of a partial region illustrated in FIG. 15A. In FIG. 15C, some of the components illustrated in FIG. 15A are omitted or emphasized. Hereinafter, the present disclosure will be described with reference to FIGS. 15A-15C.

In FIG. 15A, light emitting units UT11, UT12, UT21, and UT22 arranged in two rows and two columns are illustrated. Light emitting parts in the first row Rk include light emitting parts that constitute the light emitting unit UT11 at the first row and the first column and the light emitting unit UT12 at the first row and the second column, and light emitting parts in the second row Rk+1 include light emitting parts that constitute the light emitting unit UT21 at the second row and the first column and the light emitting unit UT22 at the second row and the second column. In FIG. 151B, the light emitting parts in the first row Rk are illustrated. From among the components of the display panel, a separator SPR, a plurality of light emitting parts EP1, EP2, and EP3 disposed in regions partitioned by the separator SPR, connecting lines CN1, CN2, and CN3, an anode AE', and a cathode CE' are illustrated in FIGS. 15A-15C.

As described above, each of the light emitting parts EP1, EP2, and EP3 may correspond to the light emitting opening OP-PDL (refer to FIG. 12). That is, each of the light emitting parts EP1, EP2, and EP3 may be a region where light is emitted by a light emitting element and may correspond to a unit constituting an image displayed on the display panel DP' (refer to FIG. 12). More specifically, each of the light emitting parts EP1, EP2, and EP3 may correspond to a region defined by the light emitting opening OP-PDL (refer to FIG. 12), particularly, a region defined by the lower surface of the light emitting opening OP-PDL.

The light emitting parts EP1, EP2, and EP3 may include the first light emitting part EP1, the second light emitting part EP2, and the third light emitting part EP3. The first light emitting part EP1, the second light emitting part EP2, and the third light emitting part EP3 may emit light of a first color, light of a second color, and light of a third color, respectively. The light of the first color, the light of the second color, and the light of the third color may be light of different colors. For example, the first light emitting part EP1 may emit red light, the second light emitting part EP2 may emit green light, and the third light emitting part EP3 may emit blue light. However, a combination of colors is not limited thereto. In addition, at least two of the light emitting parts EP1, EP2, and EP3 may emit light of the same color. For example, the first to third light emitting parts EP1, EP2, and EP3 may all emit blue light or white light.

Among the light emitting parts EP1, EP2, and EP3, the third light emitting part EP3 emitting the light of the third color may include two sub-light emitting parts EP31 and EP32 that are spaced (e.g., spaced apart) from each other in the second direction DR2. However, this is illustrative. Likewise to the other light emitting parts EP1 and EP2, the third light emitting part EP3 may be provided as one pattern having a one-body shape (e.g., may be integrally formed), and at least one of the other light emitting parts EP1 and EP2 may include sub-light emitting parts that are spaced (e.g., spaced apart) from each other. The present disclosure is not limited to any one embodiment.

The light emitting parts in the first row Rk may include the light emitting parts EP1, EP2, and EP3 that constitute the light emitting unit UT11 at the first row and the first column and the light emitting unit UT12 at the first row and the second column, and the light emitting parts in the second row Rk+1 may include the light emitting parts EP1, EP2, and EP3 that constitute the light emitting unit UT21 at the second row and the first column and the light emitting unit UT22 at the second row and the second column. Some of the light emitting parts in the first row Rk and some of the light emitting parts in the second row Rk+1 may have symmetrical shapes. For example, the first light emitting part EP1 and the second light emitting part EP2 of the light emitting unit UT21 at the second row and the first column and the first light emitting part EP1 and the second light emitting part EP2 of the light emitting unit UT11 at the first row and the first column may have line symmetry and arrangement with respect to an axis parallel to the second direction DR2, and the third light emitting part EP3 of the light emitting unit UT21 at the second row and the first column and the third light emitting part EP3 of the light emitting unit UT11 at the first row and the first column may have line symmetry and arrangement with respect to an axis parallel to the first direction DR1. However, this is illustrative, and the present disclosure is not limited thereto.

Hereinafter, the light emitting unit UT11 at the first row and the first column will be described. In FIG. 15B, a plurality of cathodes CE'_1, CE'_2, and CE'_3, a plurality of pixel drivers PXC1, PXC2, and PXC3, and a plurality of connecting lines CN1, CN2, and CN3 are illustrated for ease of description. The cathodes CE'_1, CE'_2, and CE'_3 may be separated from one another by the separator SPR and may be electrically disconnected from one another. In this embodiment, one light emitting unit may include three light emitting parts EP1, EP2, and EP3. Accordingly, the light emitting unit may include three cathodes CE'_1, CE'_2, and CE'_3 (hereinafter, referred to as the first to third cathodes), three pixel drivers PXC1, PXC2, and PXC3, and three connecting lines CN1, CN2, and CN3. However, this is illustrative, and the number and arrangement of light emitting units may be designed in various ways and are not limited to any one embodiment.

The first to third pixel drivers PXC1, PXC2, and PXC3 are electrically connected to light emitting elements constituting the first to third light emitting parts EP1, EP2, and EP3, respectively. The expression "connected" used herein includes not only physical direct contact but also electrical connection.

In addition, the regions where the pixel drivers PXC1, PXC2, and PXC3 are defined on the plane as illustrated in FIG. 15B may correspond to a unit in which transistors and capacitors constituting a circuit PXC (refer to FIG. 3) for driving a light emitting element of a pixel are repeatedly arranged.

The first to third pixel drivers PXC1, PXC2, and PXC3 may be sequentially arranged along the first direction DR1. The positions of the first to third pixel drivers PXC1, PXC2, and PXC3 may be independently designed irrespective of the positions and/or shapes of the first to third light emitting parts EP1, EP2, and EP3.

For example, the first to third pixel drivers PXC1, PXC2, and PXC3 may be disposed at positions different from the positions at which the regions partitioned and defined by the separator SPR, that is, the first to third cathodes CE'_1, CE'_2, and CE'_3 are disposed, and/or may be designed to have shapes and areas different from those of the first to third cathodes CE'_1, CE'_2, and CE'_3. Alternatively, the first to third pixel drivers PXC1, PXC2, and PXC3 may be disposed to overlap the positions at which the first to third light emitting parts EP1, EP2, and EP3 exist and may be designed in shapes similar to the shapes of the regions partitioned and defined by the separator SPR, for example, the first to third cathodes CE'_1, CE'_2, and CE'_3.

In this embodiment, the first to third pixel drivers PXC1, PXC2, and PXC3 are illustrated in a rectangular shape, the first to third light emitting parts EP1, EP2, and EP3 have smaller areas than the first to third pixel drivers PXC1, PXC2, and PXC3 and are arranged in a form different form that of the first to third pixel drivers PXC1, PXC2, and PXC3, and the first to third cathodes CE'_1, CE'_2, and CE'_3 are disposed at positions overlapping the first to third light emitting parts EP1, EP2 and EP3 and illustrated in an irregular shape.

Accordingly, as illustrated in FIG. 15B, the first pixel driver PXC1 may be disposed at a position that partially overlaps the first light emitting part EP1, the second light emitting part EP2, and another adjacent light emitting unit. The second pixel driver PXC2 may be disposed at a position that overlaps the first light emitting part EP1, the second light emitting part EP2, and/or the third light emitting part EP3. The third pixel driver PXC3 may be disposed at a position that overlaps the third light emitting part EP3. However, this is illustrative, and the positions of the first to third pixel drivers PXC1, PXC2, and PXC3 may be designed in various forms and arrangements independently of the light emitting parts EP1, EP2, and EP3 and are not limited to any one embodiment.

A plurality of connecting lines CN may be provided. The connecting lines CN may be spaced (e.g., spaced apart) from each other. One connecting line CN may electrically connect one of the pixel drivers PXC1, PXC2, and PXC3 and a light emitting element corresponding to the pixel driver. Specifically, the connecting line CN may correspond to a node (refer to the fourth node N4 in FIG. 3) where the light emitting element ED' (refer to FIG. 12) is connected to the pixel driver PXC (refer to FIG. 3).

The connecting line CN may include a first connection part (or, a light emitting connection part CEP) and a second connection part (or, a drive connection part CDP). The light emitting connection part CEP may be provided on one side of the connecting line CN, and the drive connection part CDP may be provided on an opposite side of the connecting line CN.

The drive connection part CDP may be a part of the connecting line CN connected with the pixel driver PXC. In this embodiment, the drive connection part CDP may be connected with one electrode of a transistor constituting the pixel driver PXC. Specifically, the drive connection part CDP may be connected to the drain of the sixth transistor T6 illustrated in FIG. 3. Accordingly, the position of the drive connection part CDP may correspond to the position of a transistor (refer to the transistor TR of FIG. 12) of the pixel driver that is physically connected with the connecting line CN. The light emitting connection part CEP may be a part of the connecting line CN connected with the light emitting element. In this embodiment, the light emitting connection part CEP may be connected with the cathode CE' (refer to FIG. 12) of the light emitting element.

The light emitting unit may include the first to third connecting lines CN1, CN2, and CN3. The first connecting line CN1 may connect the light emitting element that forms the first light emitting part EP1 and the first pixel driver PXC1, the second connecting line CN2 may connect the light emitting element that forms the second light emitting part EP2 and the second pixel driver PXC2, and the third connecting line CN3 may connect the light emitting element that forms the third light emitting part EP3 and the third pixel driver PXC3.

Specifically, the first to third connecting lines CN1, CN2, and CN3 may connect the first to third cathodes CE'_1, CE'_2, and CE'_3 and the first to third pixel drivers PXC1, PXC2, and PXC3. The first connecting line CN1 may include a first drive connection part CDP1 connected with the first pixel driver PXC1 and a first light emitting connection part CEP1 connected with the first cathode CE'_1. The second connecting line CN2 may include a second drive connection part CDP2 connected with the second pixel driver PXC2 and a second light emitting connection part CEP2 connected with the second cathode CE'_2. The third connecting line CN3 may include a third drive connection part CDP3 connected with the third pixel driver PXC3 and a third light emitting connection part CEP3 connected with the third cathode CE'_3.

The first to third drive connection parts CDP1, CDP2, and CDP3 may be aligned in the first direction DR1. As described above, the first to third drive connection parts CDP1, CDP2, and CDP3 may correspond to the positions of connection transistors constituting the first to third pixel drivers PXC1, PXC2, and PXC3, respectively. In one pixel, a connection transistor may be a transistor that includes, as one electrode, a connection node to which a pixel driver and a light emitting element are connected and may correspond to, for example, the sixth transistor T6 of FIG. 3. According to the present disclosure, the shapes, positions, and/or arrangements of pixel drivers of all pixels may be simply configured and designed irrespective of the shapes, sizes, and/or emission colors of light emitting parts.

In this embodiment, the first to third light emitting connection parts CEP1, CEP2, and CEP3 may be disposed at positions not overlapping the light emitting parts EP1, EP2, and EP3 when viewed from above the plane (e.g., in a plan view). As will be described below, each of the light emitting connection parts CEP1, CEP2, and CEP3 of the connecting line CN may be a part to which the light emitting element ED' (refer to FIG. 12) is connected and in which the tip portion TP (refer to FIG. 12) is defined and therefore may be provided at a position not overlapping the light emitting opening OP-PDL (refer to FIG. 12). That is, the light emitting connection parts CEP1, CEP2, and CEP3 may be disposed at positions that are spaced (e.g., spaced apart) from the light emitting parts EP1, EP2, and EP3 in the cathodes CE'_1, CE'_2, and CE'_3, and the cathodes CE'_1, CE'_2, and CE'_3 may include partial regions protruding from the light emitting parts EP1, EP2, and EP3 when viewed from above the plane (e.g., in a plan view) to connect with the connecting lines CN1, CN2, and CN3 at the positions where the light emitting connection parts CEP1, CEP2, and CEP3 are disposed.

For example, the first cathode CE'_1 may include, at a position not overlapping the first light emitting part EP1, a protrusion protruding from the first light emitting part EP1 to connect with the first connecting line CN1 at the position where the first light emitting connection part CEP1 is disposed, and the first light emitting connection part CEP1 may be provided on the protrusion.

In addition, the first drive connection part CDP1 where the first pixel driver PXC1, particularly, the first connecting line CN1 is connected with the transistor TR (refer to FIG. 12) may be defined at a position not overlapping the first light emitting part EP1 when viewed from above the plane (e.g., in a plan view). According to this embodiment, the first connecting line CN1 may be disposed on the first light emitting part EP1, and the first cathode CE'_1 and the first pixel driver PXC1 that are spaced (e.g., spaced apart) from each other may be easily connected.

In one or more embodiments, the third drive connection part CDP3 where the third pixel driver PXC3, particularly, the third connecting line CN3 is connected with the transistor TR may be defined at a position not overlapping the third light emitting connection part CEP3 and disposed at a position overlapping the third light emitting part EP3 when viewed from above the plane (e.g., in a plan view). According to this embodiment, the third cathode CE'_3 and the pixel driver PXC3 may be connected through the third connecting line CN3. Accordingly, in the design of the pixel driver PXC3, restrictions depending on the position or shape of the third light emitting part EP3 may be reduced, and thus the degree of freedom in design may be improved.

Referring again to FIG. 15A, the light emitting parts in the second row Rk+1 may include light emitting parts having line symmetry and arrangement with the light emitting units UT11 and UT12 in the first row with respect to an axis parallel to the first direction DR1 or the second direction DR2. In this case, due to the shapes and arrangement of the light emitting units UT11 and UT12 in the first row, the light emitting units UT21 and UT22 in the second row may be substantially constituted by light emitting parts having a form in which the light emitting units UT11 and UT12 in the first row are shifted in the first direction DR1 and/or the second direction DR2. That is, the light emitting unit UT21 at the second row and the first column may be constituted by light emitting parts having the same shape as the light emitting unit UT12 at the first row and the second column, and the light emitting unit UT22 at the second row and the second column may be constituted by light emitting parts having the same shape as the light emitting unit UT11 at the first row and the first column.

Accordingly, connecting lines CN-c disposed in the light emitting unit UT21 at the second row and the first column may have the same shape and arrangement as the connecting lines CN1, CN2, and CN3 disposed in the light emitting unit UT12 at the first row and the second column. Likewise, connecting lines CN-d disposed in the light emitting unit UT22 at the second row and the second column may have the same shape and arrangement as the connecting lines CN1, CN2, and CN3 disposed in the light emitting unit UT11 at the first row and the first column.

Referring to FIG. 15C, the anode AE' of the light emitting element according to one or more embodiments of the present disclosure may be commonly provided for the plurality of light emitting parts EP1, EP2, and EP3. That is, the anode AE' may be formed as one integrated layer in the entire display region DA. Accordingly, the layer of the anode AE' may be disposed to overlap the separator SPR. Alternatively, the anodes AE' of the light emitting elements may be formed as independent conductive patterns that are spaced (e.g., spaced apart) from one another and may be electrically connected with one another through other conductive layers. Accordingly, the patterns of the anodes AE' may be disposed so as not to overlap the separator SPR.

As described above, the first drive voltage ELVDD (refer to FIG. 3) may be applied to the anode AE', and a common voltage may be provided to all of the light emitting parts. The anode AE' may be connected with the first power line PL1 (refer to FIG. 3), which provides the first drive voltage ELVDD (refer to FIG. 3), in the non-display region NDA (refer to FIG. 1) or may be connected with the first power line PL1 (refer to FIG. 3) in the display region DA and is not limited to any one embodiment. In the latter case, the first power line PL1 (refer to FIG. 3) may be disposed in the non-display region NDA (refer to FIG. 1), and the anode AE' may have a shape that extends to the non-display region NDA (refer to FIG. 1).

In the sectional views of FIGS. 12 and 14, the anode AE' is illustrated as overlapping the light emitting opening OP-PDL and not overlapping the separator SPR. However, as illustrated in FIG. 15C, the anodes AE' of the light emitting elements may have a one-body shape and may have a mesh or grid shape in which openings are defined in a partial region. That is, as long as the same first drive voltage ELVDD (refer to FIG. 3) is capable of being applied to the anode AE' of each of the plurality of light emitting elements, the shape of the anode AE' may be provided in various ways and is not limited to any one embodiment.

In one or more embodiments, a plurality of openings OP-AE' may be defined in the anode AE' according to this embodiment. The openings OP-AE' may penetrate the layer of the anode AE'. The openings OP-AE' in the layer of the anode AE' may be disposed at positions not overlapping the light emitting parts EP and may be defined at positions overlapping the separator SPR. The openings may facilitate releasing gas generated from an organic layer disposed under the anode AE', for example, the upper insulating layer UIL (refer to FIG. 12) that will be described below. Accordingly, the gas of the organic layer disposed under the light emitting element may be sufficiently discharged in a process of manufacturing the display panel, and gas discharged from the organic layer after the manufacture of the display panel may be reduced. Thus, the speed at which the light emitting element is degraded may be decreased.

According to this embodiment, the connecting line may be included between the light emitting element and the pixel driver. Accordingly, the light emitting element may be easily connected to the pixel driver even though only the shape of the cathode is changed without a change in the arrangement and/or shapes of the light emitting parts. Thus, the degree of freedom in design regarding the arrangement of the pixel driver may be improved, and the area or resolution of the light emitting part of the display panel may be easily increased.

Figure 16A:
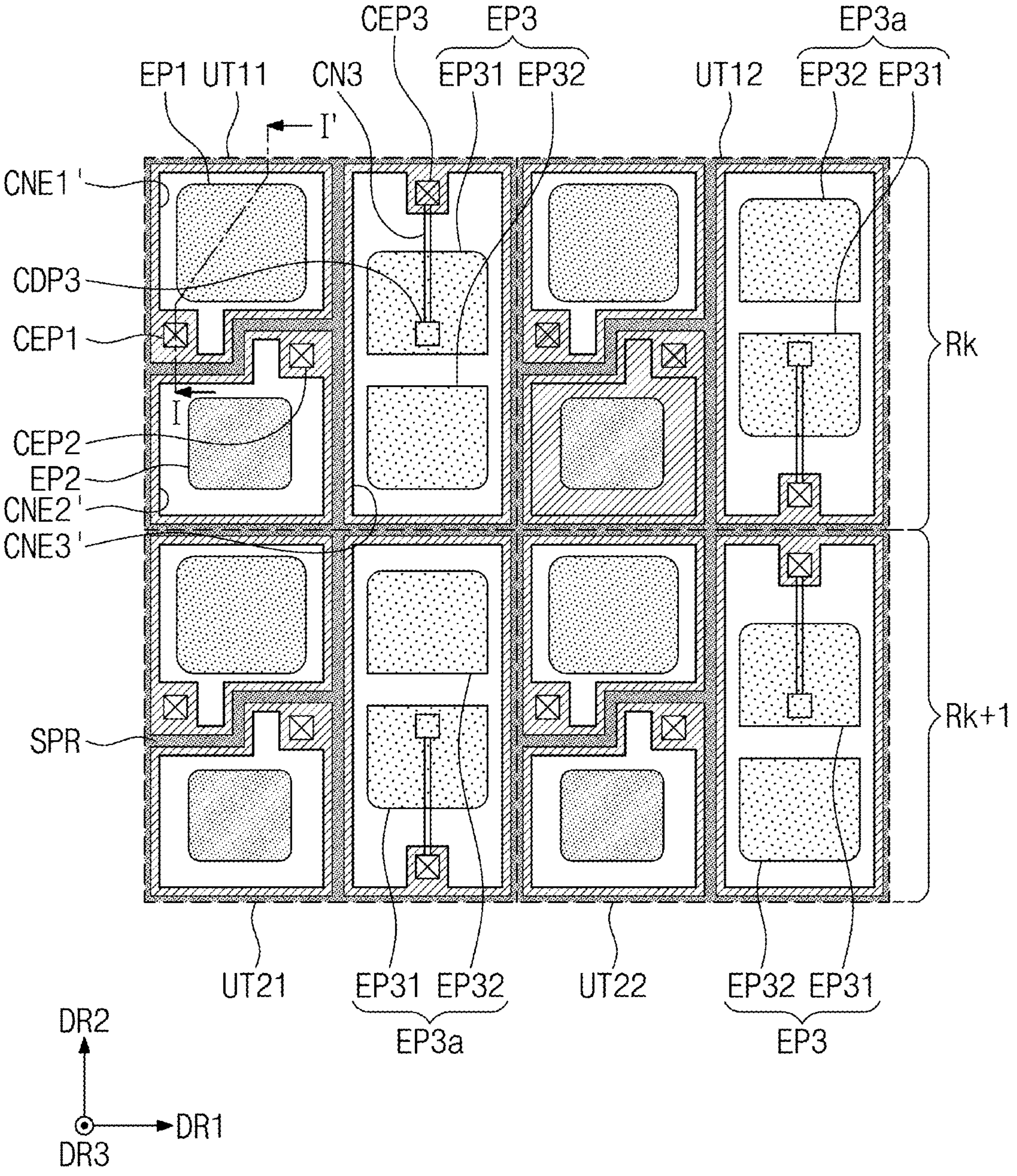
FIGS. 16A-16D are enlarged plan views of partial regions of a display panel according to one or more embodiments of the present disclosure.
Figure 16B:
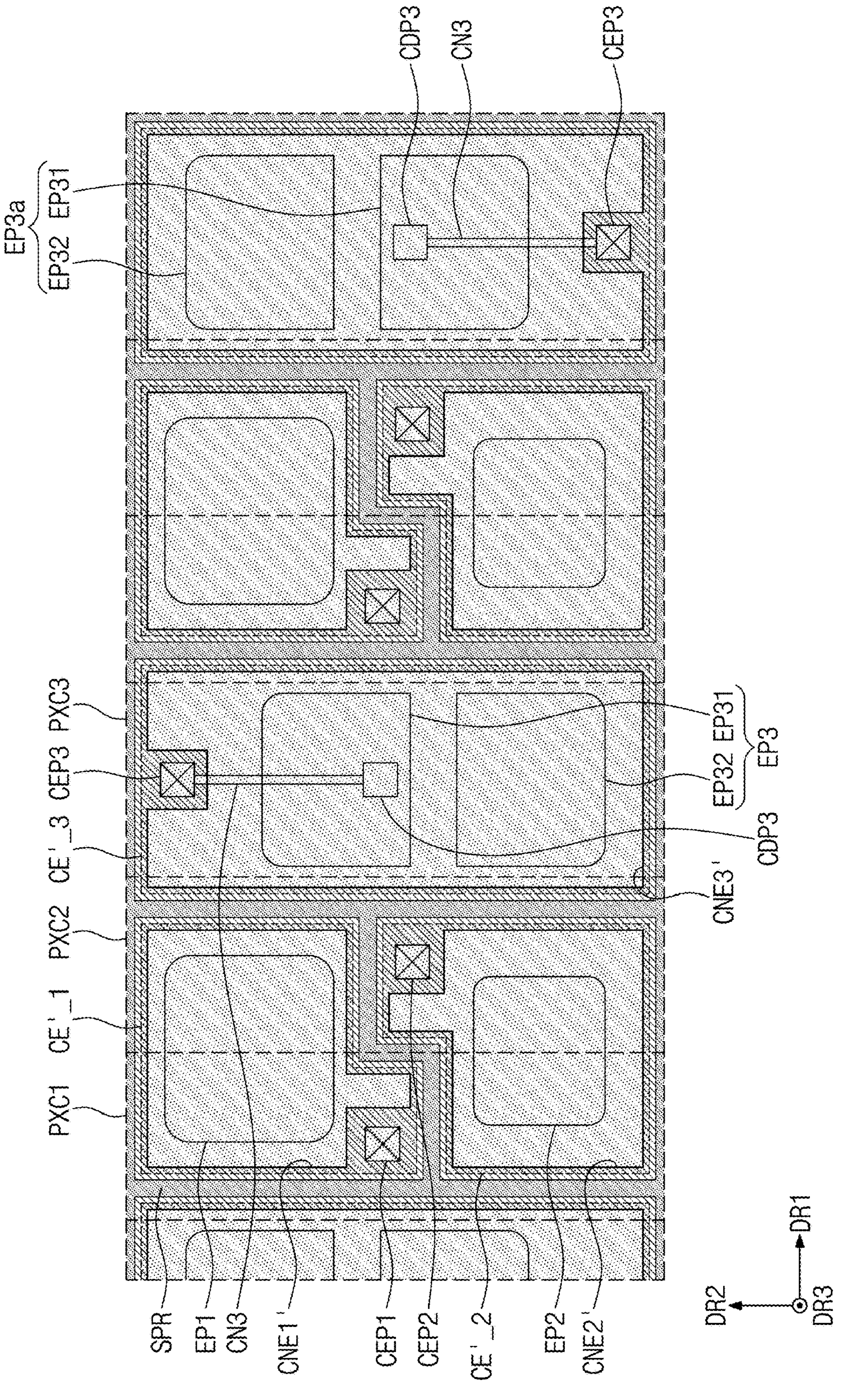
Figure 16C:
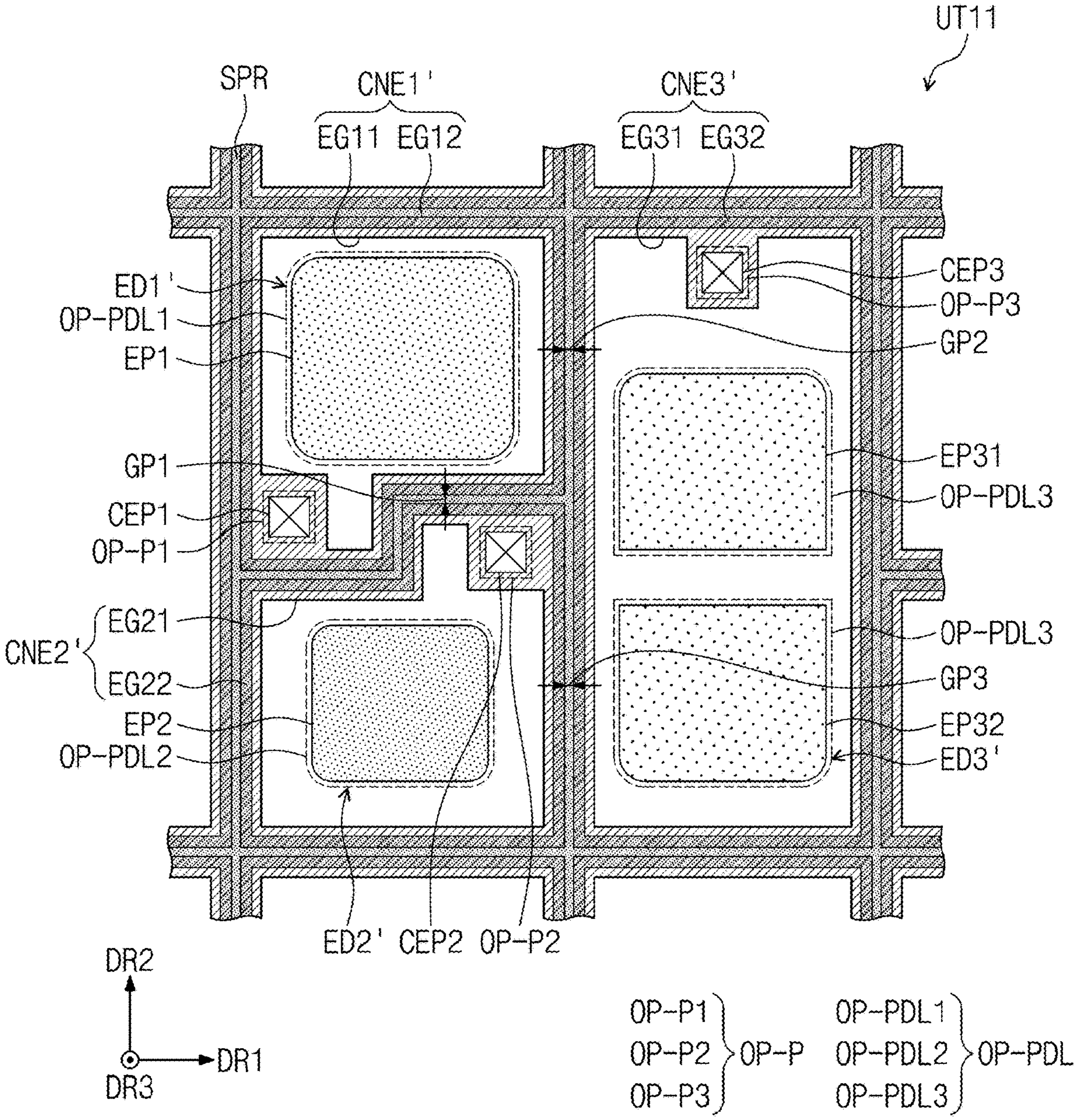

FIGS. 16A-16D are enlarged plan views of partial regions of a display panel according to one or more embodiments of the present disclosure. In FIG. 16A, light emitting units UT11, UT12, UT21, and UT22 arranged in two rows and two columns are illustrated. In FIG. 16B, light emitting parts arranged in one row are illustrated. In FIG. 16B, a plurality of cathodes CE'_1, CE'_2, and CE'_3, a plurality of pixel drivers PXC1, PXC2, and PXC3, first to third connecting electrodes CNE1', CNE2', and CNE3', and a separator SPR are illustrated for ease of description. From among the components of the display panel, the separator SPR, a plurality of light emitting parts EP1, EP2, and EP3 disposed in regions partitioned by the separator SPR, and the plurality of connecting electrodes CNE1', CNE2', and CNE3' are illustrated in FIG. 16C. In describing FIGS. 16A-16D, components identical to the components described with reference to FIGS. 12-15C will be assigned with identical reference numerals, and descriptions thereabout will be omitted. The following description will be focused on differences.

The light emitting unit UT11 may include three cathodes CE'_1, CE'_2, and CE'_3 (hereinafter, referred to as the first to third cathodes), three pixel drivers PXC1, PXC2, and PXC3, and three connecting electrodes CNE1', CNE2', and CNE3'. However, this is illustrative, and the number and arrangement of light emitting parts included in the light emitting unit UT11 may be designed in various ways and are not limited to any one embodiment.

The light emitting unit UT11 may include the first to third connecting electrodes CNE1', CNE2', and CNE3'. The first connecting electrode CNE1' may electrically connect a first light emitting element ED1' that forms the first light emitting part EP1 and the first pixel driver PXC1, the second connecting electrode CNE2' may electrically connect a second light emitting element ED2' that forms the second light emitting part EP2 and the second pixel driver PXC2, and the third connecting electrode CNE3' may electrically connect a third light emitting element ED3' that forms the third light emitting part EP3 and the third pixel driver PXC3.

Specifically, the first to third connecting electrodes CNE1', CNE2', and CNE3' may electrically connect the first to third cathodes CE'_1, CE'_2, and CE'_3 and the first to third pixel drivers PXC1, PXC2, and PXC3 in a one-to-one correspondence.

Figure 17:
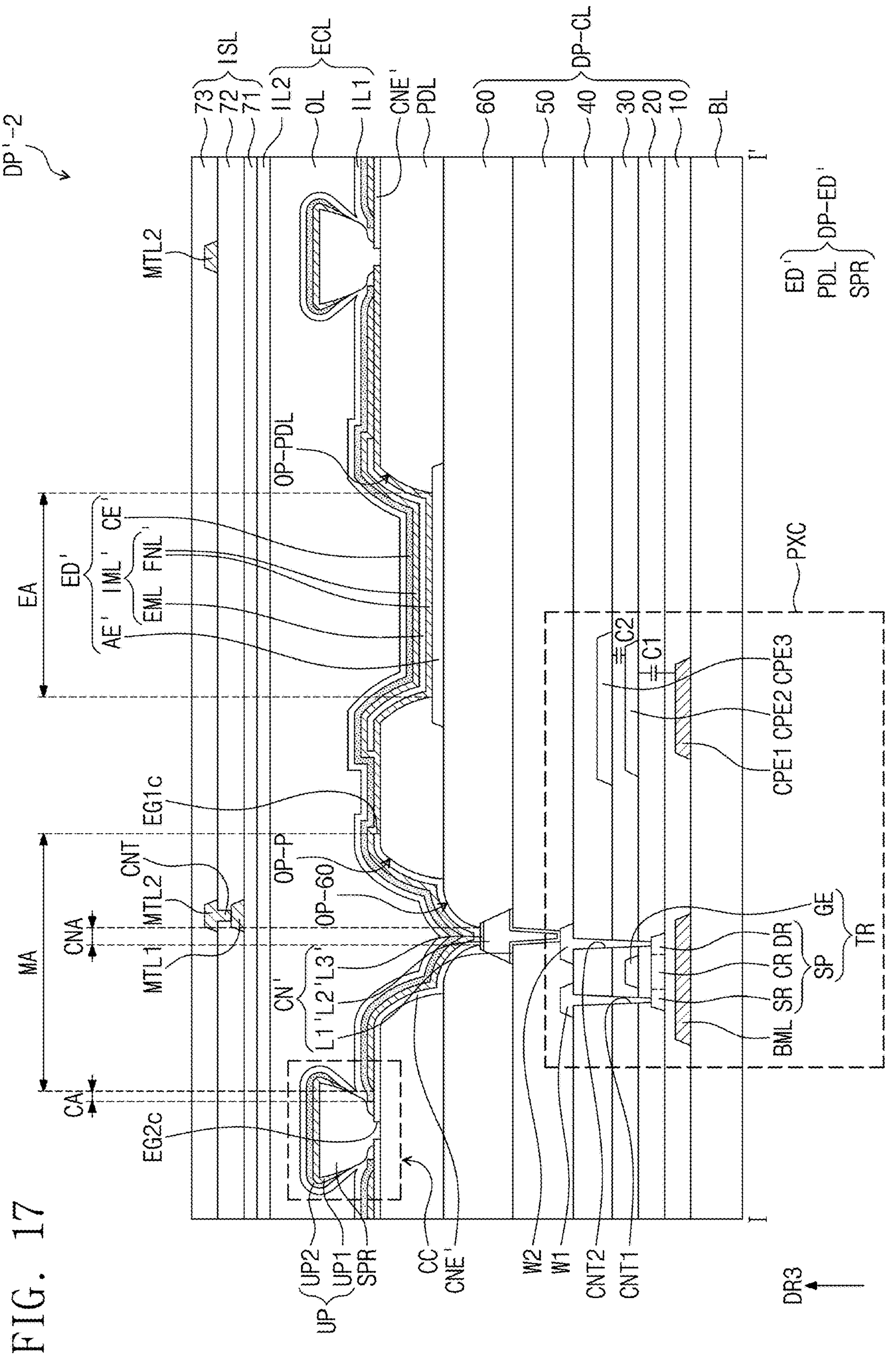
FIG. 17 is a sectional view of a display panel according to one or more embodiments of the present disclosure.

Each of the first to third connecting electrodes CNE1', CNE2', and CNE3' may be disposed on the pixel defining layer PDL (refer to FIG. 17). The first to third connecting electrodes CNE1', CNE2', and CNE3' may have ring shapes that is around (e.g., that surrounds) the corresponding first to third light emitting parts EP1, EP2, and EP3. In one or more embodiments of the present disclosure, each of the first to third connecting electrodes CNE1', CNE2', and CNE3' is illustrated as having a closed-line ring shape, but is not limited thereto. For example, at least some of the first to third connecting electrodes CNE1', CNE2', and CNE3' may have an open ring shape with a portion broken.

Because the first to third connecting electrodes CNE1', CNE2', and CNE3' have a ring shape, the degree of freedom of the positions at which the first to third connecting electrodes CNE1', CNE2', and CNE3' and the first to third pixel drivers PXC1, PXC2, and PXC3 are connected may be improved. For example, the first connecting electrode CNE1' may be connected to the first pixel driver PXC1 through a first light emitting connection part CEP1 (or, a first connection part), the second connecting electrode CNE2' may be connected to the second pixel driver PXC2 through a second light emitting connection part CEP2 (or, a second connection part), and the third connecting electrode CNE3' may be connected to the third pixel driver PXC3 through a connecting line CN3. That is, connecting lines additionally connected to the first and second connecting electrodes CNE1' and CNE2' may be omitted.

The connecting line CN3 may electrically connect the third pixel driver PXC3 and the third light emitting element ED3' constituting the third light emitting part EP3. The connecting line CN3 may include a third light emitting connection part CEP3 (or, a third connection part) and a drive connection part CDP3. The third light emitting connection part CEP3 may be provided on one side of the connecting line CN3, and the drive connection part CDP3 may be provided on an opposite side of the connecting line CN3.

The drive connection part CDP3 may be a part of the connecting line CN3 connected with the pixel driver PXC3. In this embodiment, the drive connection part CDP3 may be connected with one electrode of a transistor constituting the pixel driver PXC3. The position of the drive connection part CDP3 may correspond to the position of the transistor of the pixel driver that is physically connected with the connecting line CN3. The third light emitting connection part CEP3 may be a part of the connecting line CN3 connected with the third light emitting element ED3'. In this embodiment, the third light emitting connection part CEP3 may be connected with the third connecting electrode CNE3'.

The first connecting electrode CNE1' may include a first edge EG11 around (e.g., surrounding) at least a portion of the first light emitting part EP1 and a second edge EG12 around (e.g., surrounding) the first edge EG11. The second connecting electrode CNE2' may include a first edge EG21 around (e.g., surrounding) at least a portion of the second light emitting part EP2 and a second edge EG22 around (e.g., surrounding) the first edge EG21. The third connecting electrode CNE3' may include a first edge EG31 around (e.g., surrounding) at least a portion of the third light emitting part EP3 (e.g., EP31, EP32) and a second edge EG32 around (e.g., surrounding) the first edge EG31.

The first to third connecting electrodes CNE1', CNE2', and CNE3' may be arranged so as to be spaced (e.g., spaced apart) from one another. For example, the gaps GP1, GP2, and GP3 between the first to third connecting electrodes CNE1', CNE2', and CNE3' may overlap the separator SPR. For example, the first edges EG11, EG21, and EG31 of the first to third connecting electrodes CNE1', CNE2', and CNE3' may not be covered by the separator SPR, and the second edges EG12, EG22, and EG32 of the first to third connecting electrodes CNE1', CNE2', and CNE3' may overlap the separator SPR. Alternatively, the second edges EG12, EG22, and EG32 of the first to third connecting electrodes CNE1', CNE2', and CNE3' may be covered by the separator SPR.

In one or more embodiments of the present disclosure, the first to third light emitting connection parts CEP1, CEP2, and CEP3 may be disposed at positions not overlapping the first to third light emitting parts EP1, EP2, and EP3 when viewed from above the plane (e.g., in a plan view). For example, a light emitting opening OP-PDL and through-holes OP-P spaced (e.g., spaced apart) from the light emitting opening OP-PDL may be defined in the pixel defining layer PDL (refer to FIG. 17).

The though-holes OP-P may include a first through-hole OP-P1, a second through-hole OP-P2, and a third through-hole OP-P3. The first to third light emitting connection parts CEP1, CEP2, and CEP3 may be arranged to correspond to the first to third through-holes OP-P1, OP-P2, and OP-P3, respectively. The light emitting opening OP-PDL may include a first light emitting opening OP-PDL1, a second light emitting opening OP-PDL2, and a third light emitting opening OP-PDL3. The first to third light emitting parts EP1, EP2, and EP3 may be defined to correspond to the first to third light emitting openings OP-PDL1, OP-PDL2, and OP-PDL3, respectively. Accordingly, the first to third light emitting connection parts CEP1, CEP2, and CEP3 may be disposed at positions that are spaced (e.g., spaced apart) from the first to third light emitting parts EP1, EP2, and EP3.

The first to third connecting electrodes CNE1', CNE2', and CNE3' may be disposed on the pixel defining layer PDL (refer to FIG. 17). When viewed from above the plane (e.g., in a plan view), the first connecting electrode CNE1' may be around (e.g., may surround) the first light emitting opening OP-PDL1, the second connecting electrode CNE2' may be around (e.g., may surround) the second light emitting opening OP-PDL2, and the third connecting electrode CNE3' may be around (e.g., may surround) the third light emitting openings OP-PDL3.

According to one or more embodiments of the present disclosure, the third drive connection part CDP3 where the connecting line CN3 is connected with a transistor TR (refer to FIG. 17) of the third pixel driver PXC3 may be defined at a position not overlapping the third light emitting connection part CEP3 and disposed at a position overlapping the third light emitting part EP3 when viewed from above the plane (e.g., in a plan view). For example, the connecting line CN3 may correspond to a connecting line CN-ad illustrated in FIG. 19, the drive connection part CDP3 may correspond to a part making contact with an intermediate connecting electrode CN' illustrated in FIG. 19, and the third light emitting connection part CEP3 may correspond to a part making contact with a connecting electrode CNEa' illustrated in FIG. 19. The third cathode CE'_3 and the pixel driver PXC3 may be connected through the connecting line CN3. Accordingly, in the design of the pixel driver PXC3, restrictions depending on the position and/or shape of the third light emitting part EP3 may be reduced, and thus the degree of freedom in design may be improved.

The first to third cathodes CE'_1, CE'_2, and CE'_3 may be connected with the first to third connecting electrodes CNE1', CNE2', and CNE3'. For example, the lower surfaces of the first to third cathodes CE'_1, CE'_2, and CE'_3 may be connected with (or, brought into contact with) the upper surfaces of the first to third connecting electrodes CNE1', CNE2', and CNE3'. Accordingly, the contact reliability (or, connection stability) of the first to third cathodes CE'_1, CE'_2, and CE'_3 and the first to third connecting electrodes CNE1', CNE2', and CNE3' may be further improved.

In addition, the connection regions where the first to third cathodes CE'_1, CE'_2, and CE'_3 and the first to third connecting electrodes CNE1', CNE2', and CNE3' are connected may be around (e.g., may surround) at least portions of the first to third light emitting openings OP-PDL1, OP-PDL2, and OP-PDL3. The first to third cathodes CE'_1, CE'_2, and CE'_3 and the first to third connecting electrodes CNE1', CNE2', and CNE3' may be connected in regions adjacent to the separator SPR, and the connection regions may be defined adjacent to the separator SPR. That is, the first to third cathodes CE'_1, CE'_2, and CE'_3 and the first to third connecting electrodes CNE1', CNE2', and CNE3' may not be connected at specific points and may be connected over relatively wide regions, for example, regions similar to the shapes of the first to third connecting electrodes CNE1', CNE2', and CNE3'. That is, the areas of the connection regions may be increased, and thus the connection may be stably performed.

Figure 16D:
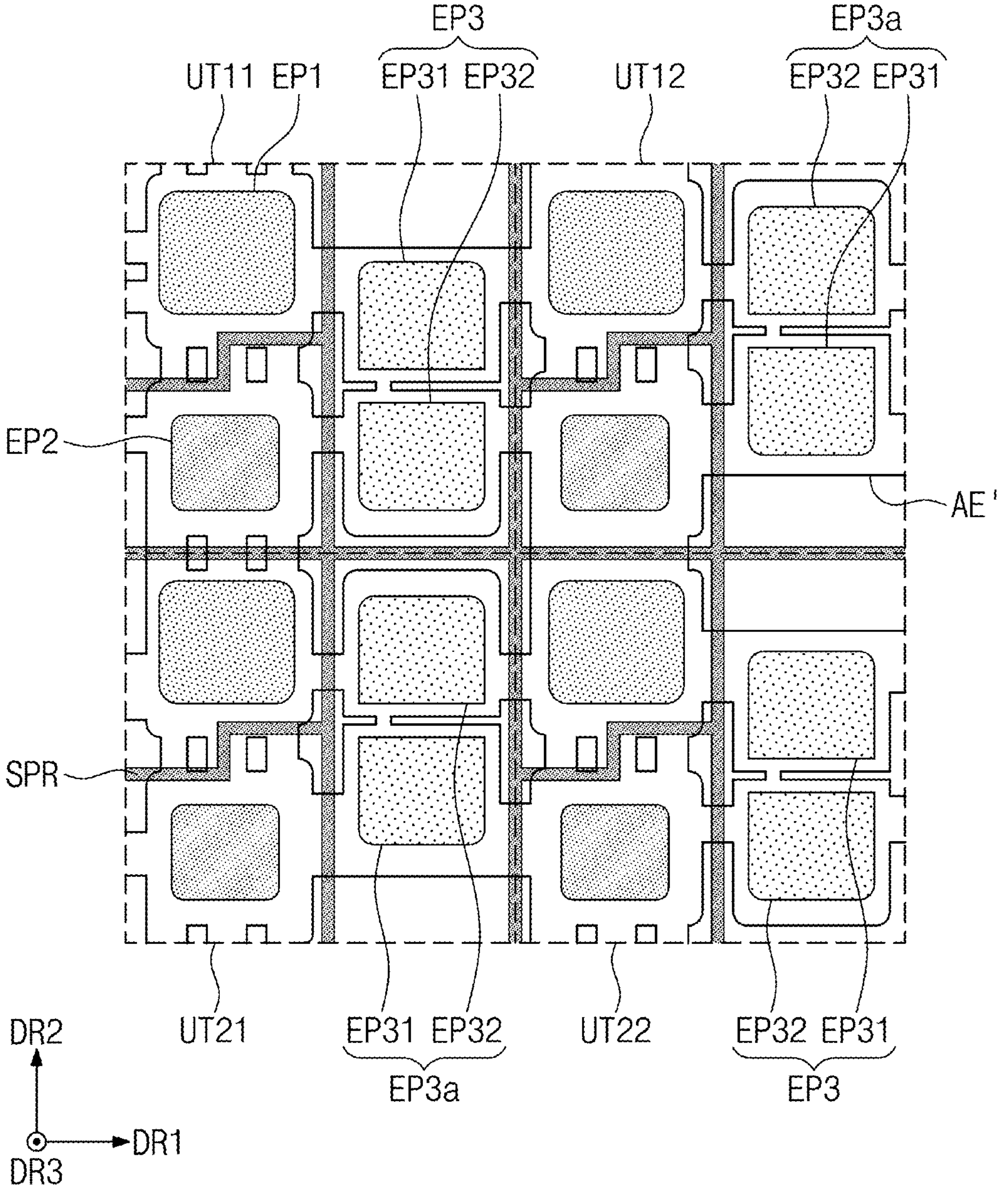

In FIG. 16D, the separator SPR, the light emitting parts EP1, EP2, and EP3, and the layer of the anode AE' are illustrated. Referring to FIG. 16D, an anode AE' of a light emitting element ED' (refer to FIG. 17) according to one or more embodiments of the present disclosure may be commonly provided for the first to third light emitting parts EP1, EP2, and EP3. That is, the anode AE' may be formed as one integrated layer in the entire display region DA. Accordingly, the layer of the anode AE' may be disposed to overlap the separator SPR. Alternatively, the anodes AE' of the light emitting elements may be formed as independent conductive patterns that are spaced (e.g., spaced apart) from one another and may be electrically connected with one another through other conductive layers. Accordingly, the patterns of the anodes AE' may be disposed so as not to overlap the separator SPR.

In one or more embodiments, a plurality of openings may be defined in the anode AE' according to this embodiment. The openings may penetrate the layer of the anode AE'. The openings in the layer of the anode AE' may be disposed at positions not overlapping the light emitting parts EP1, EP2, and EP3 and may be defined at positions overlapping the separator SPR.

Figure 18:
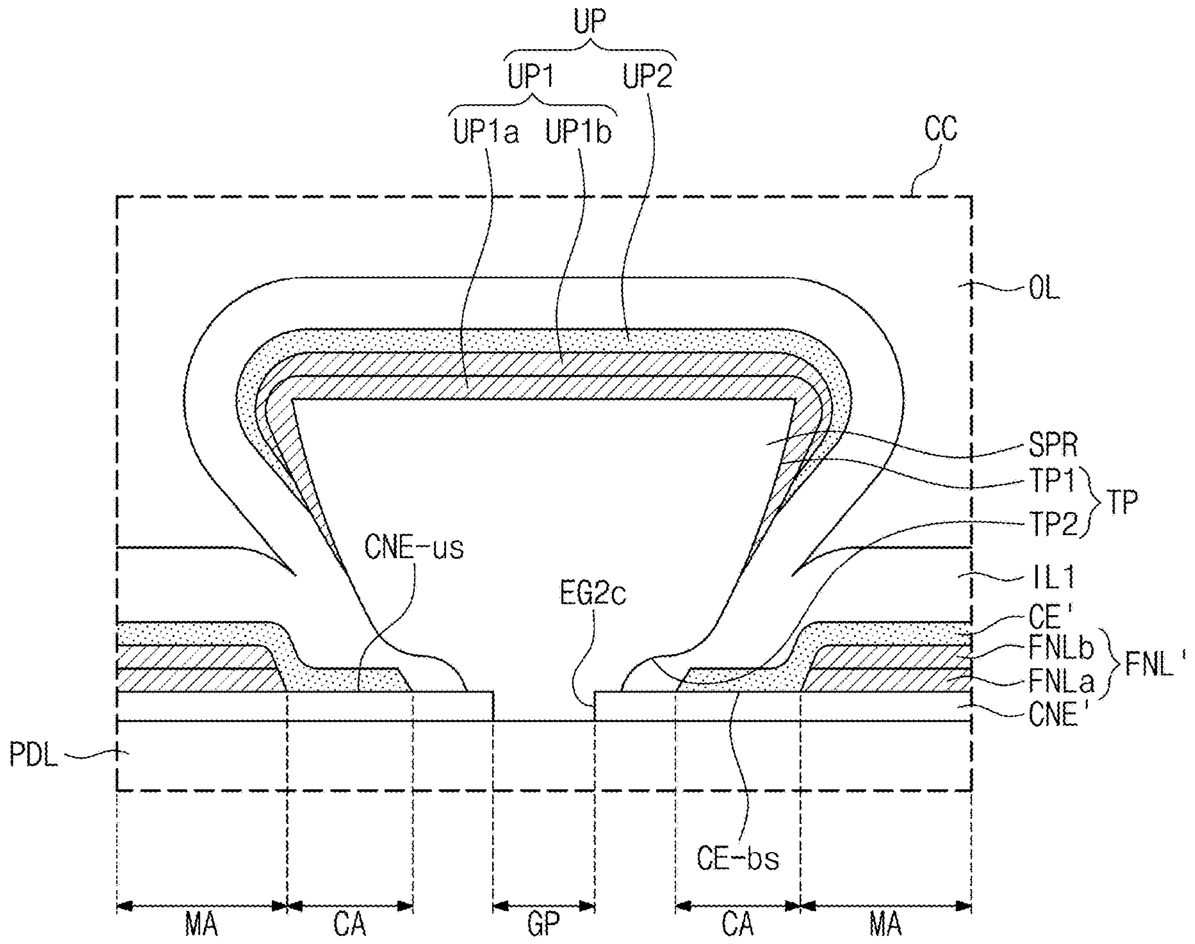
FIG. 18 is an enlarged sectional view of a partial region of the display panel according to one or more embodiments of the present disclosure.

FIG. 17 is a sectional view of a display panel according to one or more embodiments of the present disclosure. FIG. 18 is an enlarged sectional view of a partial region of the display panel according to one or more embodiments of the present disclosure. FIG. 17 illustrates a sectional view illustrating a portion corresponding to line I-I' of FIG. 16A.

FIG. 18 illustrates an enlarged sectional view of region CC of FIG. 17. In describing FIGS. 17 and 18, components identical to the components described with reference to FIGS. 12-16D will be assigned with identical reference numerals, and descriptions thereabout will be omitted. The following description will be focused on differences.

Referring to FIGS. 17 and 18, the display panel DP'-2 of one or more embodiments may include a base layer BL, a circuit element layer DP-CL', an intermediate connecting electrode CN', a connecting electrode CNE', a display element layer DP-ED', an encapsulation layer ECL, and a sensing layer ISL. However, this is illustrative, and in one or more embodiments of the present disclosure, the display panel DP'-2 may not include the sensing layer ISL. The circuit element layer DP-CL' may include a plurality of insulating layers 10, 20, 30, 40, 50, and 60 disposed on the base layer BL and a plurality of conductive patterns and semiconductor patterns disposed between the insulating layers 10, 20, 30, 40, 50, and 60.

The intermediate connecting electrode CN' may be disposed on the fifth insulating layer 50. The intermediate connecting electrode CN' may electrically connect a pixel driver PXC and a light emitting element ED'. That is, the intermediate connecting electrode CN' may electrically connect a connection transistor TR and the light emitting element ED'. The intermediate connecting electrode CN' may be a connection node that connects the pixel driver PXC and the light emitting element ED'. For example, the intermediate connecting electrode CN' may correspond to the fourth node N4 illustrated in FIG. 3.

The sixth insulating layer 60 may be disposed on the intermediate connecting electrode CN'. The sixth insulating layer 60 may be disposed on the fifth insulating layer 50 and may cover at least a portion of the intermediate connecting electrode CN'. The fifth insulating layer 50 and the sixth insulating layer 60 may be organic layers. For example, each of the fifth insulating layer 50 and the sixth insulating layer 60 may include a general purpose polymer, such as benzocyclobutene (BCB), polyimide, hexamethyldisiloxane (HMDSO), Polymethylmethacrylate (PMMA), or Polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, and/or a blend thereof.

A through-hole OP-60 for exposing at least a portion of the intermediate connecting electrode CN' may be formed in the sixth insulating layer 60. The intermediate connecting electrode CN' may be connected to the connecting electrode CNE' through the portion exposed from the sixth insulating layer 60 and may be electrically connected with the light emitting element ED'. That is, the intermediate connecting electrode CN', together with the connecting electrode CNE', may electrically connect the connection transistor TR and the light emitting element ED'. In one or more embodiments, in the display panel DP'-2 according to one or more embodiments of the present disclosure, the sixth insulating layer 60 may be omitted, and/or a plurality of sixth insulating layers 60 may be provided. However, the present disclosure is not limited to any one embodiment. When the sixth insulating layer 60 is omitted, the intermediate connecting electrode CN' may also be omitted.

The intermediate connecting electrode CN' may include a first layer L1', a second layer L2', and a third layer L3' sequentially stacked in the third direction DR3. The second layer L2' may include a material different from that of the first layer L1'. In addition, the second layer L2' may include a material different from that of the third layer L3'. The second layer L2' may have a greater thickness than the first layer L1'. In addition, the second layer L2' may have a greater thickness than the third layer L3'. The second layer L2' may include a highly conductive material. In one or more embodiments, the second layer L2' may include aluminum (Al).

The connecting electrode CNE' may be disposed on the pixel defining layer PDL. The connecting electrode CNE' may electrically connect the pixel driver PXC and the light emitting element ED'. That is, the pixel driver PXC may be electrically connected to the light emitting element ED' through the intermediate connecting electrode CN' and the connecting electrode CNE'. The connecting electrode CNE' may correspond to the first connecting electrode CNE1' illustrated in FIG. 16A. The second connecting electrode CNE2' (refer to FIG. 16A) and the third connecting electrode CNE3' (refer to FIG. 16A) may also have a structure similar to that of the connecting electrode CNE'.

The connecting electrode CNE' may include a first edge EG1*c* adjacent to a light emitting opening OP-PDL and a second edge EG2*c* around (e.g., surrounding) the first edge EG1*c*. A cathode CE' of the light emitting element ED' may be brought into contact with the connecting electrode CNE' in a region adjacent to the second edge EG2*c*.

The connecting electrode CNE' may include transparent conductive oxide (TCO) such as indium tin oxide (ITO), indium zinc oxide (IZO), indium gallium zinc oxide (IGZO), zinc oxide (ZnOx), and/or indium oxide ($In_2O_3$). However, the material of the connecting electrode CNE' is not limited to the aforementioned examples.

The display element layer DP-ED' may be disposed on the circuit element layer DP-CL'. The display element layer DP-ED' may include the pixel defining layer PDL, the light emitting element ED', and a separator SPR.

A through-hole OP-P spaced (e.g., spaced apart) from the light emitting opening OP-PDL may be defined in the pixel defining layer PDL. A plurality of through-holes OP-P may be provided. The plurality of through-holes OP-P may be disposed to correspond to light emitting elements, respectively. The size of the through-hole OP-P defined in the pixel defining layer PDL may be greater than the size of the through-hole OP-60 defined in the sixth insulating layer 60. The connecting electrode CNE' may be disposed in the through-hole OP-P and the through-hole OP-60 and may be connected with the intermediate connecting electrode CN'.

The light emitting element ED' may include an anode AE', an intermediate layer IML', and the cathode CE'. The intermediate layer IML' may include an emissive layer EML and a functional layer FNL'. The functional layer FNL' may include a first intermediate functional layer FNLa disposed between the anode AE' and the emissive layer EML and a second intermediate functional layer FNLb disposed between the cathode CE' and the emissive layer EML. In one or more embodiments of the present disclosure, one of the first functional layer FNLa and the second intermediate functional layer FNLb may be omitted. In this embodiment, the emissive layer EML is illustrated as being inserted into the functional layer FNL'. That is, the emissive layer EML may be understood as being disposed between the first intermediate functional layer FNLa and the second intermediate functional layer FNLb.

The functional layer FNL' may control the movement of charges between the anode AE' and the cathode CE'. For example, the first intermediate functional layer FNLa may include a hole injection/transport material and/or an electron injection/transport material. The second intermediate functional layer FNLb may include at least one of an electron blocking layer, a hole transport layer, a hole injection layer, a hole blocking layer, an electron transport layer, an electron injection layer, and/or a charge generating layer.

The separator SPR may be disposed on the pixel defining layer PDL. In addition, the separator SPR may be disposed over a gap GP between the connecting electrode CNE' disposed on the pixel defining layer PDL and an adjacent connecting electrode adjacent to the connecting electrode CNE'.

In one or more embodiments, the cathode CE' and the intermediate layer IML' may be commonly formed for a plurality of pixels by deposition through an open mask. In this case, the cathode CE' and the intermediate layer IML' may be divided by the separator SPR. As described above, the separator SPR may have a closed-line shape for each of light emitting parts, and thus the cathode CE' and the intermediate layer IML' may have a divided shape for each light emitting part. That is, the cathode CE' and the intermediate layer IML' may be electrically independent of each adjacent pixel. However, this is illustrative. The functional layer FNL' of the intermediate layer IML' may be formed through an open mask, and the emissive layer EML of the intermediate layer IML' may be formed through a fine metal mask. The present disclosure is not limited to any one embodiment.

Referring to FIGS. 17 and 18, the separator SPR may have a double inverted tapered shape. That is, the taper angle formed by a first side surface TP1 of the separator SPR with respect to the upper surface of the pixel defining layer PDL may be different from the taper angle formed by a second side surface TP2 of the separator SPR with respect to the upper surface of the pixel defining layer PDL. The taper angles may be obtuse angles. For example, referring to FIG. 18, the taper angle formed by the first side surface TP1 with respect to the upper surface of the pixel defining layer PDL may be smaller than the taper angle formed by the second side surface TP2 with respect to the upper surface of the pixel defining layer PDL. However, this is illustrative, and the taper angles may be diversely set as long as the separator SPR is capable of electrically disconnecting the second electrode EL2 for each pixel. In addition, the separator SPR may have the same structure as a tip portion and is not limited to any one embodiment.

A dummy layer UP may be disposed on the separator SPR. The dummy layer UP may include a first dummy layer UP1 disposed on the separator SPR and a second dummy layer UP2 disposed on the first dummy layer UP1. In one or more embodiments, the first dummy layer UP1 may include a first-first dummy layer UP1*a* and a first-second dummy layer UP1*b*. The first-first dummy layer UP1*a* may be formed through the same process as that of the first intermediate functional layer FNLa and may include the same material as the first intermediate functional layer FNLa. The first-second dummy layer UP1*b* may be formed through the same process as that of the second intermediate functional layer FNLb and may include the same material as the second intermediate functional layer FNLb.

The dummy layer UP may not make contact with the connecting electrode CNE' and the cathode CE'. The second dummy layer UP2 included in the dummy layer UP may not make contact with the connecting electrode CNE' and the cathode CE'. In one or more embodiments, the dummy layer UP may be formed not only on the upper surface of the separator SPR but also on a portion of the side surface TP. In one or more embodiments, the display panel DP'-2 may not include the dummy layer UP.

The cathode CE' may be brought into contact with the connecting electrode CNE' through a contact region CA. The contact region CA may be provided adjacent to the separator SPR. In the contact region CA, the upper surface CNE-us of the connecting electrode CNE' is brought into contact with the lower surface CE-bs of the cathode CE'. Because the separator SPR has an inverted tapered shape and the contact region CA is provided adjacent to the separator SPR, at least a portion of the contact region CA with which the cathode CE' and the connecting electrode CNE' are brought into contact may be disposed under the side surface of the separator SPR.

In one or more embodiments, at least a portion of the connecting electrode CNE' may be disposed under the separator SPR. The separator SPR may be disposed over the gap GP between the connecting electrode CNE' and the adjacent connecting electrode adjacent to the connecting electrode CNE', and the second edge EG2*c* of the connecting electrode CNE' may be covered by the separator SPR.

The display panel DP'-2 according to one or more embodiments may include an intermediate region MA disposed between an emissive region EA in which the light emitting element ED' is disposed and the contact region CA. The intermediate region MA may be a region in which at least a portion of the intermediate layer IML' is disposed. In the intermediate region MA, the functional layer FNL' included in the intermediate layer IML' may be disposed between the connecting electrode CNE' and the cathode CE'. That is, in the intermediate region MA, the connecting electrode CNE' and the cathode CE' may be spaced (e.g., spaced apart) from each other with the functional layer FNL' therebetween.

The intermediate region MA may be adjacent to the contact region CA. The functional layer FNL' disposed in the intermediate region MA may include the first intermediate functional layer FNLa and the second intermediate functional layer FNLb described above. The first intermediate functional layer FNLa may be disposed between the anode AE' and the emissive layer EML in the emissive region EA, and the second intermediate functional layer FNLb may be disposed between the cathode CE' and the emissive layer EML in the emissive region EA.

In the display panel DP'-2 according to one or more embodiments, the functional layer FNL' and the cathode CE' may be formed through different deposition processes. The cathode CE' may be formed using a deposition method that deposits a deposition material at a low incidence angle when compared to a deposition method that forms the functional layer FNL'. For example, the functional layer FNL' may be formed using a thermal evaporation method, and the cathode CE' may be covered using a sputtering method. Accordingly, in a process of forming the functional layer FNL', the material that forms the functional layer FNL' may fail to enter below the side surface of the separator SPR, and therefore a portion of the connecting electrode CNE' may be exposed. The cathode CE' may be formed closer to the separator SPR than the functional layer FNL' and may make contact with the upper surface CNE-us of the connecting electrode CNE' on which the cathode CE' is exposed. That is, the contact region CA where the cathode CE' and the connecting electrode CNE' make contact with each other may be formed through the difference between the deposition methods in the processes of forming the functional layer FNL' and the cathode CE'.

In one or more embodiments, a connection region CNA where the connecting electrode CNE' is connected to the intermediate connecting electrode CN' may be disposed between the emissive region EA and the contact region CA. The connection region CNA may overlap the intermediate region MA. At least a portion of the intermediate layer IML' may be disposed to overlap the connection region CNA. In the display panel DP'-2 according to one or more embodiments, the functional layer FNL' included in the intermediate layer IML' may be disposed to overlap the connection region CNA.

According to one or more embodiments of the present disclosure, the connecting electrode CNE' has a shape surrounding at least a portion of the emissive region EA where the light emitting element ED' is disposed. Accordingly, the degree of freedom in the position where the connecting electrode CNE' and the light emitting element ED' are connected and the degree of freedom in the position where the connecting electrode CNE' and the pixel driver PXC are connected may be improved.

In addition, the upper surface CNE-us of the connecting electrode CNE' may be brought into contact with the lower surface CE-bs of the cathode CE' of the light emitting element ED' through the contact region CA defined adjacent to the separator SPR. Accordingly, the contact reliability of the connecting electrode CNE' and the cathode CE' may be improved, and because the lower surface of the connecting electrode CNE' and the upper surface of the intermediate connecting electrode CN' are brought into contact with each other, the contact reliability may be improved. In the display panel DP'-2 according to one or more embodiments, the sizes of the through-holes OP-P and OP-60 for connecting the connecting electrode CNE' and the intermediate connecting electrode CN' may be decreased or minimized through the above-described structure, and thus the area or resolution of the light emitting part of the display panel DP'-2 may be easily increased.

The sensing layer ISL may sense an external input. In this embodiment, the sensing layer ISL may be formed on the encapsulation layer ECL through a continuous process. In this case, the sensing layer ISL may be expressed as being directly disposed on the encapsulation layer ECL. The expression "directly disposed" used herein may mean that another component is not disposed between the sensing layer ISL and the encapsulation layer ECL. That is, a separate adhesive member may not be disposed between the sensing layer ISL and the encapsulation layer ECL. However, this is illustrative, and in the display panel DP'-2 according to one or more embodiments of the present disclosure, the sensing layer ISL may be separately formed and then coupled with the display panel DP'-2 through an adhesive member and is not limited to any one embodiment.

The sensing layer ISL may include a plurality of conductive layers and a plurality of insulating layers. The plurality of conductive layers may include a first sensing conductive layer MTL1 and a second sensing conductive layer MTL2, and the plurality of insulating layers may include first to third sensing insulation layers 71, 72, and 73. However, this is illustrative, and the number of conductive layers and the number of insulating layers are not limited to any one embodiment.

Each of the first to third sensing insulation layers 71, 72, and 73 may have a single-layer structure, or may have a multi-layer structure stacked in the third direction DR3. The first to third sensing insulation layers 71, 72, and 73 may include an inorganic film. The inorganic film may include at least one of aluminum oxide, titanium oxide, silicon oxide, silicon nitride, silicon oxy nitride, zirconium oxide, and/or hafnium oxide. The first to third sensing insulation layers 71, 72, and 73 may include an organic film. The organic film may include at least one of an acrylic resin, a methacrylic resin, a polyisoprene resin, a vinyl resin, an epoxy resin, a urethane-based resin, a celluosic resin, a siloxane-based resin, a polyimide resin, a polyamide resin, and/or a perylene-based resin.

The first sensing conductive layer MTL1 may be disposed between the first sensing insulation layer 71 and the second sensing insulation layer 72, and the second sensing conductive layer MTL2 may be disposed between the second sensing insulation layer 72 and the third sensing insulation layer 73. A portion of the second sensing conductive layer MTL2 may be connected with the first sensing conductive layer MTL1 through a contact hole CNT formed in the second sensing insulation layer 72. Each of the first sensing conductive layer MTL1 and the second sensing conductive layer MTL2 may have a single layer structure, or may have a multi-layer structure stacked in the third direction DR3.

A sensing conductive layer having a single-layer structure may include a metal layer and/or a transparent conductive layer. The metal layer may include molybdenum, silver, titanium, copper, aluminum, and/or an alloy thereof. The transparent conductive layer may include transparent conductive oxide such as indium tin oxide (ITO), indium zinc oxide (IZO), zinc oxide (ZnO), indium zinc tin oxide (IZTO), and/or the like. Alternatively, the transparent conductive layer may include a conductive polymer such as PEDOT, a metal nano-wire, and/or graphene.

A sensing conductive layer having a multi-layer structure may include metal layers. The meal layers may have, for example, a three-layer structure of titanium (Ti)/aluminum (Al)/titanium (Ti). Alternatively, the sensing conductive layer having the multi-layer structure may include at least one metal layer and/or at least one transparent conductive layer.

In the sensing layer ISL, the first sensing conductive layer MTL1 and the second sensing conductive layer MTL2 may configure a sensor for sensing an external input. The sensor may be driven by a capacitive method and may be driven by one of a mutual-cap method or a self-cap method. However, this is illustrative, and the sensor may be driven by a resistive method, an ultrasonic method, and/or an infrared method in addition to the capacitive method and is not limited to any one embodiment.

Each of the first sensing conductive layer MTL1 and the second sensing conductive layer MTL2 may include transparent conductive oxide and may have a metal mesh shape formed of an opaque conductive material. As long as the visibility of an image displayed by the display panel DP'-2 is not deteriorated, the first sensing conductive layer MTL1 and the second sensing conductive layer MTL2 may have various materials and various shapes and are not limited to any one embodiment.

Figure 19:
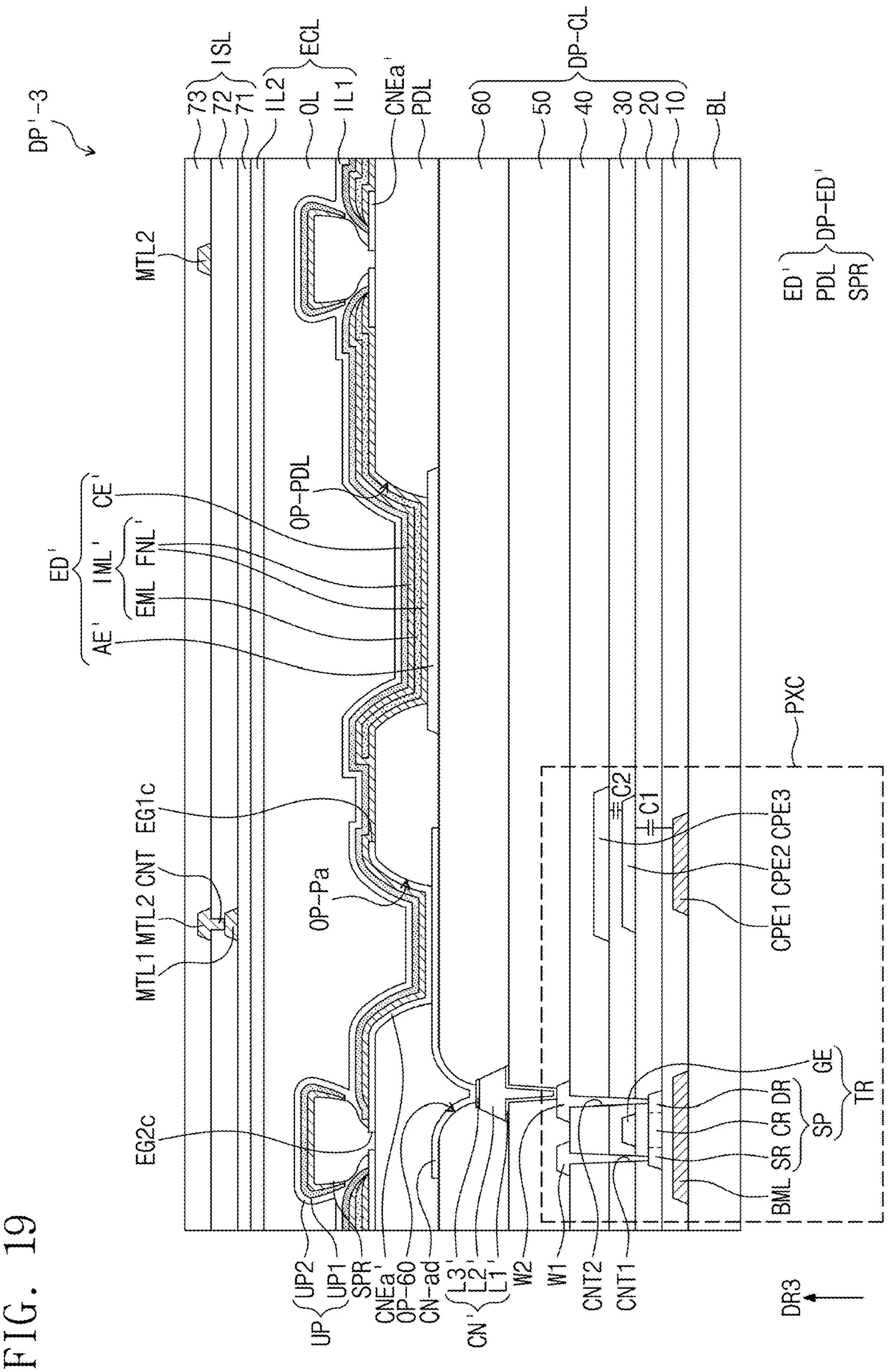
FIG. 19 is a sectional view of a display panel according to one or more embodiments of the present disclosure.

FIG. 19 is a sectional view of a display panel according to one or more embodiments of the present disclosure. In describing FIG. 19, components identical to the components illustrated in FIGS. 17 and 18 will be assigned with identical reference numerals, and descriptions thereabout will be omitted.

Referring to FIG. 19, the display panel DP'-3 may further include a connecting line CN-ad disposed between a sixth insulating layer 60 and a pixel defining layer PDL. The connecting line CN-ad may be connected to an intermediate connecting electrode CN' through a through-hole OP-60 that exposes at least a portion of the intermediate connecting electrode CN'.

In one or more embodiments of the present disclosure, the connecting line CN-ad may be disposed on (e.g., at) the same layer as an anode AE'. For example, the connecting line CN-ad may have the same material and the same layer structure as the anode AE'. In addition, the connecting line CN-ad may be formed by the same process as that of the anode AE'. However, this is illustrative, and the present disclosure is not limited thereto. For example, the connecting line CN-ad may include a material different from that of the anode AE' and may be formed by a process different from that of the anode AE'.

The pixel defining layer PDL may have a through-hole OP-Pa defined therein. The through-hole OP-Pa and the through-hole OP-60 may not overlap each other, but are not particularly limited thereto. For example, in one or more embodiments, the through-hole OP-Pa and the through-hole OP-60 may overlap each other. A connecting electrode CNEa' may be disposed in the through-hole OP-Pa. The connecting electrode CNEa' may be connected to a portion of the connecting line CN-ad exposed by the through-hole OP-Pa.

According to the present disclosure, the drive current of the light emitting element may be prevented from being varied. In addition, in the compensation operation, the influence of the parasitic capacitance of the node connected to the cathode may be reduced or eliminated, and the pixel circuit with improved compensation stability may be provided.

According to the present disclosure, the gradation may be improved, and the ability to express a changed color may be improved. According to the present disclosure, the amount of noise caused by voltage drop and ripple in the power line may be reduced. Accordingly, the display quality of the display device may be improved.

According to the present disclosure, the display device with reduced power consumption may be provided.

While the present disclosure has been described with reference to embodiments thereof, it will be apparent to those of ordinary skill in the art that various changes and modifications may be made thereto without departing from the spirit and scope of the present disclosure as set forth in the following claims and their equivalents.

What is claimed is:

1. A display device comprising:

a display panel comprising a pixel, wherein the pixel comprises:

a light emitting element comprising an anode connected with a first power line and a cathode;

a first transistor connected between the cathode and a second power line and configured to operate based on a potential of a first node;

a second transistor connected between the first node and a data line and configured to receive a first scan signal;

a third transistor connected between the first node and a reference voltage line and configured to receive a second scan signal; and a fourth transistor connected between the first transistor and the first power line.

2. The display device of claim 1, wherein the second scan signal has an activation level during a first initialization period, and the first scan signal has an inactivation level during the first initialization period, and wherein the second scan signal has an activation level during a compensation period, and the first scan signal has an inactivation level during the compensation period.

3. The display device of claim 2, wherein the fourth transistor is configured to receive a third scan signal, and wherein the third scan signal has an inactivation level during the first initialization period and has an activation level during the compensation period.

4. The display device of claim 2, wherein the fourth transistor is configured to receive the second scan signal.

5. The display device of claim 1, wherein the first transistor comprises a first electrode connected with the cathode, a second electrode connected with the second power line, and a gate connected with the first node, and wherein the fourth transistor comprises a first electrode connected to the first power line, a second electrode connected to the first electrode of the first transistor, and a gate configured to receive a third scan signal.

6. The display device of claim 5, wherein the pixel further comprises:

a first initialization transistor connected between the second electrode of the first transistor and a first initialization voltage line and configured to receive a fourth scan signal; and a first capacitor connected between a second node connected with the first transistor and the first initialization transistor and the first node.

7. The display device of claim 6, wherein the fourth scan signal is activated during a first initialization period and deactivated during a data write period during which the first scan signal is activated, and wherein the first initialization period is located before the data write period.

8. The display device of claim 7, wherein the fourth scan signal is further activated during a second initialization period located after the data write period.

9. The display device of claim 8, wherein the second to fourth transistors are turned off during the second initialization period.

10. The display device of claim 6, wherein the display panel further comprises a plurality of pixels comprising the pixel, and the plurality of pixels comprises a first light emitting element configured to emit light of a first color and a second light emitting element configured to emit light of a second color different from the first color, and wherein the first initialization voltage line comprises a first-first initialization voltage line connected with the first light emitting element and configured to receive a first-first initialization voltage and a first-second initialization voltage line connected with the second light emitting element and configured to receive a first-second initialization voltage different from the first-first initialization voltage.

11. The display device of claim 6, wherein the pixel further comprises a second initialization transistor connected between the cathode of the light emitting element and a second initialization voltage line, and wherein the first initialization voltage line and the second initialization voltage line are configured to receive different initialization voltages.

12. The display device of claim 11, wherein the fourth transistor is configured to receive the third scan signal, wherein the second initialization transistor is configured to receive the fourth scan signal, and wherein a period during which the third scan signal is activated and a period during which the fourth scan signal is activated do not overlap each other.

13. The display device of claim 11, wherein the display panel is configured to display an image during a plurality of frames, and at least one frame from among the plurality of frames comprises a write frame and a holding frame, wherein the first to third scan signals have an activation level in the write frame and remain in an inactive state during the holding frame, and wherein the fourth scan signal has an activation level in the write frame and the holding frame.

14. The display device of claim 11, wherein the display panel further comprises a plurality of pixels comprising the pixel, and the plurality of pixels comprises a first light emitting element configured to emit light of a first color and a second light emitting element configured to emit light of a second color different from the first color, and wherein the second initialization voltage line comprises a second-first initialization voltage line connected with the first light emitting element and configured to receive a second-first initialization voltage and a second-second initialization voltage line connected with the second light emitting element and configured to receive a second-second initialization voltage different from the second-first initialization voltage.

15. The display device of claim 11, wherein the second initialization transistor is configured to receive a fifth scan signal, wherein the fourth scan signal is activated during a first initialization period, and the fifth scan signal is activated during the first initialization period and a second initialization period, wherein the fourth scan signal and the fifth scan signal are deactivated during a data write period during which the first scan signal is activated, and wherein the first initialization period is located before the data write period, and the second initialization period is located after the data write period.

16. The display device of claim 15, wherein the fourth scan signal is further activated during the second initialization period.

17. The display device of claim 15, wherein the display panel is configured to display an image during a plurality of frames, and at least one frame from among the plurality of frames comprises a write frame and a holding frame, wherein the fourth scan signal has an activation level in the write frame and remains in an inactive state during the holding frame, and wherein the fifth scan signal has an activation level in the holding frame.

18. The display device of claim 5, wherein the pixel further comprises:

a first emission control transistor connected between the first electrode of the first transistor and the cathode and configured to receive an emission control signal; and a second emission control transistor connected between the second electrode of the first transistor and the second power line and configured to receive the emission control signal.

19. The display device of claim 5, wherein the pixel further comprises a second capacitor connected between the second electrode of the first transistor and one of the first and second power lines, and wherein the first transistor further comprises a back gate connected with the second electrode of the first transistor.

20. The display device of claim 1, wherein each of the first to fourth transistors is an N-type transistor.

21. The display device of claim 1, wherein a first drive voltage received by the first power line is higher than a second drive voltage received by the second power line, and wherein a reference voltage received by the reference voltage line is between the first drive voltage and the second drive voltage.

22. The display device of claim 1, wherein the light emitting element further comprises:

an electron control layer on the cathode;

an emissive layer on the electron control layer; and a hole control layer on the emissive layer, wherein the anode is on the hole control layer.

23. The display device of claim 1, wherein the second power line has a structure of Ti/Al/Ti.

24. The display device of claim 1, wherein the anode comprises a MgAg alloy, and wherein the cathode has a structure of ITO/Ag/ITO.

25. The display device of claim 1, wherein the second power line and the data line are at a same layer and comprises a same material.

26. The display device of claim 1, wherein the second power line and the first power line are at a same layer and comprise a same material.

27. The display device of claim 1, wherein the anode is directly connected to the first power line.

28. The display device of claim 1, further comprising:

a connection conductive pattern configured to connect the anode and the first power line.

29. The display device of claim 1, wherein the display panel comprises a display region in which the pixel is located and a non-display region around at least a portion of the display region, and wherein the display panel further comprises a plurality of pixels comprising the pixel, the anode comprises a plurality of anodes, and the plurality of anodes are separately located in respective ones of the pixels and connected to the second power line in the display region.

30. The display device of claim 1, wherein the display panel comprises a display region in which the pixel is located and a non-display region around at least a portion of the display region, and wherein the display panel further comprises a plurality of pixels comprising the pixel, and the anode is commonly disposed in the pixels and connected to the second power line in the non-display region.

31. The display device of claim 1, wherein the light emitting element further comprises an intermediate layer comprising at least an emissive layer, the intermediate layer being on the anode, and wherein the cathode is on the intermediate layer.

32. The display device of claim 31, wherein the display panel further comprises a separator having an obtuse taper angle, wherein the display panel further comprises a plurality of pixels comprising the pixel, and the plurality of pixels comprises a first light emitting element configured to emit light of a first color and a second light emitting element configured to emit light of a second color different from the first color, and wherein the separator separates the cathode of the first light emitting element and the cathode of the second light emitting element from each other.

33. The display device of claim 31, wherein the display panel further comprises a connecting line configured to electrically connect the first transistor and the cathode.

34. The display device of claim 33, wherein the connecting line comprises a first layer, a second layer on the first layer, and a third layer on the second layer, and wherein a side surface of the third layer protrudes outward from a side surface of the second layer, and the cathode is in contact with the side surface of the second layer.

35. The display device of claim 31, wherein the display panel further comprises:

a pixel defining layer having an opening defined therein that exposes at least a portion of the anode;

a connecting electrode on the pixel defining layer and electrically connected with the first transistor and the cathode; and a separator on the pixel defining layer, wherein in a contact region adjacent to the separator, a lower surface of the cathode contacts an upper surface of the connecting electrode.

36. The display device of claim 35, wherein the connecting electrode has a ring shape surrounding the opening.

37. The display device of claim 35, wherein the separator comprises a first side surface and a second side surface having different taper angles with respect to an upper surface of the pixel defining layer.

38. The display device of claim 35, wherein the pixel comprises a plurality of pixels, and the connecting electrode comprises a plurality of connecting electrodes, wherein each of the plurality of connecting electrodes electrically connects the first transistor and the cathode in a corresponding pixel from among the plurality of pixels, and wherein a gap between the plurality of connecting electrodes adjacent to each other from among the plurality of connecting electrodes overlaps the separator.

39. A display device comprising:

a display panel comprising a pixel, wherein the pixel comprises:

a light emitting element comprising an anode connected with a first power line and a cathode;

a drive transistor comprising a first electrode connected with the cathode, a second electrode connected with a second power line, and a gate connected with a first node;

a switching transistor connected between the first node and a data line;

an emission control transistor connected between the first electrode of the drive transistor and the cathode;

a compensation transistor connected between the first electrode of the drive transistor and the first power line; and an initialization transistor connected between the cathode and an initialization voltage line, wherein the compensation transistor and the initialization transistor are configured to receive different scan signals.

* * * * *